United States Patent
Kwon et al.

(10) Patent No.: US 12,240,863 B2
(45) Date of Patent: Mar. 4, 2025

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Ohyun Kwon, Seoul (KR); Aram Jeon, Seoul (KR); Sangho Park, Anyang-si (KR); Virendra Kumar Rai, Hwaseong-si (KR); Myungsun Sim, Suwon-si (KR); Sukekazu Aratani, Hwaseong-si (KR); Kum Hee Lee, Suwon-si (KR); Banglin Lee, Suwon-si (KR); Sunghun Lee, Hwaseong-si (KR); Byoungki Choi, Hwaseong-si (KR); Yasushi Koishikawa, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 325 days.

(21) Appl. No.: 17/036,694

(22) Filed: Sep. 29, 2020

(65) Prior Publication Data

US 2021/0253618 A1 Aug. 19, 2021

(30) Foreign Application Priority Data

Feb. 10, 2020 (KR) .................. 10-2020-0015840

(51) Int. Cl.
| | | |
|---|---|---|
| *C07F 15/00* | (2006.01) | |
| *C09K 11/06* | (2006.01) | |
| *H10K 50/11* | (2023.01) | |
| *H10K 50/12* | (2023.01) | |
| *H10K 50/14* | (2023.01) | |
| *H10K 50/15* | (2023.01) | |
| *H10K 50/16* | (2023.01) | |
| *H10K 85/30* | (2023.01) | |
| *H10K 85/40* | (2023.01) | |
| *H10K 30/30* | (2023.01) | |
| *H10K 50/17* | (2023.01) | |

(52) U.S. Cl.
CPC ....... *C07F 15/0033* (2013.01); *H10K 85/342* (2023.02); *H10K 30/353* (2023.02); *H10K 50/15* (2023.02); *H10K 50/16* (2023.02); *H10K 50/171* (2023.02)

(58) Field of Classification Search
CPC .............. C07F 15/0033; H10K 85/342; H10K 30/353; H10K 50/15; H10K 50/16; H10K 50/171; H10K 2101/10; H10K 85/40; H10K 50/12; H10K 50/14; C09K 2211/185; C09K 11/06

See application file for complete search history.

(56) References Cited

U.S. PATENT DOCUMENTS

| | | | |
|---|---|---|---|
| 7,429,426 B2 | 9/2008 | Brown et al. | |
| 8,268,455 B2 | 9/2012 | Kamatani et al. | |
| 8,431,243 B2 | 4/2013 | Kwong et al. | |
| 9,359,549 B2 | 6/2016 | Rayabarapu et al. | |
| 10,135,009 B2 | 11/2018 | Hwang et al. | |
| 10,153,443 B2 | 12/2018 | Dyatkin et al. | |
| 10,381,578 B2* | 8/2019 | Rai .................. | H01L 51/0085 |
| 10,692,417 B2* | 6/2020 | Lee .................. | H01L 51/504 |
| 11,205,758 B2* | 12/2021 | Hwang ............ | C07F 15/0086 |
| 2007/0231600 A1 | 10/2007 | Kamatani et al. | |
| 2012/0302753 A1 | 11/2012 | Li et al. | |
| 2014/0084261 A1 | 3/2014 | Brooks et al. | |
| 2016/0155962 A1 | 6/2016 | Hwang et al. | |
| 2017/0054095 A1 | 2/2017 | Choi et al. | |
| 2017/0213987 A1 | 7/2017 | Kim et al. | |
| 2018/0287070 A1 | 10/2018 | Ji et al. | |
| 2019/0218240 A1 | 7/2019 | Yoo et al. | |
| 2019/0296251 A1* | 9/2019 | Yen .................. | C09K 11/06 |
| 2020/0212323 A1 | 7/2020 | Hwang et al. | |
| 2020/0358012 A1 | 11/2020 | Lee et al. | |
| 2021/0163517 A1 | 6/2021 | Jeon et al. | |
| 2021/0198297 A1 | 7/2021 | Jeon et al. | |

FOREIGN PATENT DOCUMENTS

| | | | |
|---|---|---|---|
| CN | 110862418 | * | 3/2020 |
| EP | 2465912 A1 | | 6/2012 |
| EP | 2711999 A2 | | 3/2014 |

(Continued)

OTHER PUBLICATIONS

Liu, Inorganic Chemistry, 2019, 58(1), 476-488.*
Han, Photochemical & Photobiological Sciences (2021) 20:1487-1495.*
Dorwald F. A. Side Reactions in Organic Synthesis, 2005, Wiley: VCH, Weinheim p. IX of Preface p. 1-15.*

(Continued)

*Primary Examiner* — Samantha L Shterengarts
*Assistant Examiner* — Sagar Patel
(74) *Attorney, Agent, or Firm* — CANTOR COLBURN LLP

(57) ABSTRACT

An organometallic compound represented by Formula 1:

$$M(L_1)_{n1}(L_2)_{n2} \qquad \text{Formula 1}$$

In Formula 1, M is a transition metal; $L_1$ is a ligand represented by Formula 2 as disclosed herein; $L_2$ is a monodentate ligand, a bidentate ligand, a tridentate ligand, or a tetradentate ligand; n1 is 1, 2, or 3, wherein, when n1 is 2 or greater, two or more ligands $L_1$ are identical to or different from each other; n2 is 0, 1, 2, 3, or 4, wherein, when n2 is 2 or greater, two or more ligands $L_2$ are identical to or different from each other; and $L_1$ and $L_2$ are different from each other.

14 Claims, 1 Drawing Sheet

(56) References Cited

FOREIGN PATENT DOCUMENTS

| JP | 2007269734 A | | 10/2007 | |
| JP | 2018197225 A | | 12/2018 | |
| KR | 108586545 | * | 8/2008 | ............ C09K 11/06 |
| KR | 1020130043460 A | | 4/2013 | |
| KR | 1020160037007 A | | 4/2016 | |
| KR | 1020160064955 A | | 6/2016 | |
| KR | 1020160109907 A | | 9/2016 | |
| KR | 1020160109908 A | | 9/2016 | |
| KR | 1020210066627 A | | 6/2021 | |
| KR | 1020210075726 A | | 6/2021 | |
| WO | WO 2014023377 | * | 3/2014 | ............ C07F 15/00 |
| WO | 2017103584 A1 | | 6/2017 | |

OTHER PUBLICATIONS

Bingqing Liu et al., "Effects of Varying the Benzannulation Site and π Conjugation of the Cyclometalating Ligand on the Photophysics and Reverse Saturable Absorption of Monocationic Iridium(III) Complexes," Inorganic Chemistry, Dec. 10, 2018, pp. 476-488, vol. 58, No. 1.

Dmitry E. Polyansky et al., "Mechanism of Hydride Donor Generation Using a Ru(II) Complex Containing an NAD+ Model Ligand: Pulse and Steady-State Radiolysis Studies," Inorganic Chemistry, Mar. 18, 2008, pp. 3958-3968, vol. 47, Issue 10.

Extended EP search Report mailed Jun. 25, 2021 of EP Patent Application No. 21155700.4.

Masanari Hirahara et al., "New Series of Dinuclear Ruthenium(II) Complexes Synthesized Using Photoisomerization for Efficient Water Oxidation Catalysis," Inorganic Chemistry, Jul. 22, 2015, pp. 7627-7635, vol. 54, Issue 15.

Sergei V. Lymar et al., "Role of Hydrogen Bonding in Photoinduced Electron-Proton Transfer from Phenols to a Polypyridine Ru Complex with a Proton-Accepting Ligand," Journal of Physical Chemistry Letters, Aug. 9, 2017, pp. 4043-4048, vol. 8, Issue 17.

Sergei V. Lymar et al., "Solvent-dependent transition from concerted electron-proton to proton transfer in photoinduced reactions between phenols and polypyridine Ru complexes with proton-accepting sites," Dalton Transactions, Oct. 19, 2018, pp. 15917-15928, vol. 47, No. 44.

Yani He et al., "Efficient and exclusively NIR-emitting ($\lambda$em= 780nm) [Ir(C^N)2(O^O)]-heteroleptic complexes with β-diketonate- or pyrazolonate-typed O^O-chelate ancillary," Journal of Luminescence, Dec. 23, 2019, pp. 1-9, vol. 220, Issue 116983.

Sumanta Kumar Padhi et al., "Photo- and Electrochemical Redox Behavior of Cyclometalated Ru(II) Complexes Having a 3-Phenylbenzo[b][1,6]naphthyridine Ligand," Inorganic Chmistry, Sep. 28, 2011, pp. 10718-10723, vol. 50.

Office Action issued Dec. 10, 2024 of JP Patent Application No. 2021-16143.

* cited by examiner

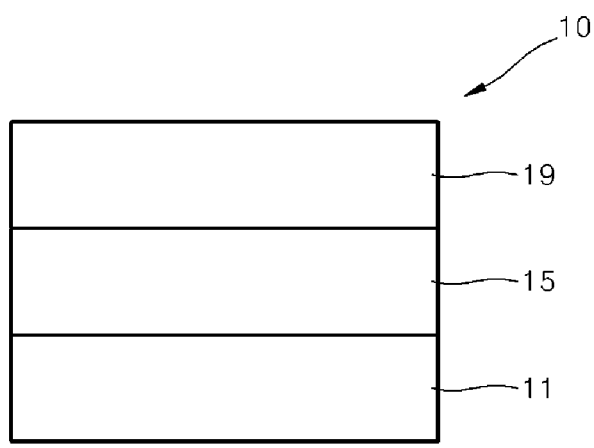

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims the benefit of and priority to Korean Patent Application No. 10-2020-0015840, filed on Feb. 10, 2020, in the Korean Intellectual Property Office, and all the benefits accruing therefrom under 35 U.S.C. § 119, the disclosure of which is incorporated herein in its entirety by reference.

BACKGROUND

1. Field

One or more embodiments relate to an organometallic compound, an organic light-emitting device including the same, and an electronic apparatus including the organic light-emitting device.

2. Description of Related Art

Organic light-emitting devices (OLEDs) are self-emission devices, which have improved characteristics in terms of viewing angles, response times, brightness, driving voltage, and response speeds, and produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

One or more embodiments relate to an organometallic compound, an organic light-emitting device including the same, and an electronic apparatus including the organic light-emitting device.

Additional aspects will be set forth in part in the description which follows and, in part, will be apparent from the description, or may be learned by practice of the presented embodiments of the disclosure.

According to one aspect, an organometallic compound represented by Formula 1 is provided.

$$M(L_1)_{n1}(L_2)_{n2} \quad \text{Formula 1}$$

In Formula 1,

M is a transition metal, $L_1$ is a ligand represented by Formula 2, n1 is 1, 2, or 3, wherein, when n1 is 2 or greater, two or more of ligands $L_1$ may be identical to or different from each other, $L_2$ is a monodentate ligand, a bidentate ligand, a tridentate ligand, or a tetradentate ligand, n2 is 0, 1, 2, 3, or 4, wherein, when n2 is 2 or greater, two or more of ligands $L_2$ are identical to or different from each other, and $L_1$ and $L_2$ are different from each other,

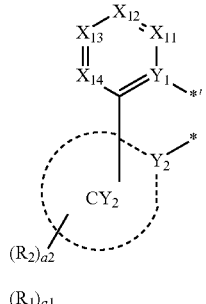

Formula 2

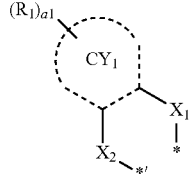

Formula 3 wherein, in Formula 2, $X_1$ is C bonded with $X_1$ in Formula 3, N, or $C(R_{11})$, $X_{12}$ is C bonded with $X_1$ or $X_2$ in Formula 3, N, or $C(R_{12})$, $X_{13}$ is C bonded with $X_1$ or $X_2$ in Formula 3, N, or $C(R_{13})$, and $X_{14}$ is C bonded with $X_2$ in Formula 3, N, or $C(R_{14})$, provided that $X_1$ is C bonded with $X_1$ in Formula 3, and $X_{12}$ is C bonded with $X_2$ in Formula 3; $X_{12}$ is C bonded with $X_1$ in Formula 3, and $X_{13}$ is C bonded with $X_2$ in Formula 3; or $X_{13}$ is C bonded with $X_1$ in Formula 3, and $X_{14}$ is C bonded with $X_2$ in Formula 3, in Formula 3, X is O, S, Se, $B(R_{31})$, $N(R_{31})$, $C(R_{31})(R_{32})$, or $Si(R_{31})(R_{32})$, in Formula 3, $X_2$ is O, S, Se, $B(R_{33})$, $N(R_{33})$, $C(R_{33})(R_{34})$, or $Si(R_{33})(R_{34})$, $Y_1$ is N, $Y_2$ is C or N, ring $CY_1$ and ring $CY_2$ are each independently a $C_5$-$C_{30}$ carbocyclic group or a $C_1$-$C_{30}$ heterocyclic group, $R_1$, $R_2$, $R_{11}$ to $R_{14}$, and $R_{31}$ to $R_{34}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_1$-$C_{60}$ aryloxy group, a substituted or unsubstituted $C_1$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), wherein $R_{31}$ and $R_{33}$ are not hydrogen, a1 is an integer of 0 to 20, wherein, when a1 is 2 or greater, two or more groups $R_1$ are identical to or different from each other, a2 is an integer of 0 to 20, wherein, when a2 is 2 or greater, two or more groups $R_2$ are identical to or different from each other, provided that the organometallic compound does not include a compound wherein n2 in Formula 1 is 0, $X_1$ in Formula 3 is C($R_{31}$)($R_{32}$), and $X_2$ in Formula 3 is C($R_{33}$)($R_{34}$), two or more of a plurality of groups $R_1$ are optionally linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of groups $R_2$ are optionally linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as disclosed in connection with $R_2$, and *' in Formula 2 each indicate a binding site to M in Formula 1, and *' in Formula 3 each indicate a binding site to two of $X_{11}$ to $X_{14}$ in Formula 2, substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_1$-$C_{10}$ aryl group, the substituted $C_7$-$C_{60}$ alkylaryl group, the substituted $C_1$-$C_{10}$ aryloxy group, the substituted $C_1$-$C_{10}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group are each independently:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), or —P($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), or —P($Q_{28}$)($Q_{29}$);

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or a combination thereof, and $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —C$_1$; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{60}$ heterocycloalkenyl group; a $C_6$-$C_{60}$ aryl group which is unsubstituted or substituted with at least one of deuterium, a $C_1$-$C_{60}$ alkyl group, or a $C_6$-$C_{60}$ aryl group; a $C_6$-$C_{60}$ aryloxy group; a $C_1$-$C_{10}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

According to another aspect, provided is an organic light-emitting device including a first electrode, a second electrode, and an organic layer disposed between the first electrode and the second electrode and including an emission layer, wherein the organic layer includes at least one organometallic compound represented by Formula 1.

The organometallic compound may be included in the emission layer, and the organometallic compound included in the emission layer may act as a dopant.

According to another aspect, provided is an electronic apparatus including the organic light-emitting device.

BRIEF DESCRIPTION OF THE DRAWING

The above and other aspects, features, and advantages of certain embodiments of the disclosure will be more apparent from the following description taken in conjunction with the FIGURE, which shows a schematic cross-sectional view of an organic light-emitting device according to one or more embodiments.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects.

The terminology used herein is for the purpose of describing exemplary embodiments only and is not intended to be limiting. As used herein, the singular forms "a," "an," and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

An aspect of the present disclosure provides an organometallic compound represented by Formula 1:

$$M(L_1)_{n1}(L_2)_{n2} \qquad \text{Formula 1}$$

M in Formula 1 is a transition metal.

For example, M may be a first-row transition metal of the Periodic Table of Elements, a second-row transition metal of the Periodic Table of Elements, or a third-row transition metal of the Periodic Table of Elements.

In an embodiment, M may be iridium (Ir), platinum (Pt), osmium (Os), titanium (Ti), zirconium (Zr), hafnium (Hf), europium (Eu), terbium (Tb), thulium (Tm), or rhodium (Rh).

In an embodiment, M may be Ir, Pt, Os, or Rh.

$L_1$ in Formula 1 is a ligand represented by Formula 2.

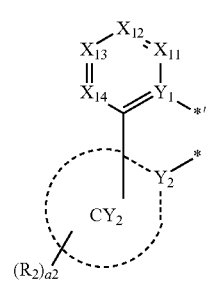

Formula 2

The detailed description of Formula 2 is the same as described in the present specification for Formula 2, below.

n1 in Formula 1 indicates the number of ligands $L_1$ and may be 1, 2, or 3. When n1 is 2 or greater, two or more ligands $L_1$ may be identical to or different from each other. For example, n1 may be 1 or 2.

$L_2$ in Formula 1 may be a monodentate ligand, a bidentate ligand, a tridentate ligand, or a tetradentate ligand. $L_2$ is further described in the present specification below.

n2 in Formula 1 indicates the number of ligands $L_2$ and may be 0, 1, 2, 3, or 4. When n2 is 2 or greater, two or more ligands $L_2$ may be identical to or different from each other. For example, n2 may be 1 or 2.

$L_1$ and $L_2$ in Formula 1 may be different from each other.

In an embodiment, in Formula 1, M may be Ir or Os, and the sum of n1 and n2 may be 3 or 4; or M may be Pt, and the sum of n1 and n2 may be 2.

In one or more embodiments, in Formula 1,
M may be Ir,
n1 and n2 may each independently be 1 or 2, and
the sum of n1 and n2 may be 3.

In Formula 2, $X_{11}$ may be C bonded with $X_1$ in Formula 3 (via a single bond), N, or $C(R_{11})$, $X_{12}$ may be C bonded with $X_1$ or $X_2$ in Formula 3 (via a single bond), N, or $C(R_{12})$, $X_{13}$ may be C bonded with $X_1$ or $X_2$ in Formula 3 (via a single bond), N, or $C(R_{13})$, and $X_{14}$ may be C bonded with $X_2$ in Formula 3 (via a single bond), N, or $C(R_{14})$. Here, in Formula 2, i) $X_1$ may be C bonded with $X_1$ in Formula 3 (via a single bond), and $X_{12}$ may be C bonded with $X_2$ in Formula 3 (via a single bond), ii) $X_{12}$ may be C bonded with X in Formula 3 (via a single bond), and $X_{13}$ may be C bonded with $X_2$ in Formula 3 (via a single bond), or iii) $X_{13}$ may be C bonded with $X_1$ in Formula 3 (via a single bond), and $X_{14}$ may be C bonded with $X_2$ in Formula 3 (via a single bond).

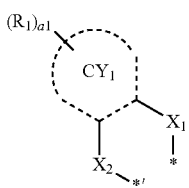

Formula 3

In other words, a group represented by Formula 3 is necessarily condensed to the group represented by Formula 2. Hence, group $L_1$ is a ligand derived from the condensation of the group represented by Formula 3 and the group represented by Formula 2.

In Formula 3, $X_1$ may be O, S, Se, $B(R_3)$, $N(R_{31})$, $C(R_{31})(R_{32})$, or $Si(R_{31})(R_{32})$, and $X_2$ may be O, S, Se, $B(R_{33})$, $N(R_{33})$, $C(R_{33})(R_{34})$, or $Si(R_{33})(R_{34})$.

In an embodiment, at least one of $X_1$ and $X_2$ in Formula 3 may be O, S, or Se.

In one or more embodiments, $X_1$ and $X_2$ in Formula 3 may be identical to each other.

In one or more embodiments, $X_1$ and $X_2$ in Formula 3 may be different from each other.

In one or more embodiments, in Formula 3, $X_1$ may be $C(R_{31})(R_{32})$, and $X_2$ may be O, S, Se, $B(R_{33})$, $N(R_{33})$, or $Si(R_{33})(R_{34})$; or $X_1$ may be O, S, Se, $B(R_{31})$, $N(R_{31})$, or $Si(R_{31})(R_{32})$, and $X_2$ may be $C(R_{33})(R_{34})$.

In Formula 2, $Y_1$ may be N, and $Y_2$ may be C or N. For example, $Y_2$ in Formula 2 may be C.

Ring $CY_1$ and ring $CY_2$ in Formulae 2 and 3 may each independently be a $C_5$-$C_{30}$ carbocyclic group or a $C_1$-$C_{30}$ heterocyclic group.

For example, ring $CY_1$ and ring $CY_2$ in Formulae 2 and 3 may each independently be a first ring, a second ring, a condensed ring in which two or more first rings are condensed with each other, a condensed ring in which two or more second rings are condensed with each other, or a condensed ring in which one or more first rings and one or more second rings are condensed with each other, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a bicyclo[1.1.1]pentane group, a bicyclo[2.1.1]hexane group, a bicyclo[2.2.2]octane group, a cyclohexane group, a cyclohexene group, a phenyl group, a pyridine group, a pyrimidine group, a pyrazine group, a pyridazine group, or a triazine group.

For example, in Formulae 2 and 3, ring $CY_1$ and ring $CY_2$ may each independently be a cyclopentane group, a cyclohexane group, a cycloheptane group, a cyclopentene group, a cyclohexene group, a cycloheptene group, an adamantane group, a norbornane group, a norbornene group, a bicyclo[1.1.1]pentane group, a bicyclo[2.1.1]hexane group, a bicyclo[2.2.2]octane group, a phenyl group, a naphthalene group, an anthracene group, a phenanthrene group, a triphenylene group, a pyrene group, a chrysene group, a 1,2,3,4-tetrahydronaphthalene group, a pyrrole group, a borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an aza selenophene group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

As used herein, a "phenyl group" may also be referred to as a benzene group.

In an embodiment, ring $CY_1$ in Formula 3 may be a phenyl group, a pyridine group, or a pyrimidine group.

In one or more embodiments, $Y_2$ in Formula 2 may be C, and ring $CY_2$ in Formula 2 may be a phenyl group, a naphthalene group, a fluorene group, a dibenzofuran group, a dibenzothiophene group, a carbazole group, or a dibenzosilole group.

In Formulae 2 and 3, $R_1$, $R_2$, $R_{11}$ to $R_{14}$, and $R_{31}$ to $R_{34}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_1$-$C_{10}$ aryl group, a substituted or unsubstituted $C_7$-$C_{60}$ alkylaryl group, a substituted or unsubstituted $C_1$-$C_{60}$ aryloxy group, a substituted or unsubstituted $C_1$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), wherein R$_{31}$ and R$_{33}$ may not be hydrogen. Q$_1$ to Q$_9$ are the same as described in the present specification.

For example, R$_1$, R$_2$, R$_{11}$ to R$_{14}$, and R$_{31}$ to R$_{34}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{20}$ alkyl group, or a phenyl group.

In an embodiment, $R_1$, $R_2$, $R_{11}$ to $R_{14}$, and $R_{31}$ to $R_{34}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-66, a group represented by one of Formulae 9-1 to 9-66 in which at least one hydrogen is substituted with deuterium, a group represented by one of Formulae 10-1 to 10-118, a group represented by one of Formulae 10-1 to 10-118 in which at least one hydrogen is substituted with deuterium, a group represented by one of Formulae 10-201 to 10-342, a group represented by one of Formulae 10-201 to 10-342 in which at least one hydrogen is substituted with deuterium, —$Si(Q_3)(Q_4)(Q_5)$, or —$Ge(Q_3)(Q_4)(Q_5)$ (wherein $Q_3$ to $Q_5$ are the same as described in the present specification):

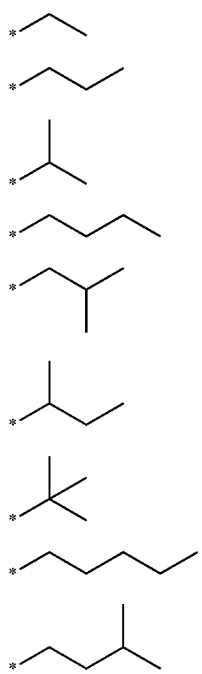

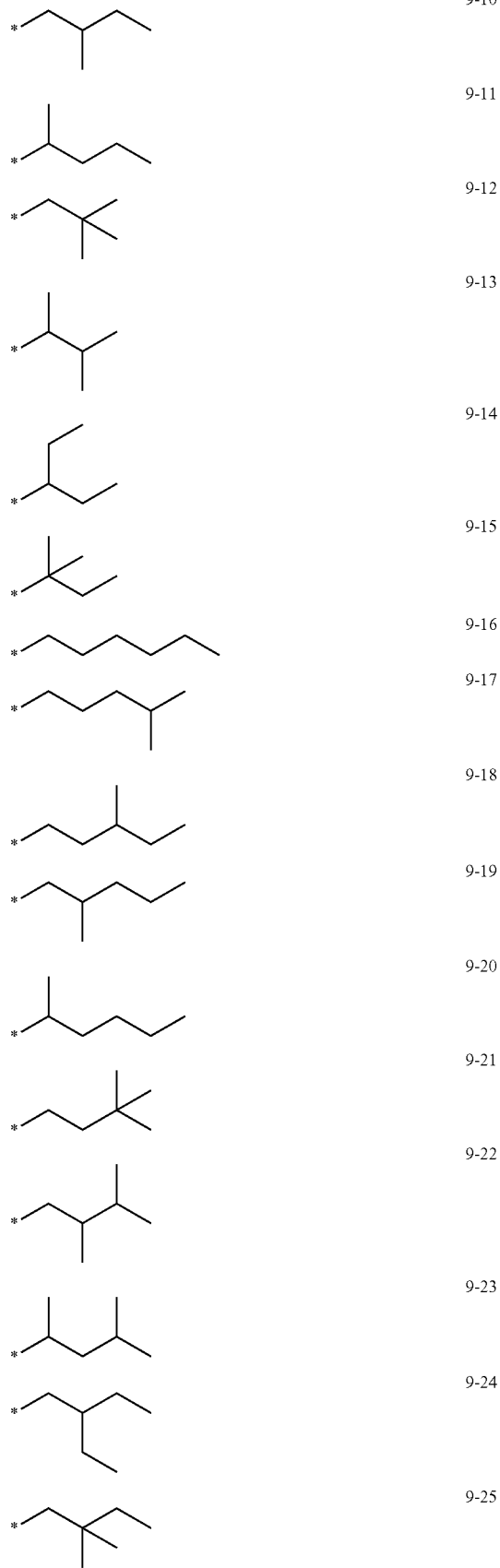

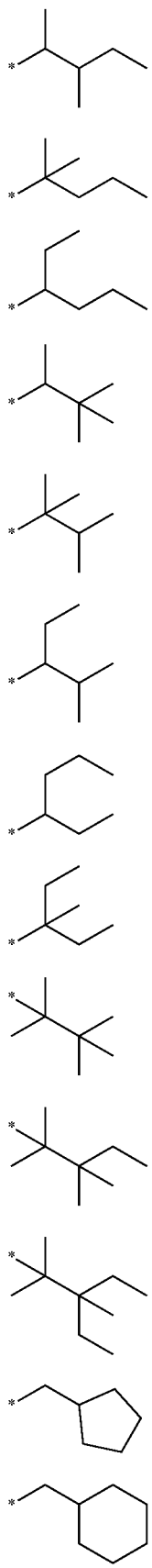
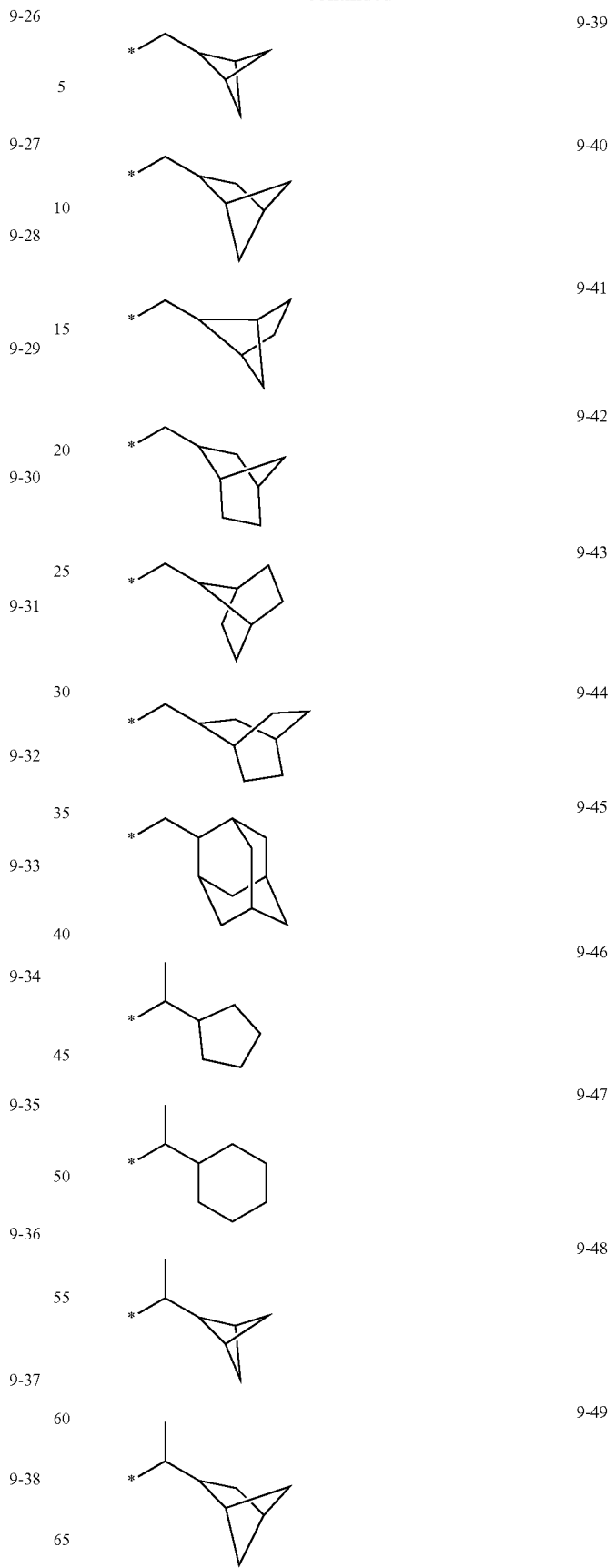

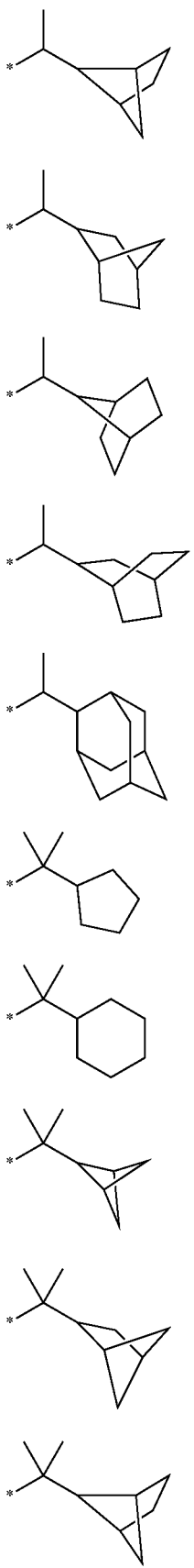
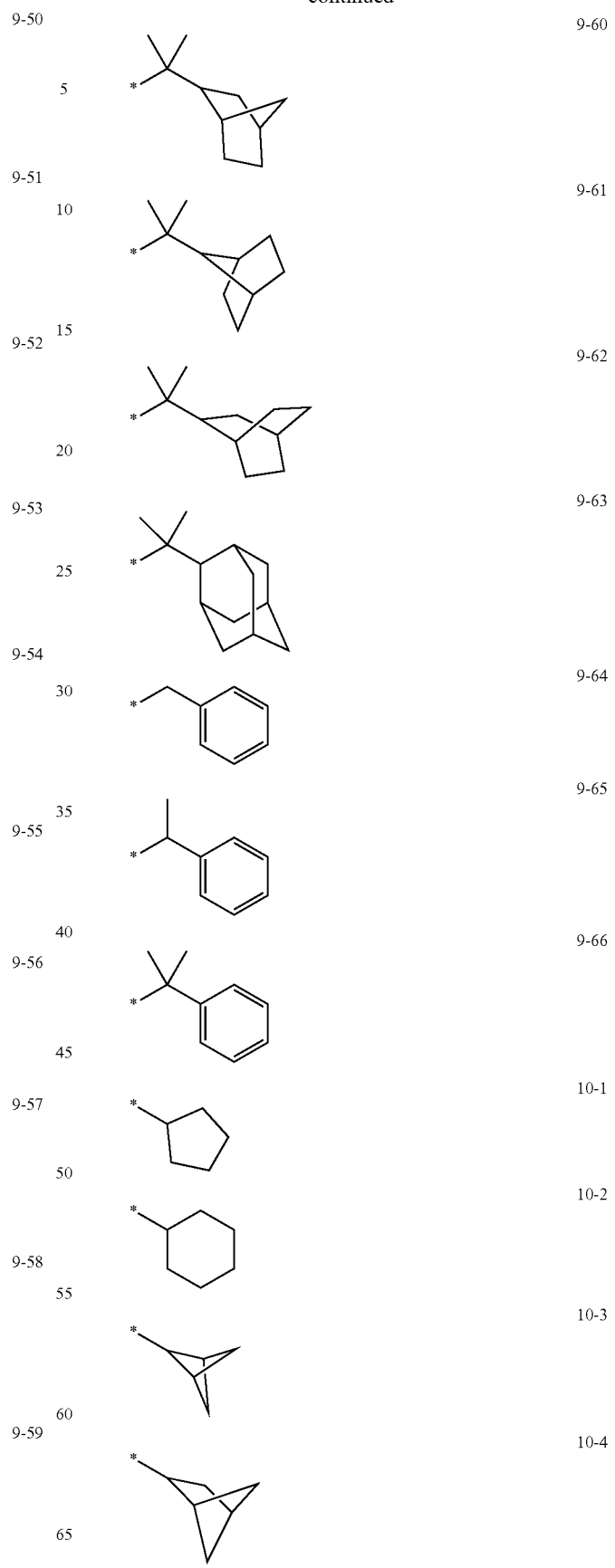

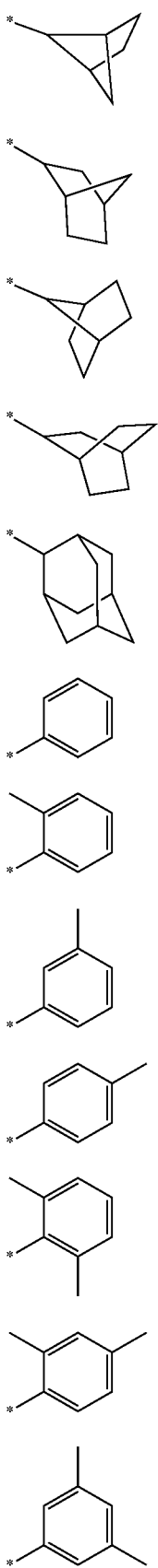
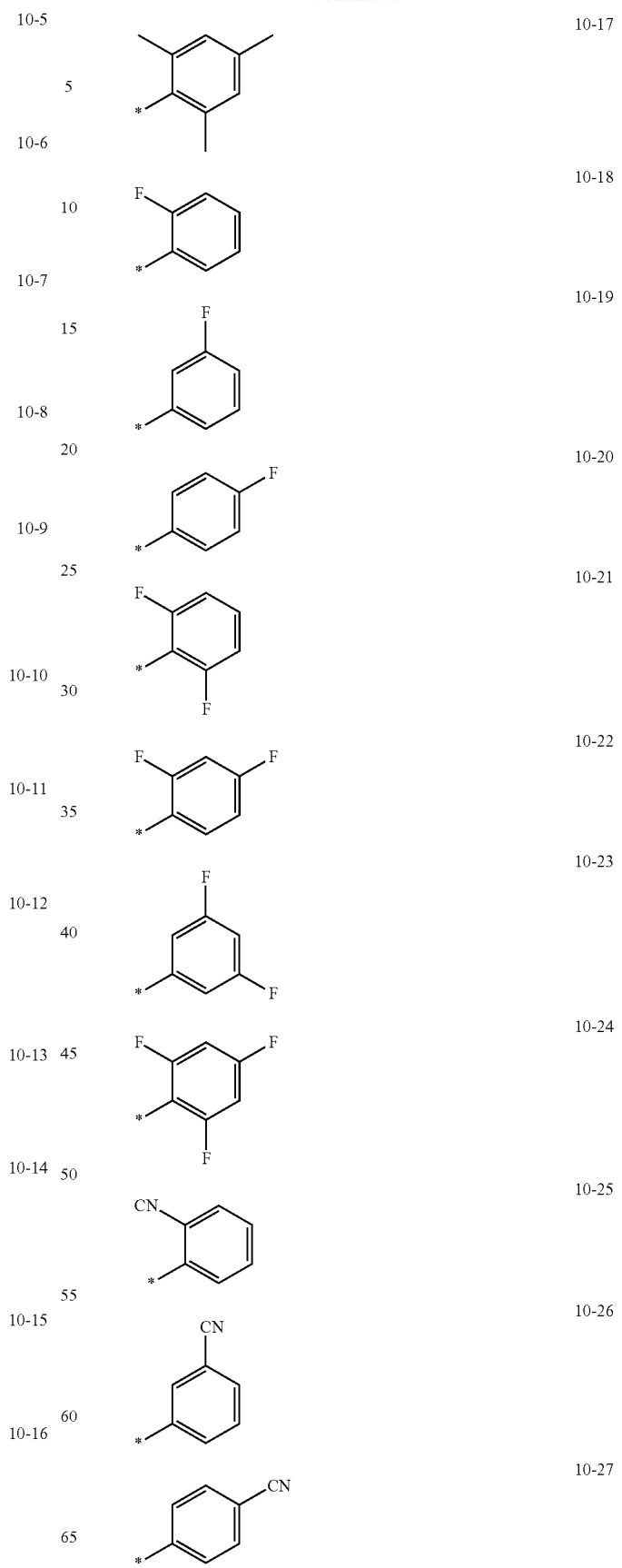

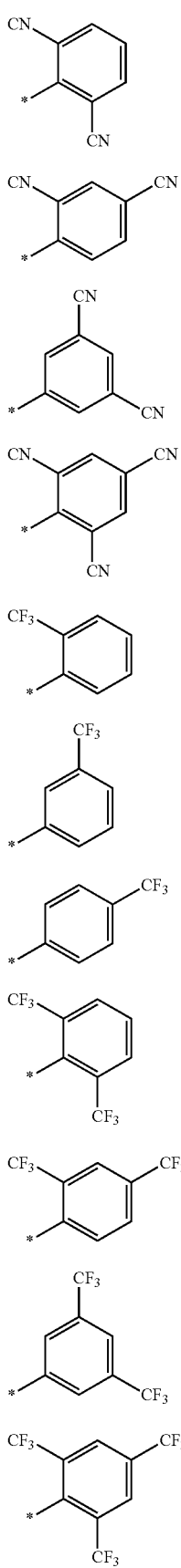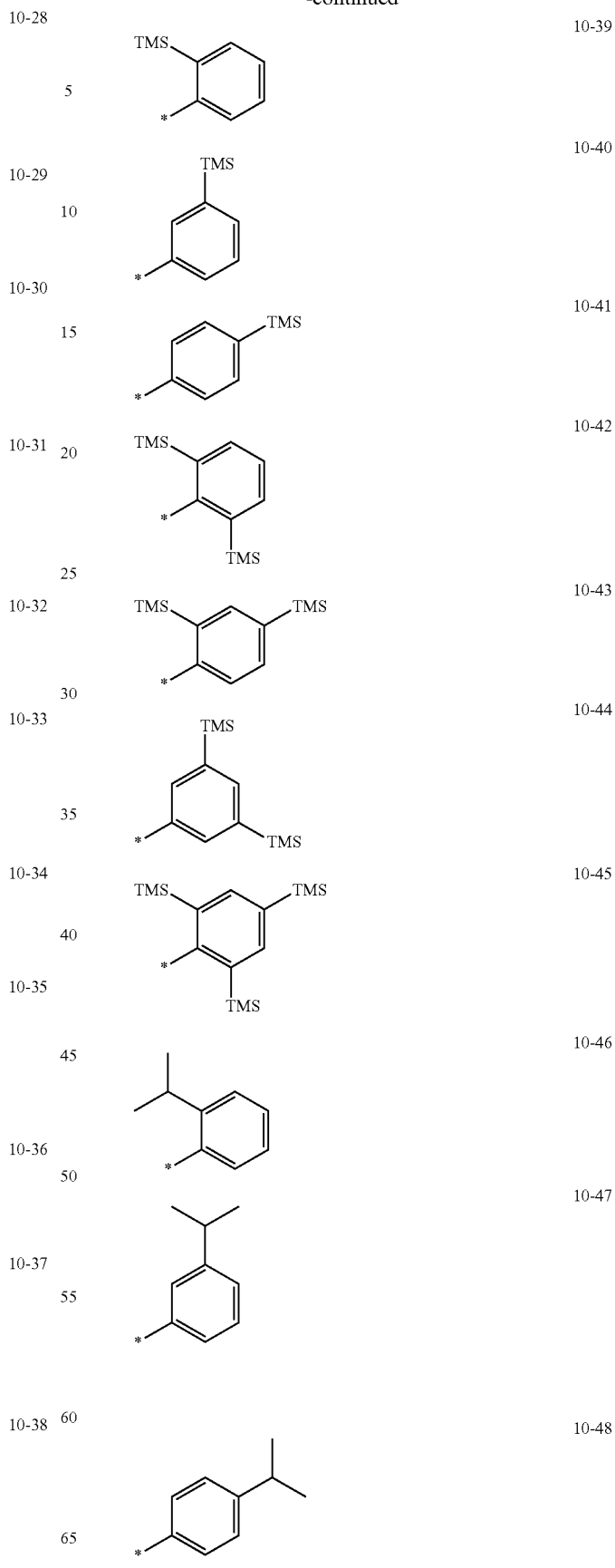

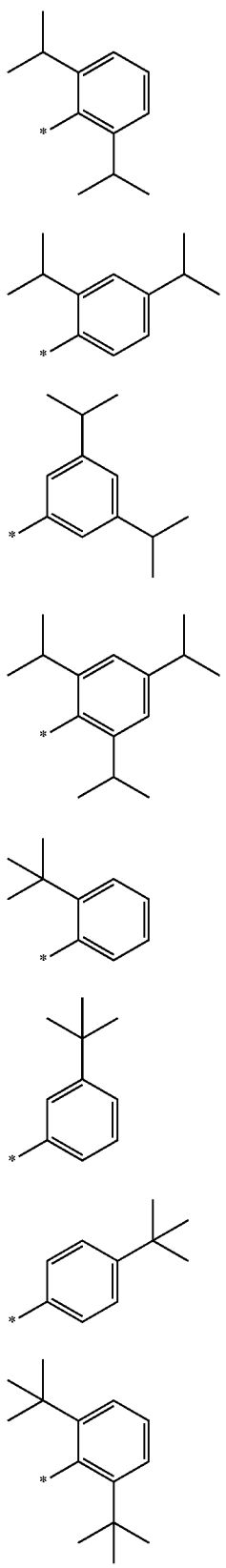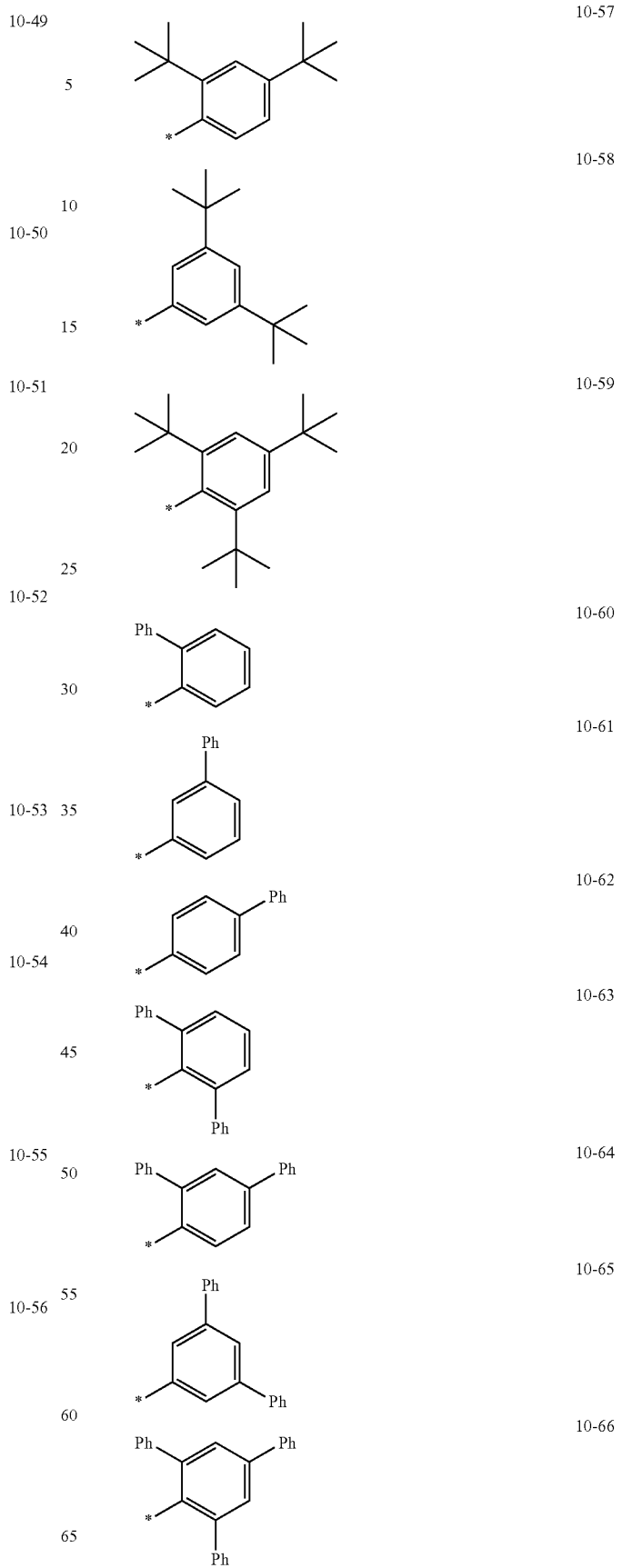

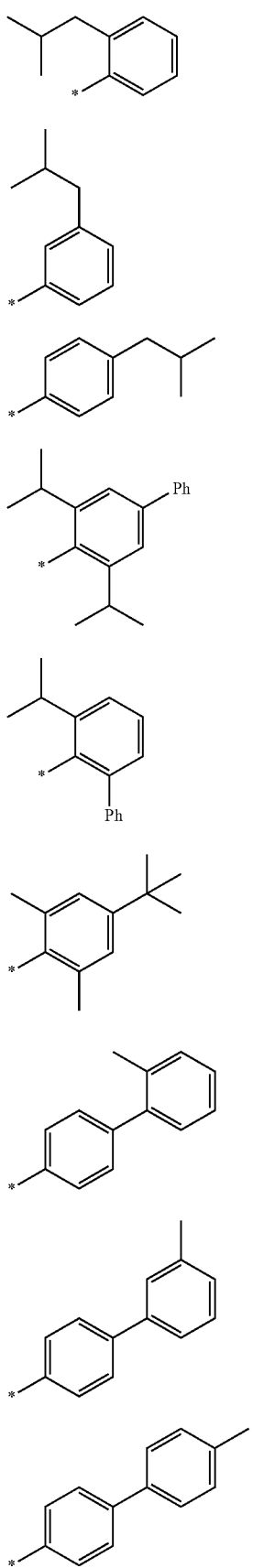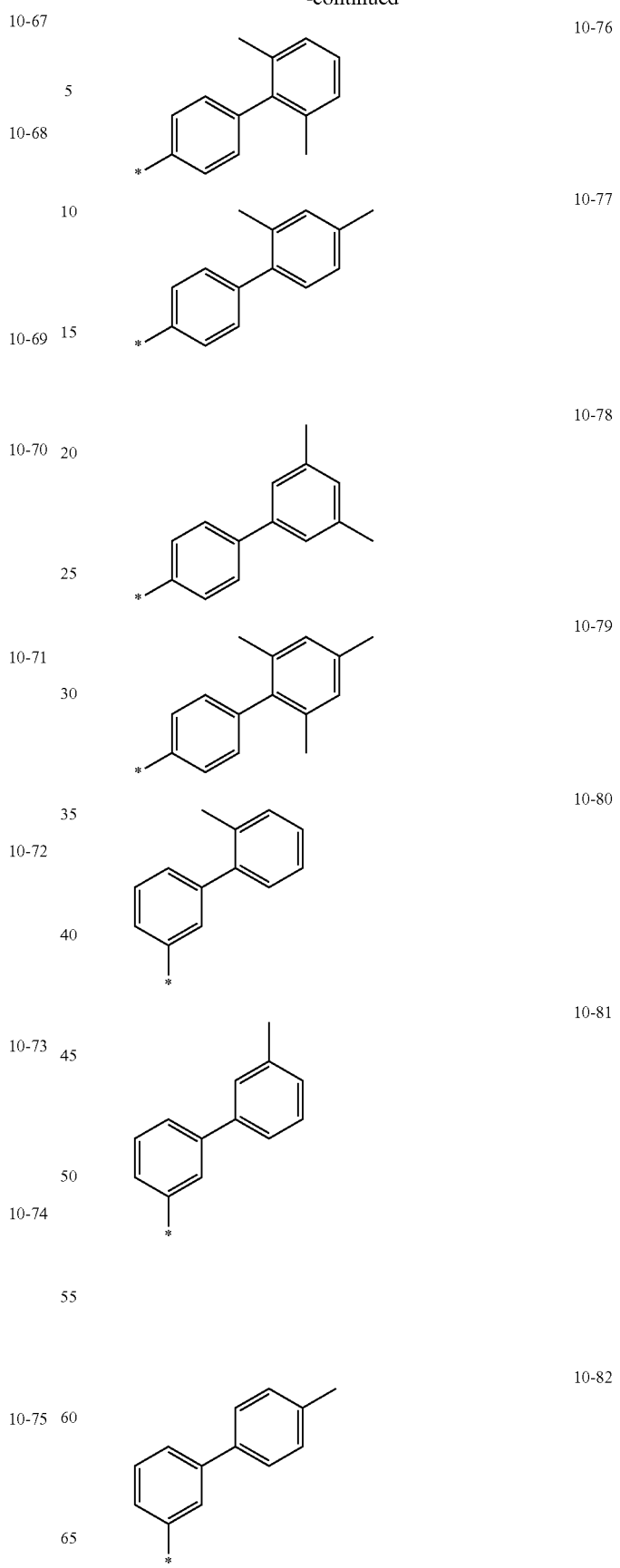

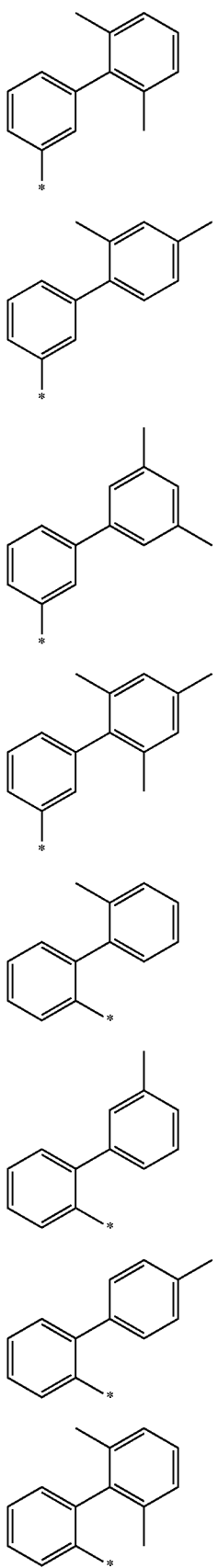
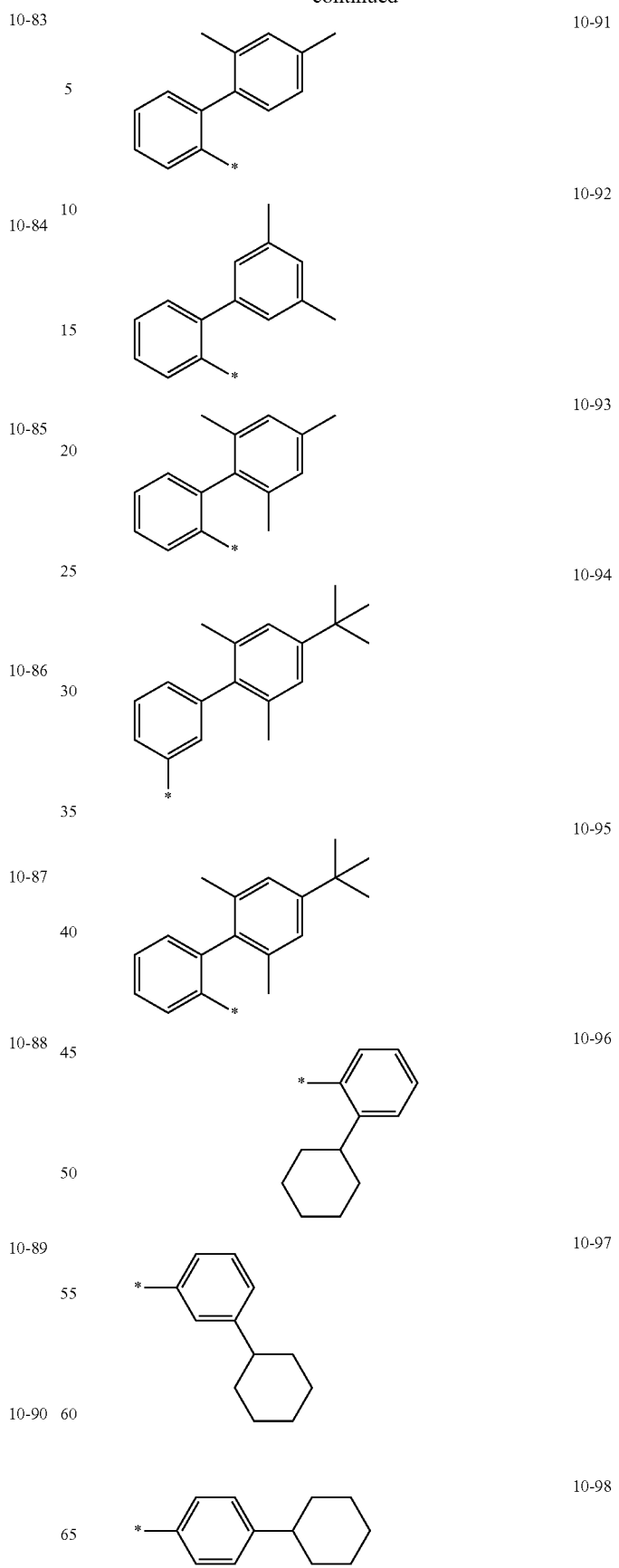

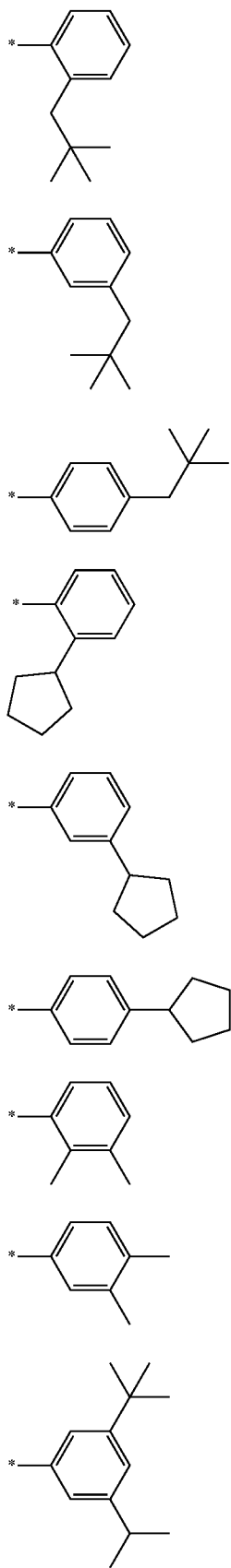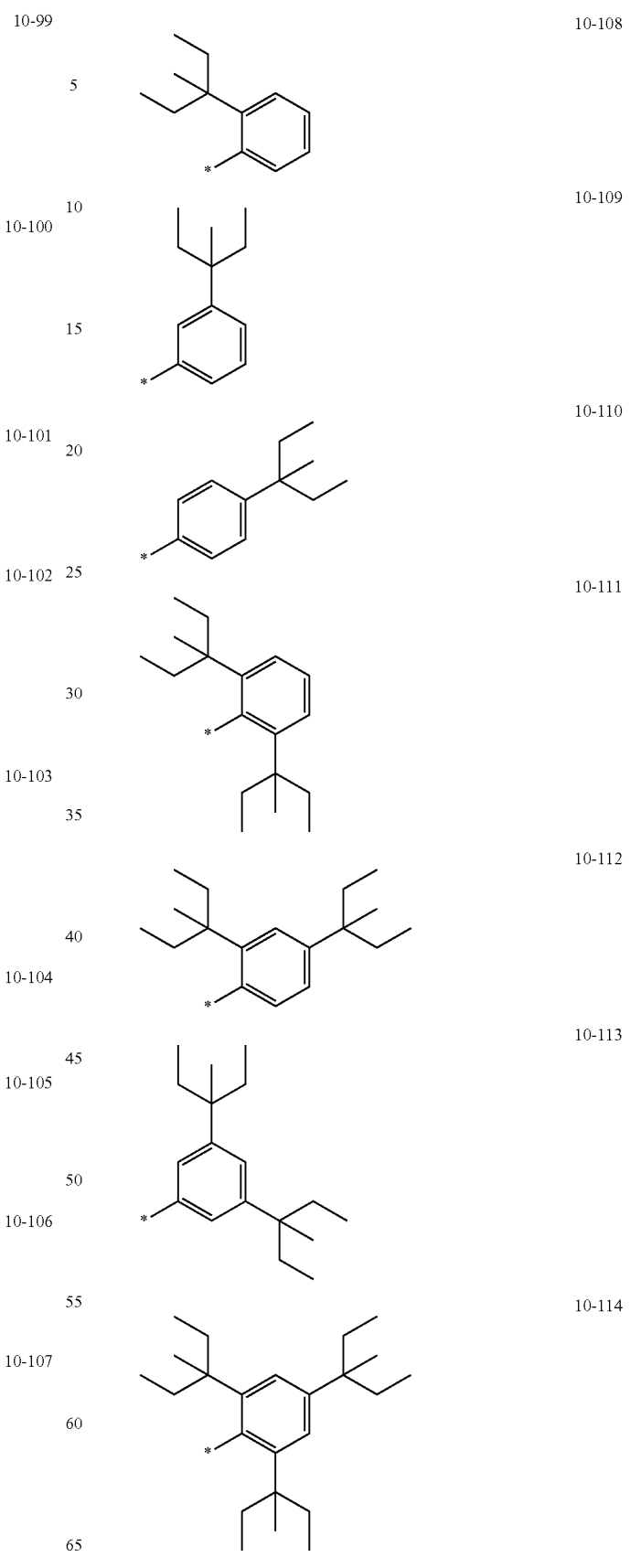

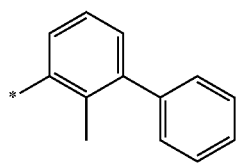
10-115
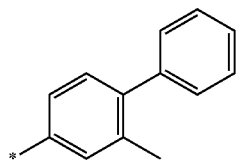
10-116
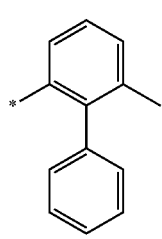
10-117
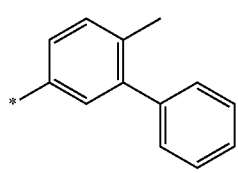
10-118
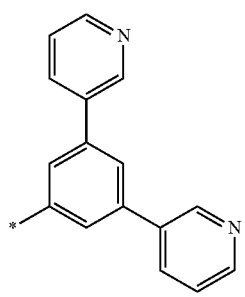
10-201
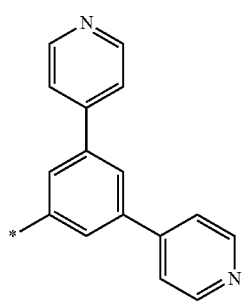
10-202
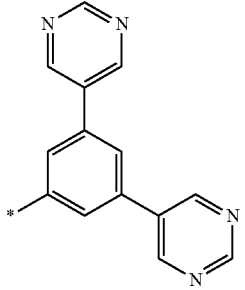
10-203
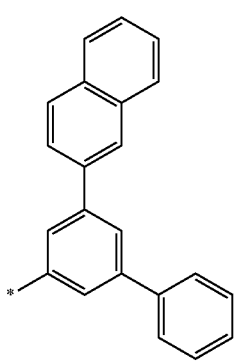
10-204
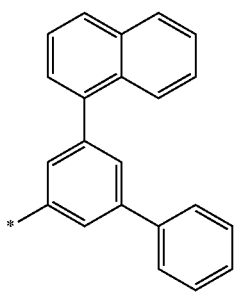
10-205
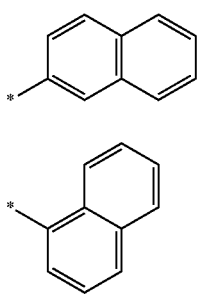
10-206
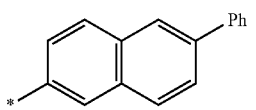
10-207
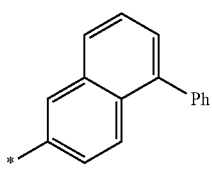
10-208
10-209

-continued
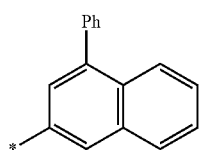
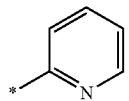
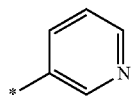
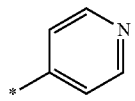
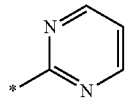
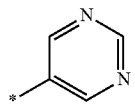
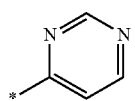
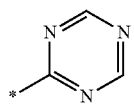
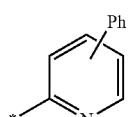
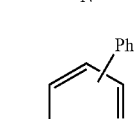
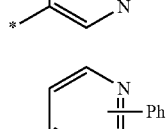
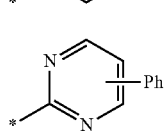
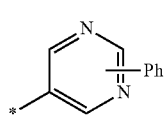
-continued
10-210
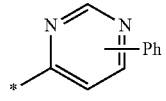
10-211
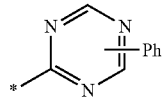
10-212
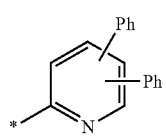
10-213
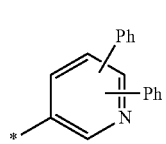
10-214
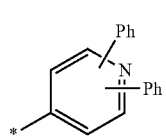
10-215
10-216
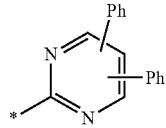
10-217
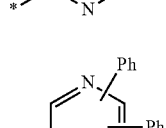
10-218
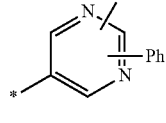
10-219
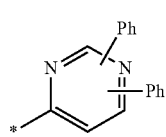
10-220
10-221
10-222
10-223
10-224
10-225
10-226
10-227
10-228
10-229
10-230
10-231
10-232
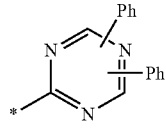
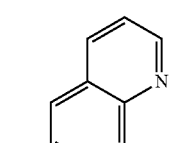
10-233
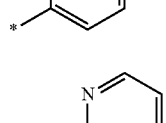
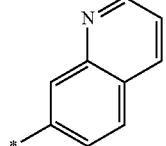

-continued
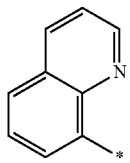
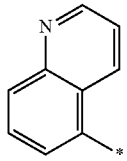
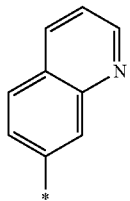
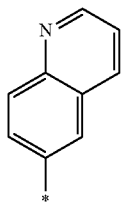
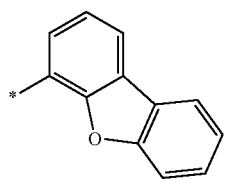
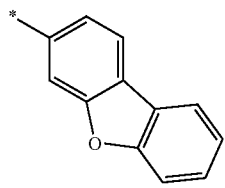
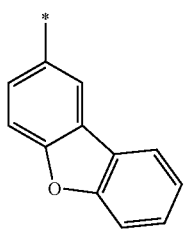
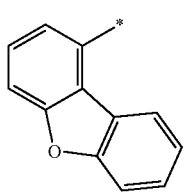
-continued
10-234
10-235
10-236
10-237
10-238
10-239
10-240
10-241
10-242
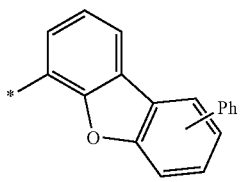
10-243
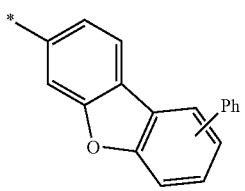
10-244
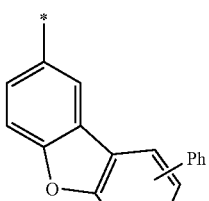
10-245
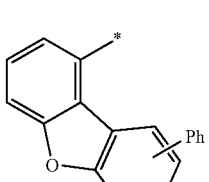
10-246
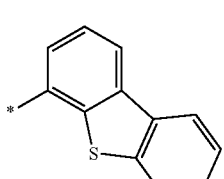
10-247
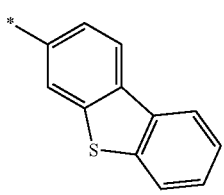
10-248
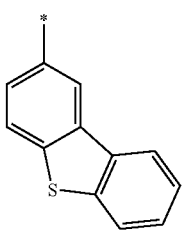
10-249
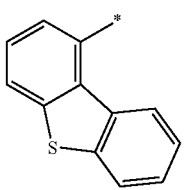

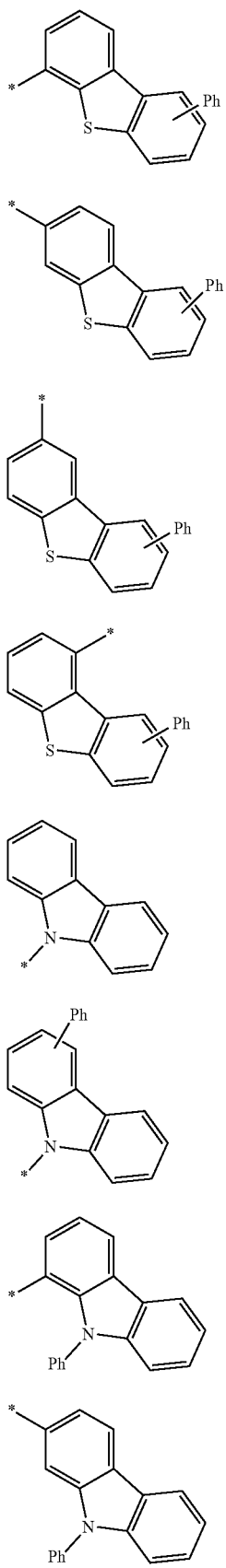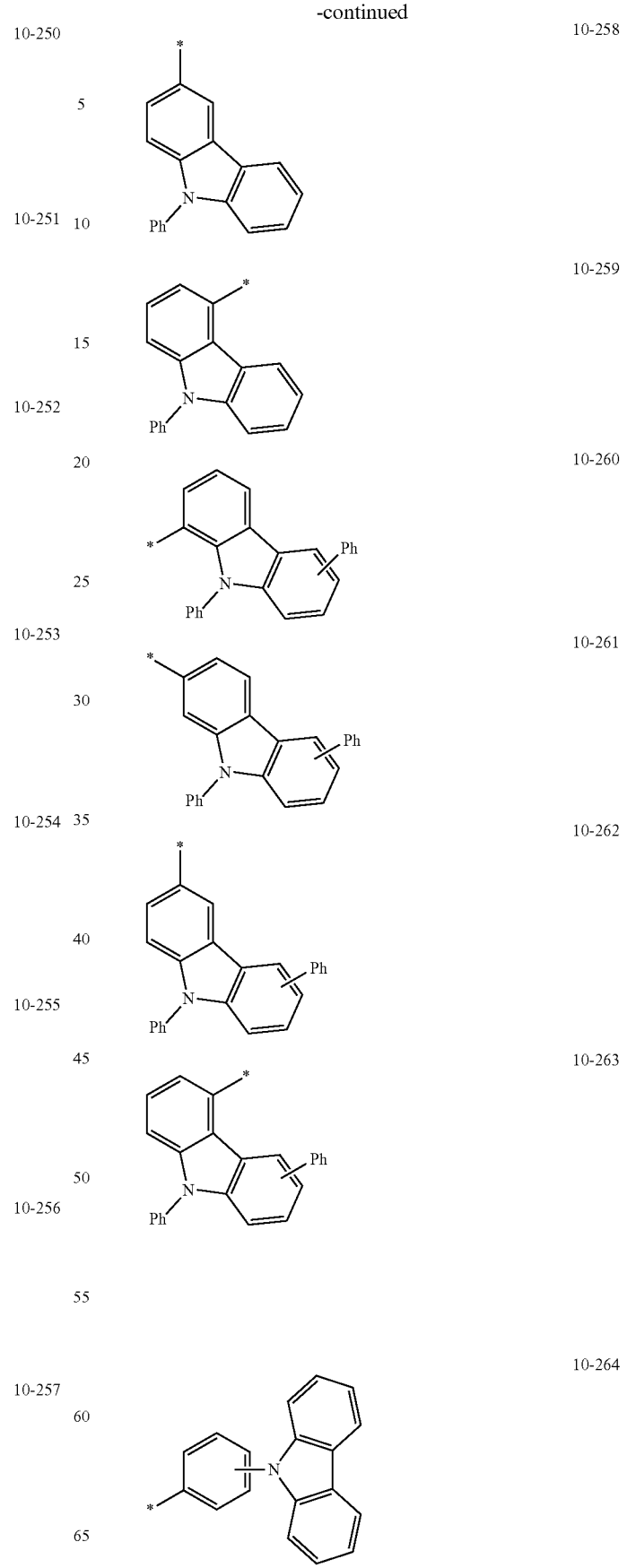

-continued
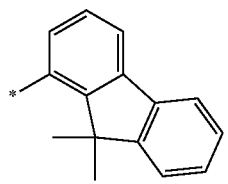 10-265
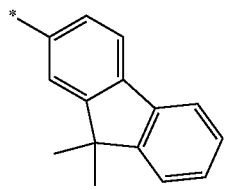 10-266
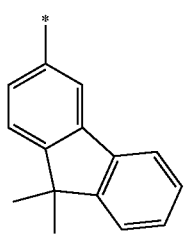 10-267
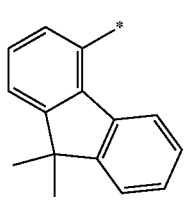 10-268
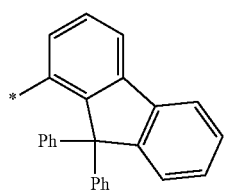 10-269
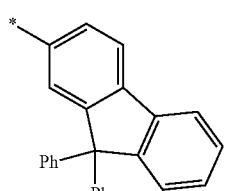 10-270
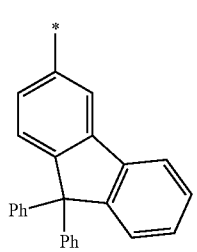 10-271
-continued
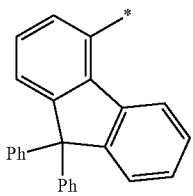 10-272
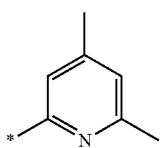 10-273
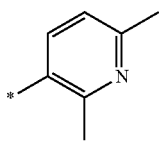 10-274
 10-275
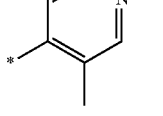 10-276
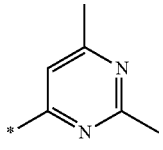 10-277
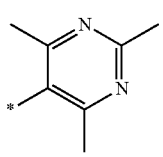 10-278
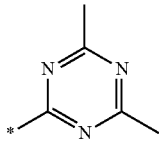 10-279
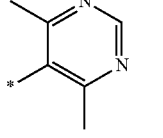 10-280
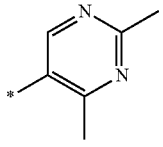 10-281

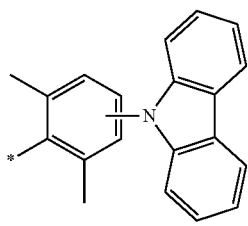
10-282
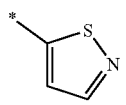
10-295
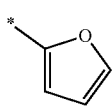
10-283
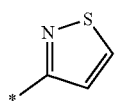
10-296
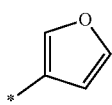
10-284
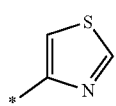
10-297
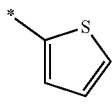
10-285
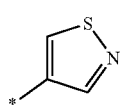
10-298
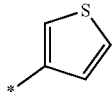
10-286
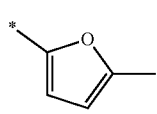
10-299
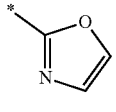
10-287
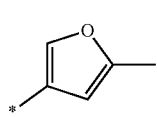
10-300
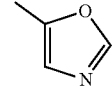
10-288
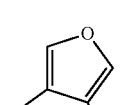
10-301
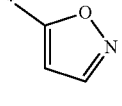
10-289
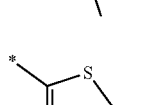
10-302
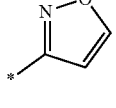
10-290
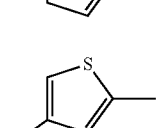
10-303
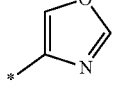
10-291
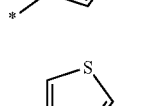
10-304
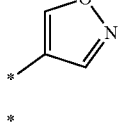
10-292
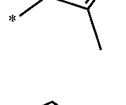
10-305
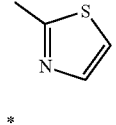
10-293
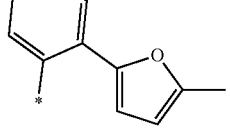
10-306
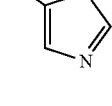
10-294

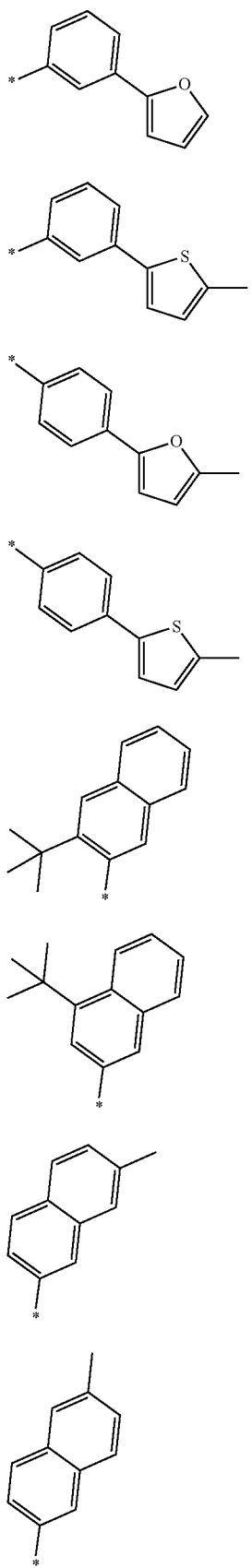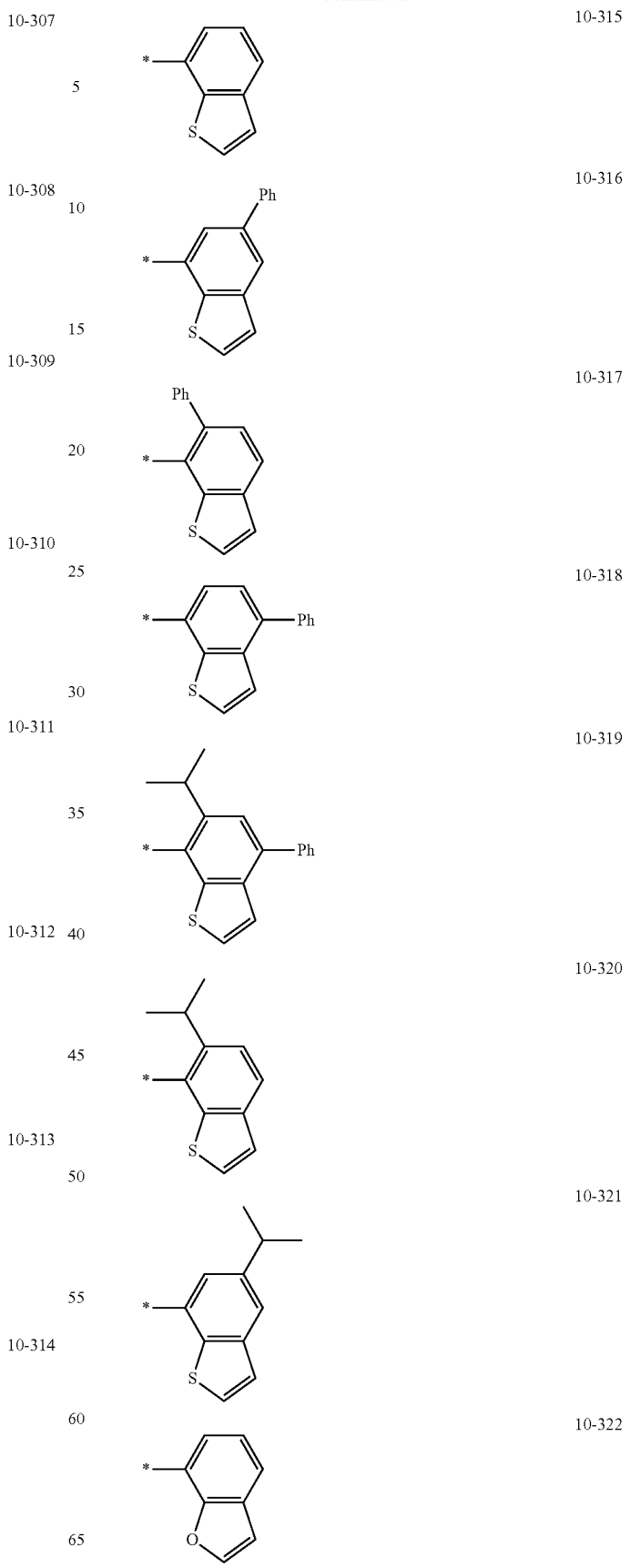

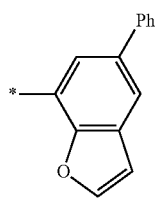
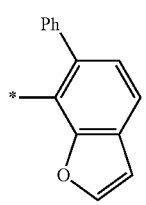
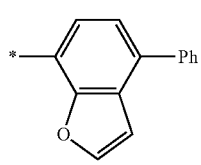
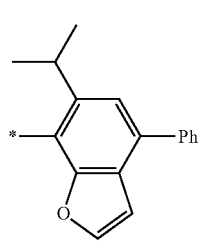
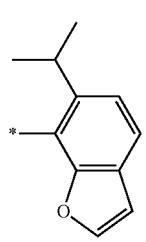
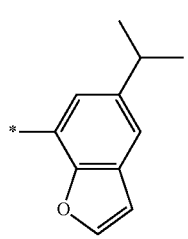
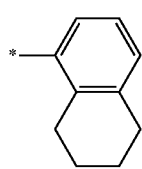
10-323
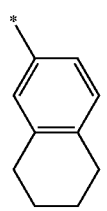
10-324
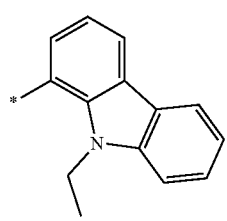
10-325
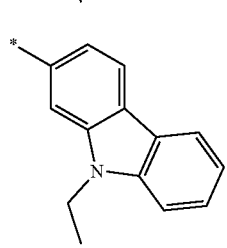
10-326
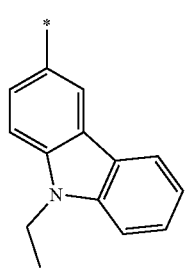
10-327
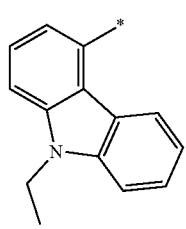
10-328
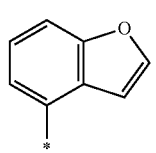
10-329
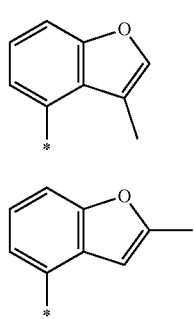
10-330
10-331
10-332
10-333
10-334
10-335
10-336
10-337

10-338 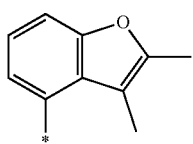
10-339 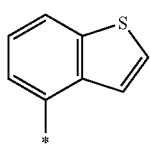
10-340 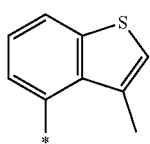
10-341 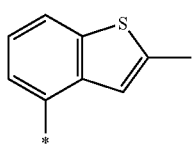
10-342 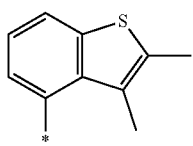
In Formulae 9-1 to 9-66, 10-1 to 10-118, and 10-201 to 10-342, * indicates a binding site to a neighboring atom, Ph is a phenyl group, and TMS is a trimethylsilyl group.
The "group represented by one of Formulae 9-1 to 9-66 in which at least one hydrogen is substituted with deuterium" may be, for example, a group represented by one of Formulae 9-501 to 9-514 and 9-601 to 9-638:
9-501 
9-502 
9-503 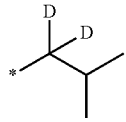
9-504 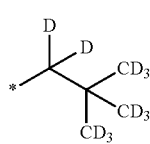
9-505 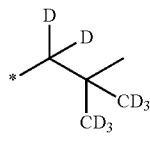
9-506 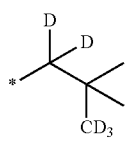
9-507 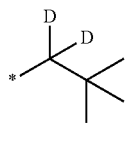
9-508 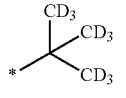
9-509 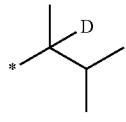
9-510 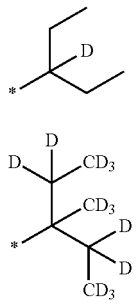
9-511
9-512 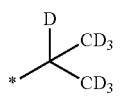
9-513 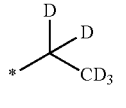
9-514 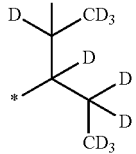
9-601 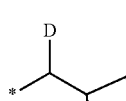
9-602 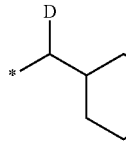

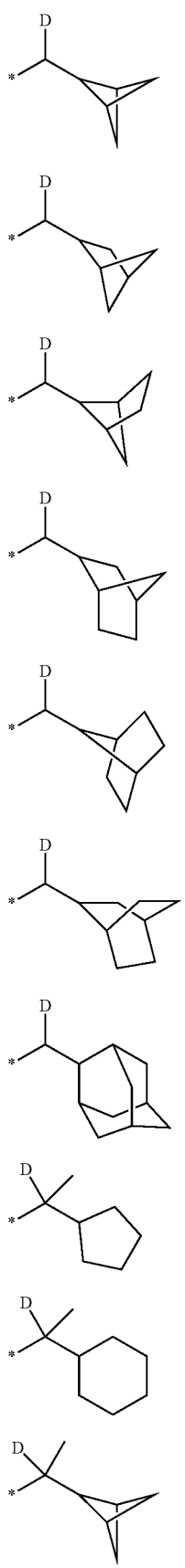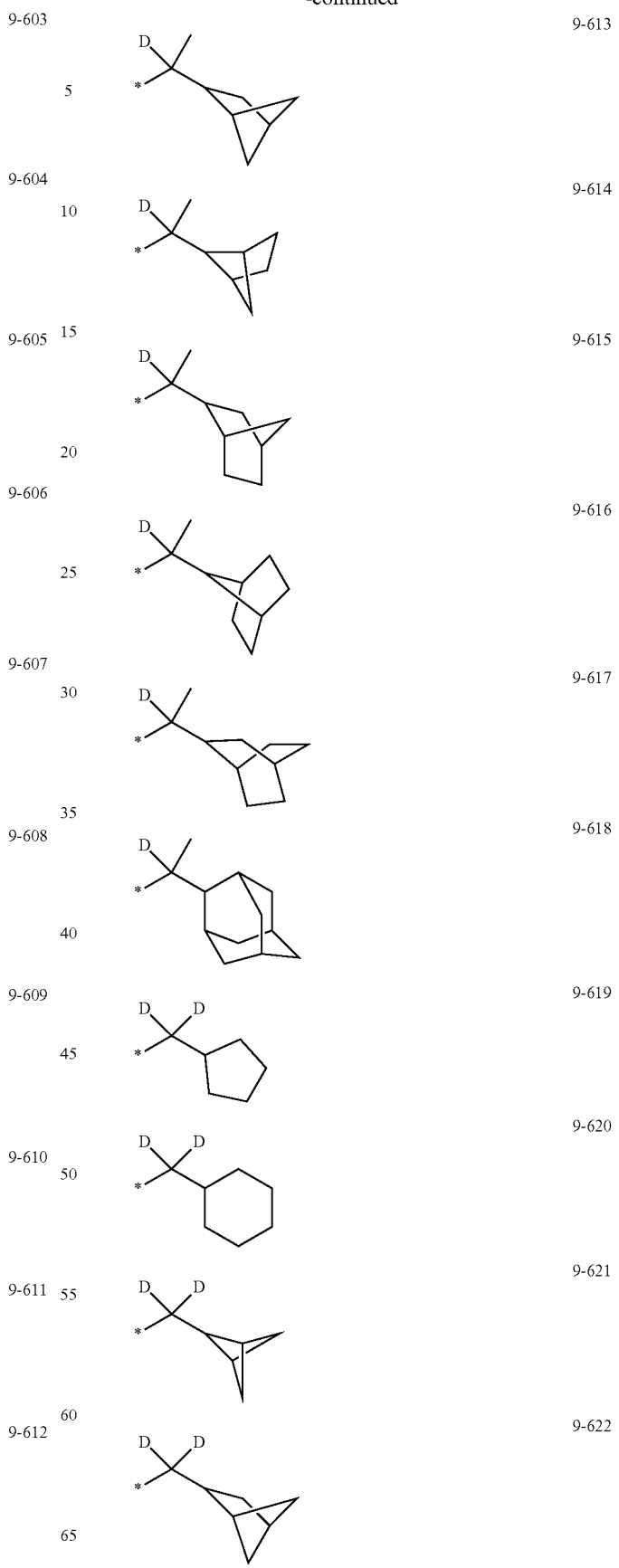

9-623 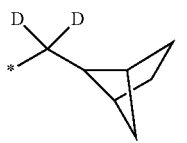
9-624 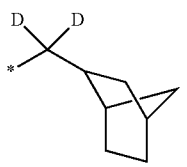
9-625 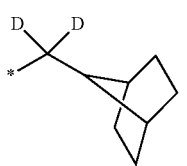
9-626 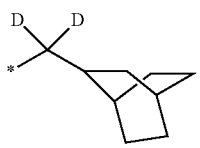
9-627 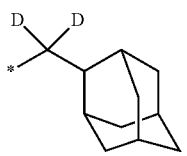
9-628 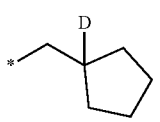
9-629 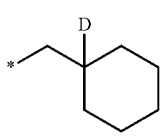
9-630 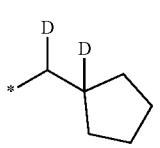
9-631 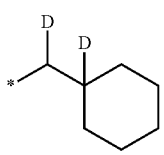
9-632 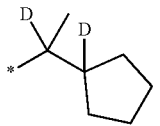
9-633 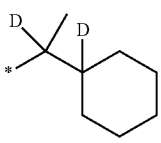
9-634 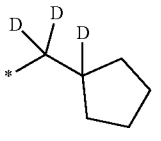
9-635 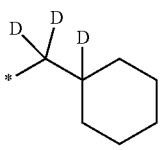
9-636 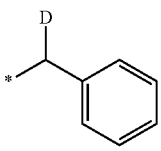
9-637 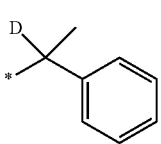
9-638 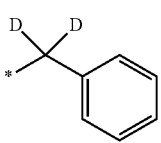
The "group represented by one of Formulae 10-1 to 10-118 in which at least one hydrogen is substituted with deuterium" may be, for example, a group represented by one of Formulae 10-501 to 10-546.
10-501 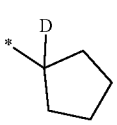
10-502 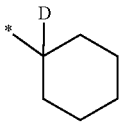
10-503 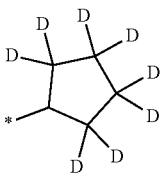

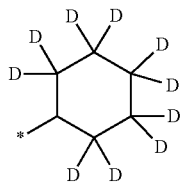
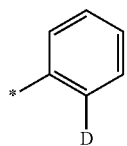
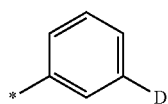
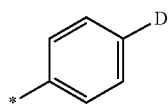
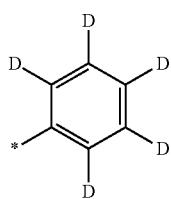
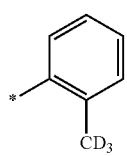
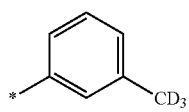
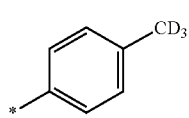
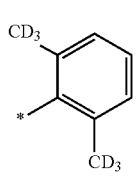
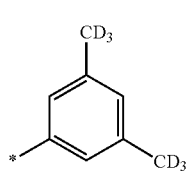
10-504
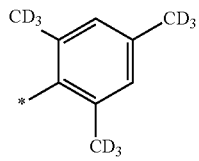
10-505
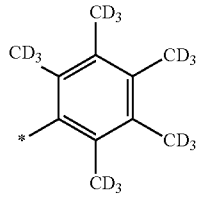
10-506
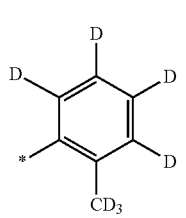
10-507
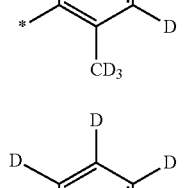
10-508
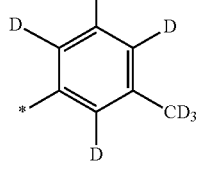
10-509
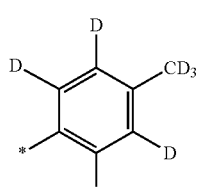
10-510
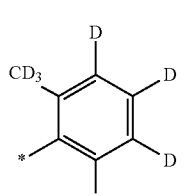
10-511
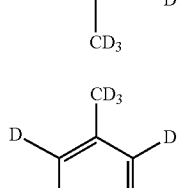
10-512
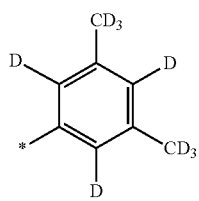
10-513
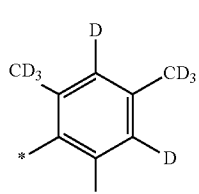
10-514
10-515
10-516
10-517
10-518
10-519
10-520
10-521

-continued
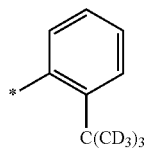
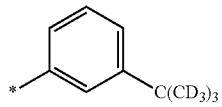
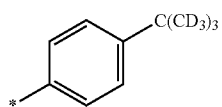
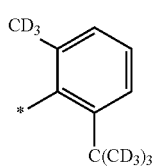
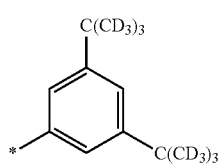
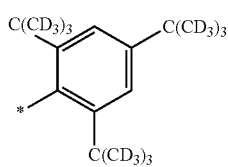
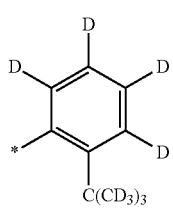
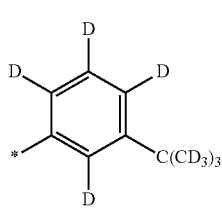
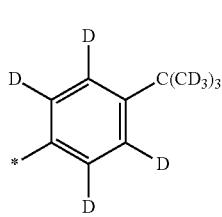
-continued
10-522
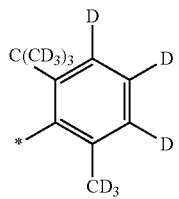
10-523
10-524 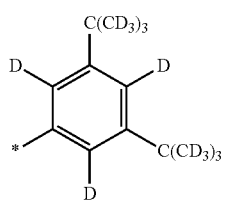
10-525
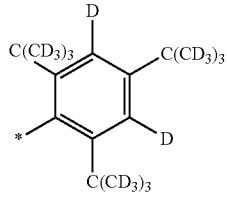
10-526
10-527 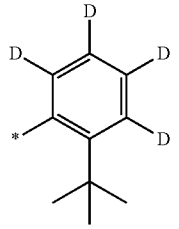
10-528 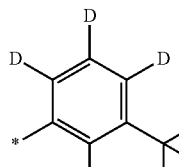
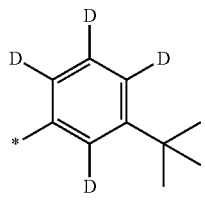
10-529 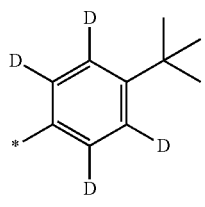
10-530
10-531
10-532
10-533
10-534
10-535
10-536
10-537 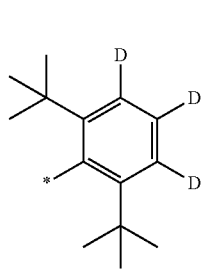

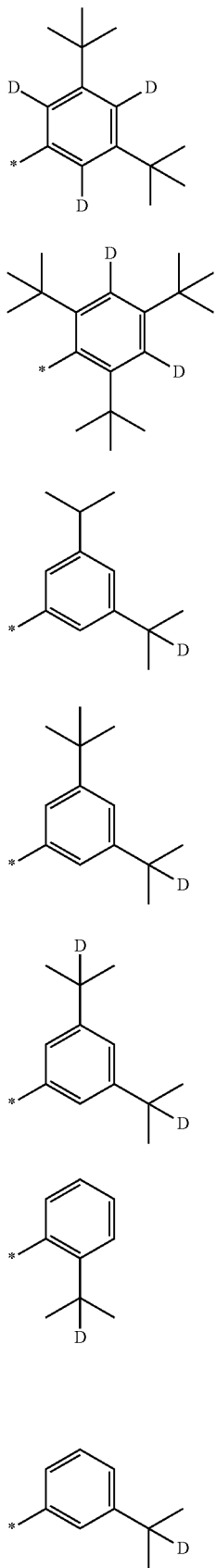

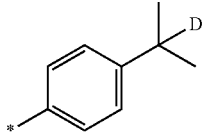

a1 in Formula 3 indicates the number of groups $R_1$ and may be an integer from 0 to 10. When a1 is 2 or greater, two or more groups $R_1$ may be identical to or different from each other. For example, a1 may be 0, 1, or 2.

a2 in Formula 2 indicates the number of groups $R_2$ and may be an integer from 0 to 20. When a2 is 2 or greater, two or more groups $R_2$ may be identical to or different from each other. For example, a2 may be an integer from 0 to 10.

In one embodiment, $L_1$ in Formula 1 may be a ligand represented by Formula 2-1, 2-2, or 2-3.

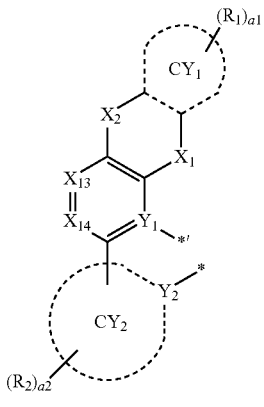

2-1

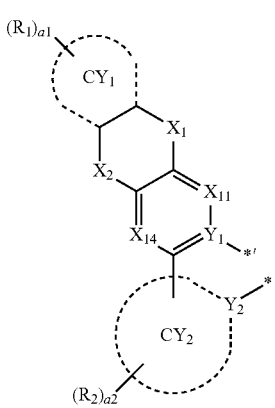

2-2

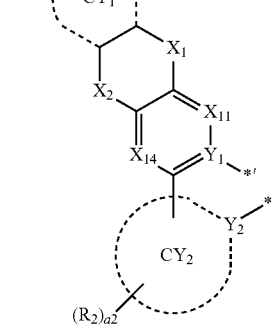

2-3

In Formulae 2-1 to 2-3, $X_{11}$ may be N or $C(R_{11})$, $X_{12}$ may be N or $C(R_{12})$, $X_{13}$ may be N or $C(R_{13})$, $X_{14}$ may be N or $C(R_{14})$, and $X_1$, $X_2$, $Y_1$, $Y_2$, ring $CY_1$, ring $CY_2$, $R_1$, $R_2$, $R_{11}$ to $R_{14}$, a1, a2, *, and *' are the same as described in the present specification.

In an embodiment, $L_1$ in Formula 1 may be the ligand represented by Formula 2-3, $X_{12}$ in Formula 2-3 may be $C(R_{12})$, and $R_{12}$ may be $-Si(Q_3)(Q_4)(Q_5)$ or $-Ge(Q_3)(Q_4)(Q_5)$, wherein $Q_3$ to $Q_5$ are as provided herein.

In an embodiment, $L_1$ in Formula 1 may be a ligand represented by Formula 2-1(1), 2-2(1), or 2-3(1):

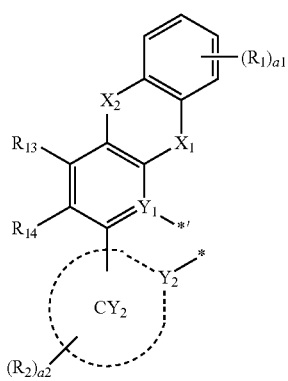

2-1(1)

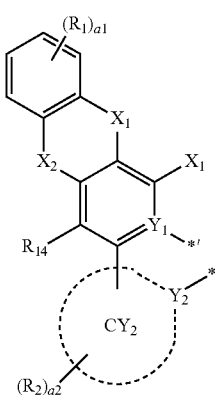

2-2(1)

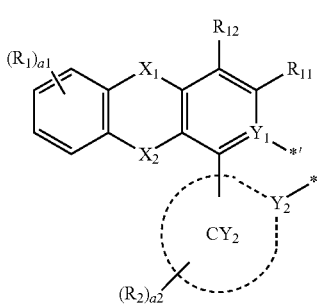

2-3(1)

In Formulae 2-1(1) to 2-3(1), $X_1$, $X_2$, $Y_1$, $Y_2$, ring $CY_2$, $R_1$, $R_2$, $R_{11}$ to $R_{14}$, a1, a2, *, and *' are the same as described in the present specification.

In one or more embodiments, a group represented by

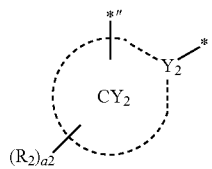

in Formula 2 may be a group represented by one of Formulae CY2-1 to CY2-31:

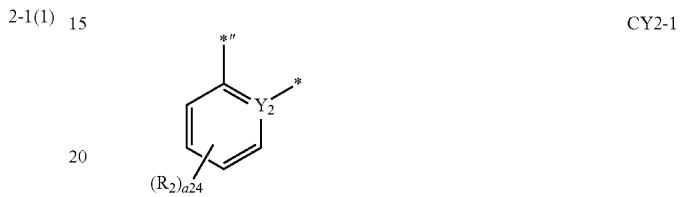

CY2-1

CY2-2

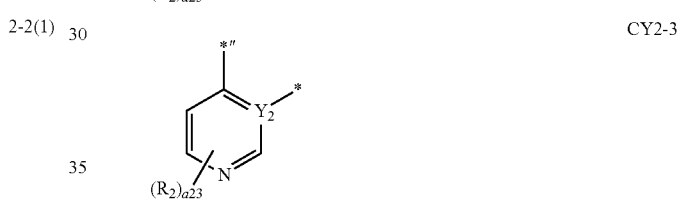

CY2-3

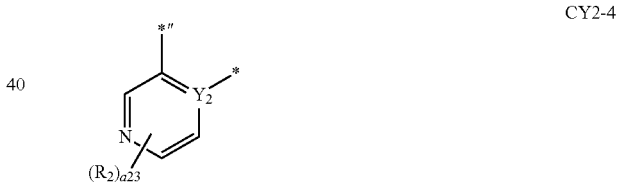

CY2-4

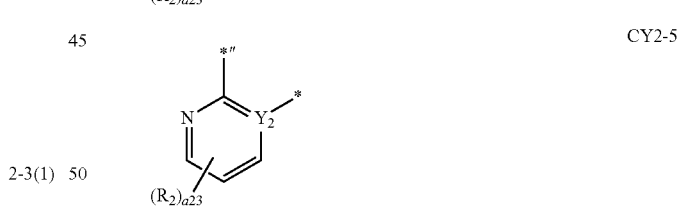

CY2-5

CY2-6

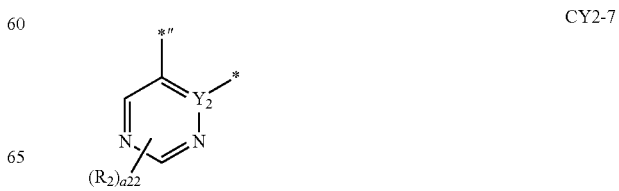

CY2-7

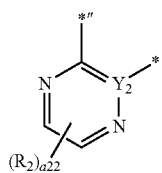
CY2-8
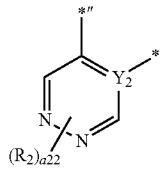
CY2-9
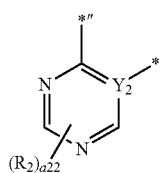
CY2-10
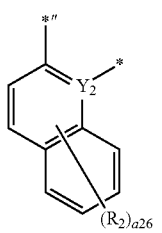
CY2-11
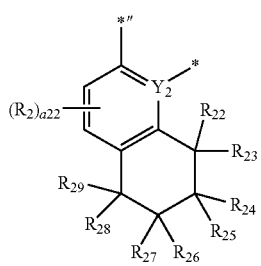
CY2-12
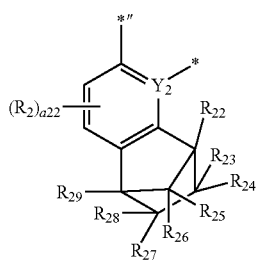
CY2-13
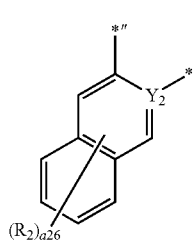
CY2-14
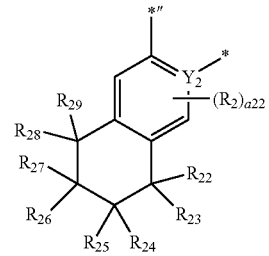
CY2-15
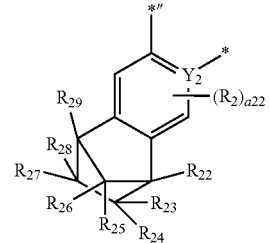
CY2-16
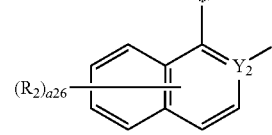
CY2-17
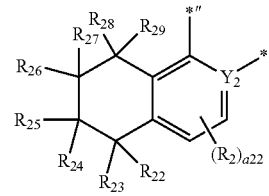
CY2-18
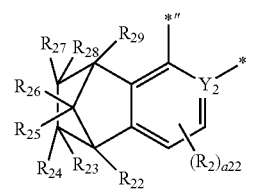
CY2-19
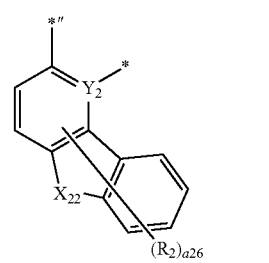
CY2-20
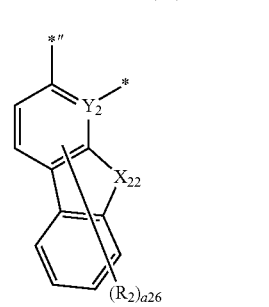
CY2-21

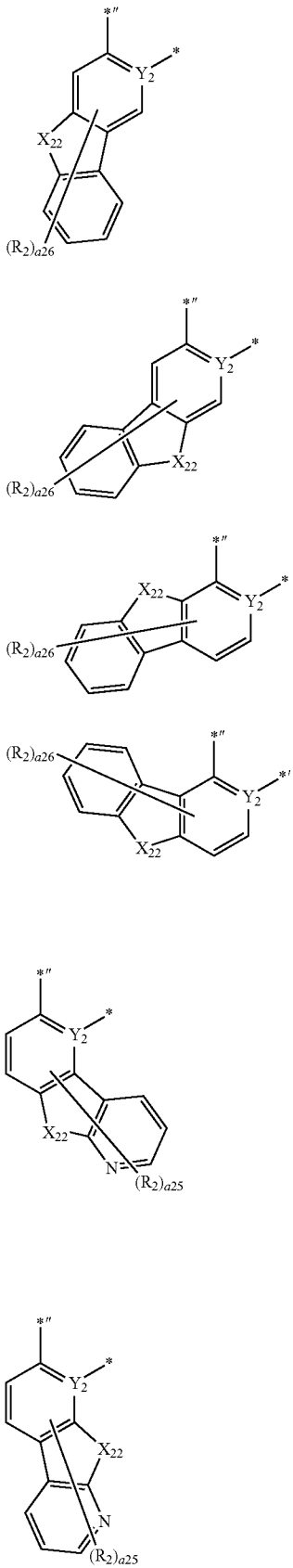
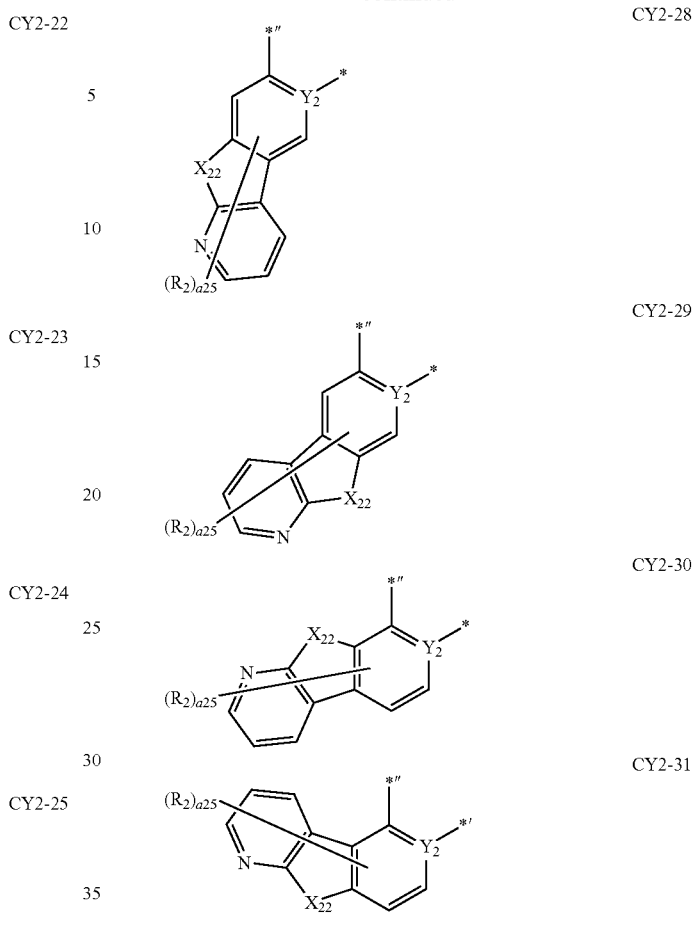

In Formulae CY2-1 to CY2-31,
Y$_2$ and R$_2$ are each the same as described above,
X$_{22}$ is C(R$_{22}$)(R$_{23}$), N(R$_{22}$), O, S, or Si(R$_{22}$)(R$_{23}$),
R$_{22}$ to R$_{29}$ are the same as described in connection with R$_2$,
a26 is an integer from 0 to 6,
a25 is an integer from 0 to 5,
a24 is an integer from 0 to 4,
a23 is an integer from 0 to 3,
a22 is an integer from 0 to 2,
' indicates a binding site to a neighboring atom in Formula 2, and
" indicates a binding site to M in Formula 1.

Meanwhile, L$_2$ in Formula 1 may be a bidentate ligand bonded to M in Formula 1 via two atoms, wherein the two atoms may be O, S, N, C, P, Si, As, or a combination thereof, where the atoms are included therein. The two atoms may the same or different.

In an embodiment, L$_2$ in Formula 1 may be a bidentate ligand bonded to M in Formula 1 via two atoms that are N, C, or a combination thereof, included therein.

In an embodiment, L$_2$ in Formula 1 may be a group represented by one of Formulae 3A to 3F:

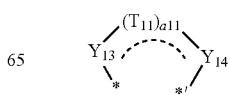

3A

-continued

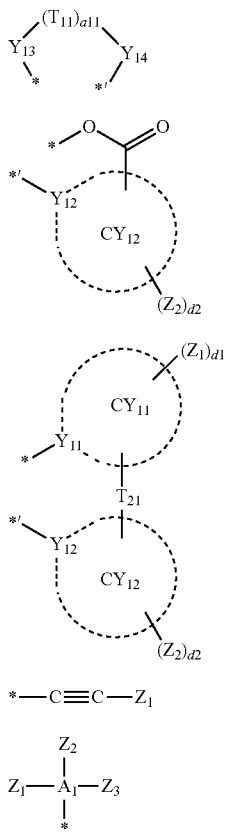

*—C≡C—Z₁

$$Z_1-A_1-Z_3$$ with $Z_2$ above and * below on $A_1$

In Formulae 3A to 3F,
$Y_{13}$ is O, N, $N(Z_1)$, $P(Z_1)(Z_2)$, or $As(Z_1)(Z_2)$,
$Y_{14}$ is O, N, $N(Z_3)$, $P(Z_3)(Z_4)$, or $As(Z_3)(Z_4)$,
$T_{11}$ is a single bond, a double bond, *—$C(Z_{11})(Z_{12})$—*', 
*—$C(Z_{11})$=$C(Z_{12})$—*', *=$C(Z_{11})$—*',
*—$C(Z_{11})$=*', *=$C(Z_{11})$—$C(Z_{12})$=$C(Z_{13})$—*',
*—$C(Z_{11})$=$C(Z_{12})$—$C(Z_{13})$=*', *—$N(Z_{11})$—*', or a
$C_5$-$C_{30}$ carbocyclic group unsubstituted or substituted with at least one $Z_{11}$,
a11 is an integer from 0 to 10, wherein, when a11 is 2 or greater, two or more groups $T_{11}$ are identical to or different from each other,
$Y_{11}$ and $Y_{12}$ are each independently C or N,
$T_{21}$ is a single bond, a double bond, O, S, $C(Z_{11})(Z_{12})$, $Si(Z_{11})(Z_{12})$, or $N(Z_{11})$,
ring $CY_{11}$ and ring $CY_{12}$ are each independently a $C_5$-$C_{30}$ carbocyclic group or a $C_1$-$C_{30}$ heterocyclic group,
$A_1$ is P or As,
$Z_1$ to $Z_4$ and $Z_{11}$ to $Z_{13}$ are the same as described in connection with $R_2$,
d1 to d2 are each independently an integer from 0 to 10, and
and *' each indicate a binding site to M in Formula 1.
For example, a group represented by

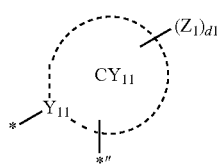

in Formula 3D may be a group represented by one of Formulae CY11-1 to CY11-34, and (or)
a group represented by

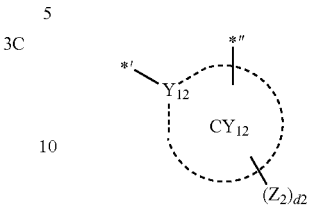

in Formulae 3C and 3D may be a group represented by one of Formulae CY12-1 to CY12-34:

CY11-1

CY11-2

CY11-3

CY11-4

CY11-5

CY11-6

CY11-7

CY11-8

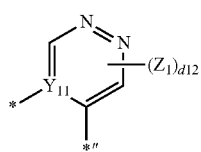 CY11-9
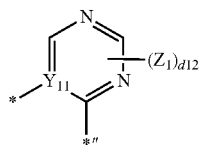 CY11-10
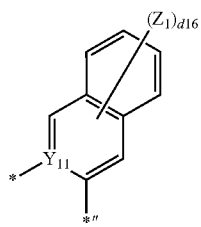 CY11-11
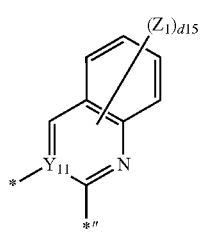 CY11-12
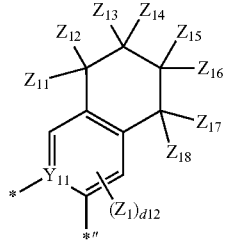 CY11-13
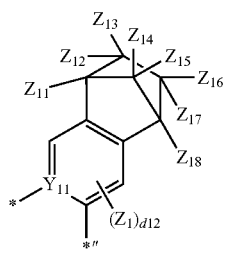 CY11-14
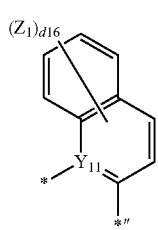 CY11-15
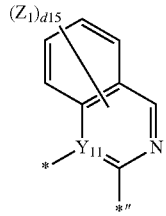 CY11-16
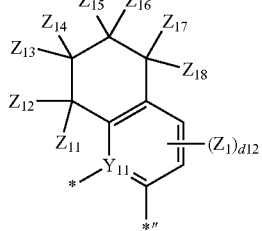 CY11-17
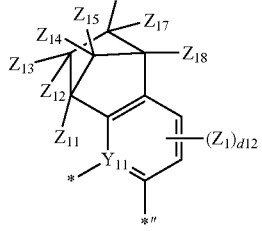 CY11-18
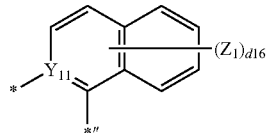 CY11-19
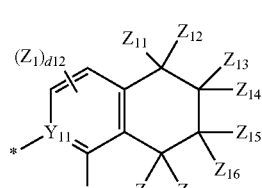 CY11-20
CY11-21
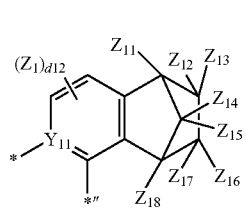 CY11-22

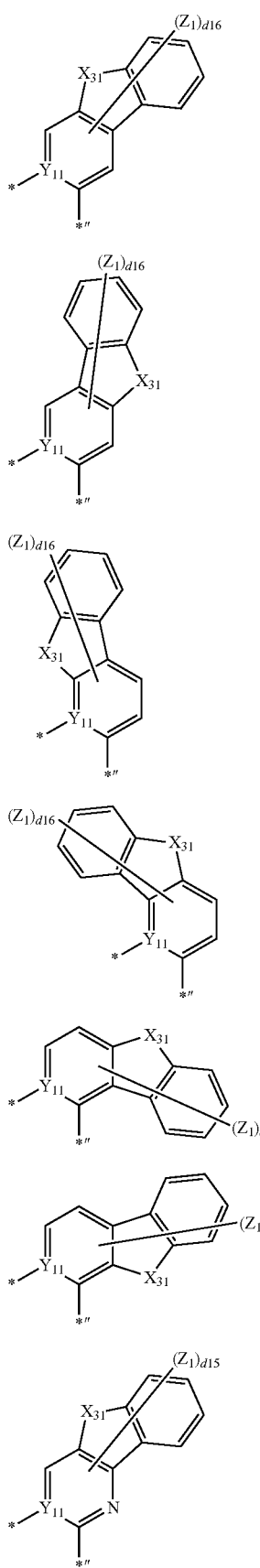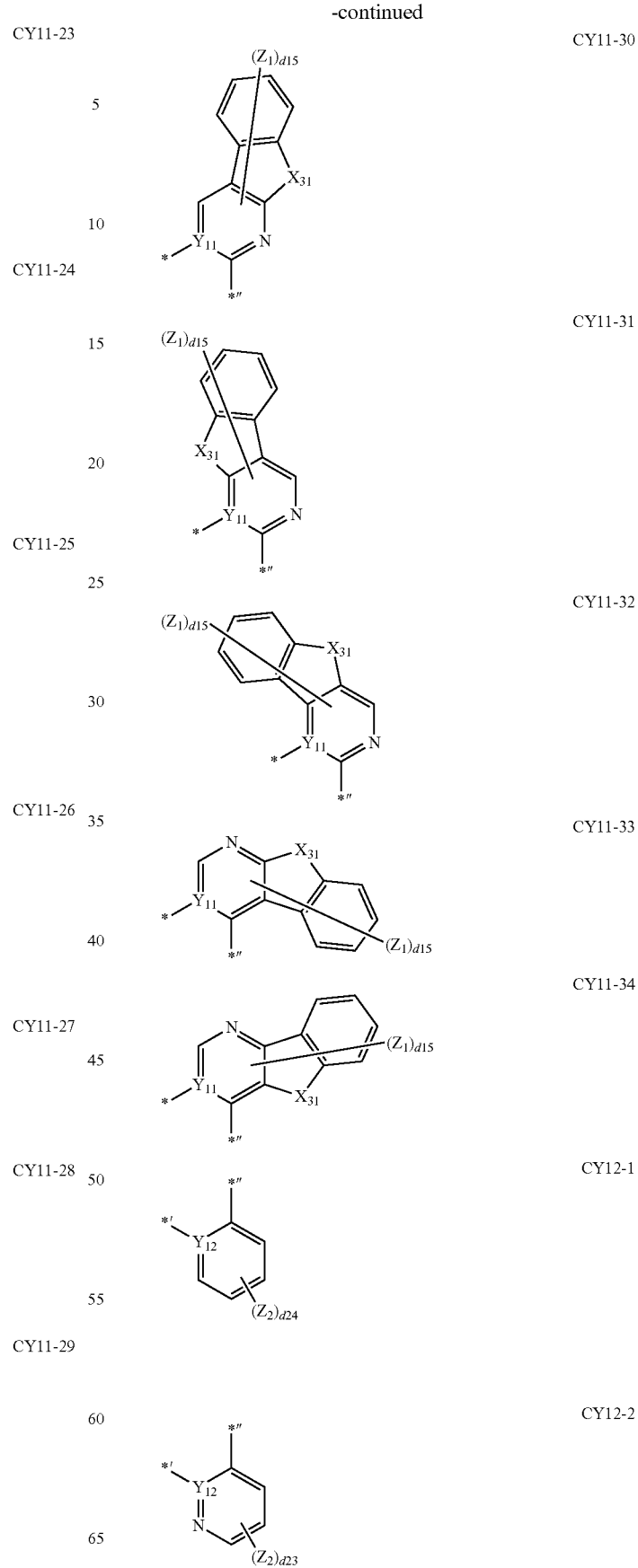

-continued
CY12-3
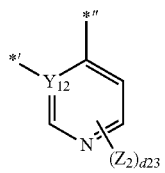
CY12-4
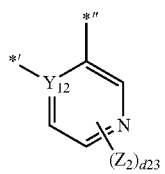
CY12-5
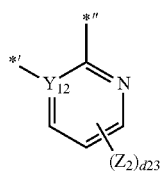
CY12-6
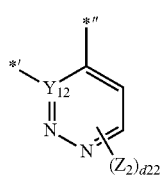
CY12-7
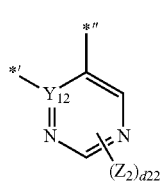
CY12-8
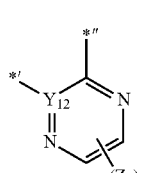
CY12-9
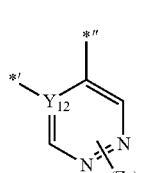
CY12-10
-continued
CY12-11
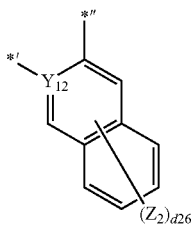
CY12-12
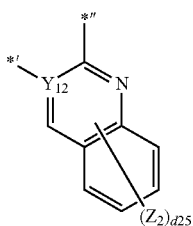
CY12-13
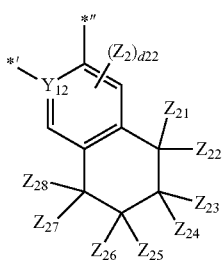
CY12-14
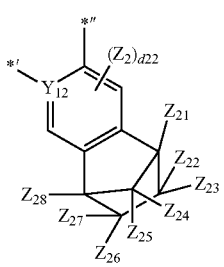
CY12-15
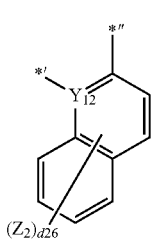
CY12-16
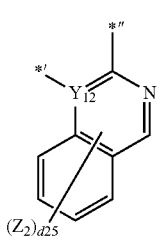

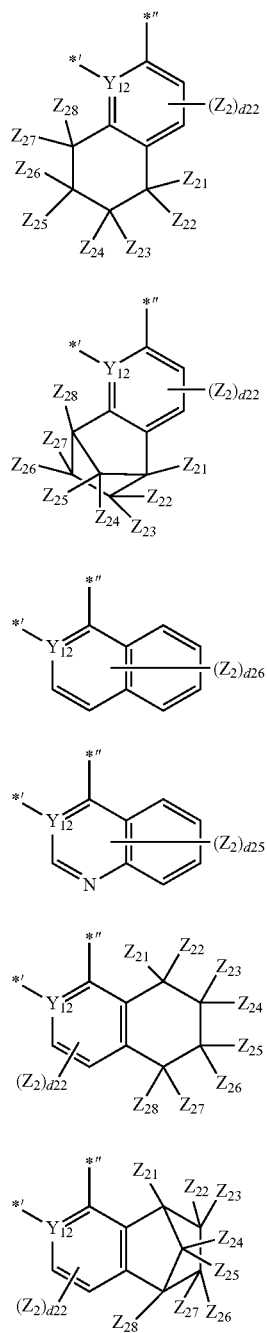
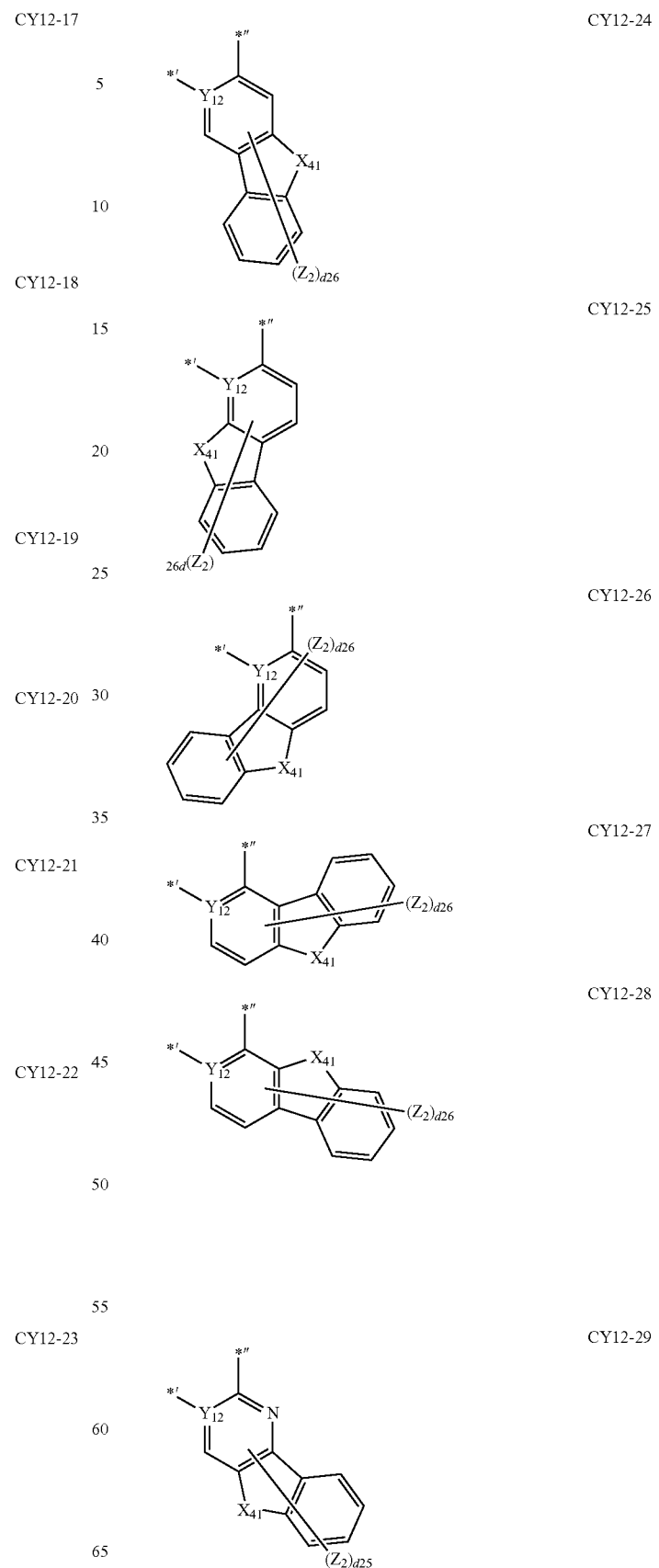

CY12-30

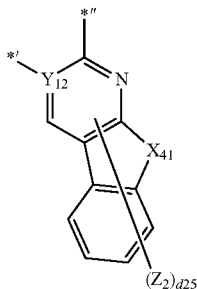

CY12-31

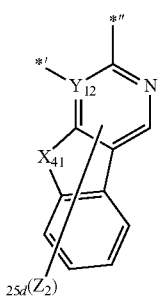

CY12-32

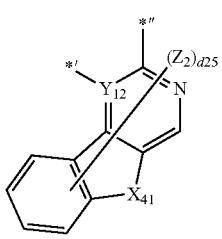

CY12-33

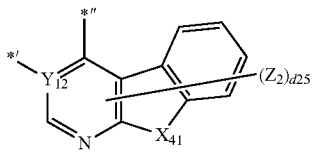

CY12-34

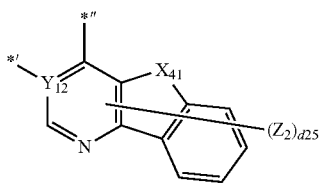

In Formulae CY11-1 to CY11-34 and CY12-1 to CY12-34,
$X_{31}$ is O, S, $N(Z_{11})$, $C(Z_{11})(Z_{12})$, or $Si(Z_{11})(Z_{12})$,
$X_{41}$ is O, S, $N(Z_{21})$, $C(Z_{21})(Z_{22})$, or $Si(Z_{21})(Z_{22})$,
$Y_{11}$, $Y_{12}$, $Z_1$, and $Z_2$ are the same as described in the present specification,
$Z_{11}$ to $Z_{18}$ and $Z_{21}$ to $Z_{28}$ are the same as described in connection with $R_1$,
d12 and d22 are each independently an integer from 0 to 2,
d13 and d23 are each independently an integer from 0 to 3,
d14 and d24 are each independently an integer from 0 to 4,
d15 and d25 are each independently an integer from 0 to 5,
d16 and d26 are each independently an integer from 0 to 6, and in Formulae CY11-1 to CY11-34 and CY12-1 to CY12-34, * and *' each indicate a binding site to M in Formula 1, and *" indicates a binding site to a neighboring atom in Formula 3C or a binding site to $T_{21}$ in Formula 3D.

In an embodiment, $L_2$ in Formula 1 may be the ligand represented by Formula 3D, and at least one of $Z_1$ and $Z_2$ in Formula 3D may each independently be: deuterium; —Si($Q_3$)($Q_4$)($Q_5$); —Ge($Q_3$)($Q_4$)($Q_5$); or a $C_1$-$C_{60}$ alkyl group substituted with at least one deuterium.

In an embodiment, $L_2$ may be a ligand represented by one of Formulae 3-1 and 3-101 to 3-112:

3-1

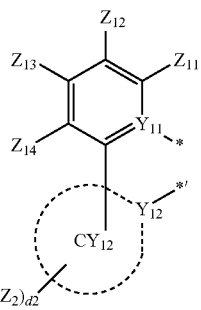

3-101

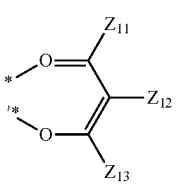

3-102

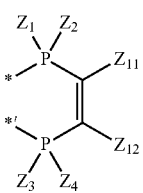

3-103

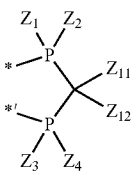

3-104

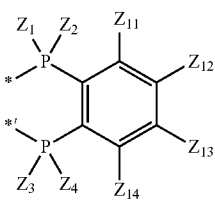

3-105

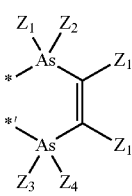

-continued

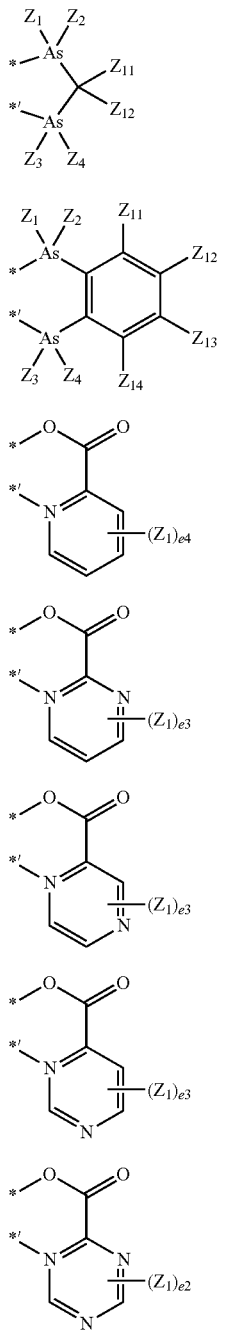

In Formulae 3-1 and 3-101 to 3-112,
Y$_{11}$, Y$_{12}$, ring CY$_{12}$, Z$_1$ to Z$_4$, Z$_{11}$ to Z$_{13}$, and d2 are the same as described in the present specification,
Z$_{14}$ is the same as described in connection with Z$_{11}$,
e2 is an integer from 0 to 2,
e3 is an integer from 0 to 3,
e4 is an integer from 0 to 4, and
and *' each indicate a binding site to M in Formula 1.

In an embodiment, Z$_{12}$ in Formula 3-1 may be: —Si(Q$_3$)(Q$_4$)(Q$_5$); —Ge(Q$_3$)(Q$_4$)(Q$_5$); or a deuterated C$_1$-C$_{60}$ alkyl group.

In an embodiment, in Formula 3-1, Z$_{12}$ may be —Si(Q$_3$)(Q$_4$)(Q$_5$) or —Ge(Q$_3$)(Q$_4$)(Q$_5$), and Z$_{13}$ may not be hydrogen and a methyl group.

In one or more embodiments, a group represented by

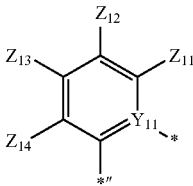

in Formula 3-1 may be a group represented by one of Formulae 3-1-1 to 3-1-16, and (or) a group represented by

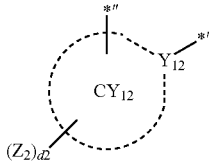

in Formula 3-1 may be a group represented by one of Formulae 3-1(1) to 3-1(16):

3-1-1

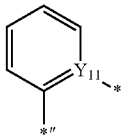

3-1-2

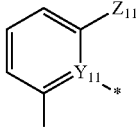

3-1-3

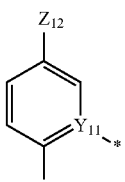

3-1-4

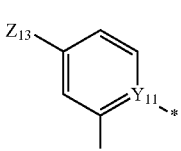

3-1-5

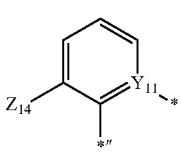

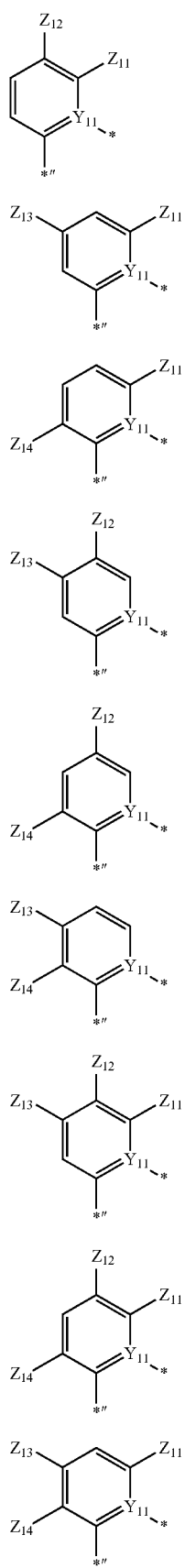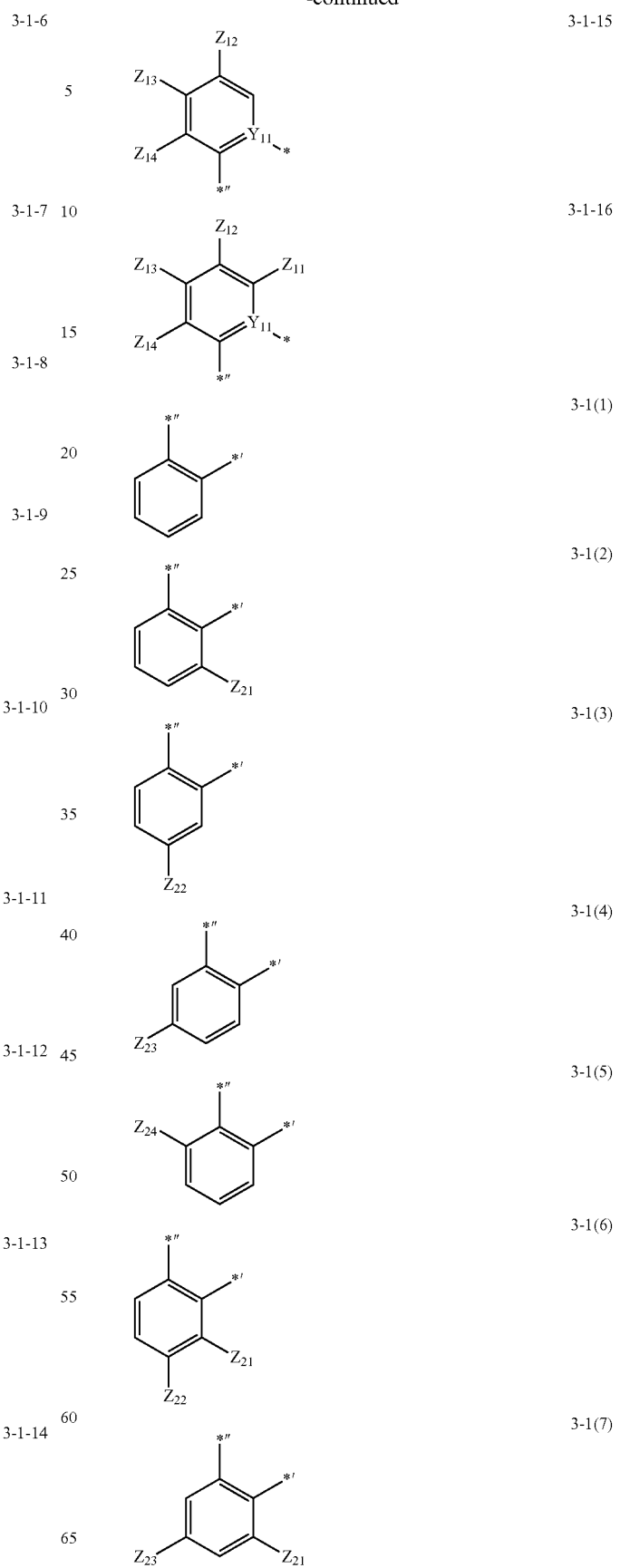

3-1(8) 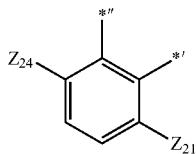

3-1(9) 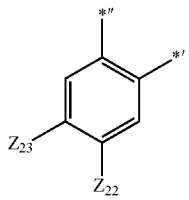

3-1(10) 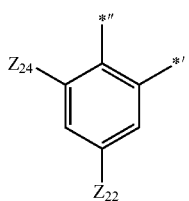

3-1(11) 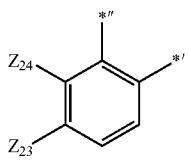

3-1(12) 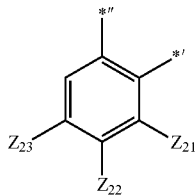

3-1(13) 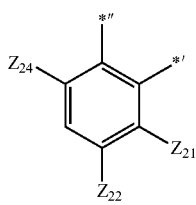

3-1(14) 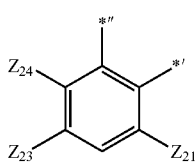

3-1(15) 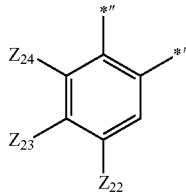

3-1(16) 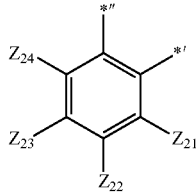

In Formulae 3-1-1 to 3-1-16 and 3-1(1) to 3-1(16), $Z_{11}$ to $Z_{14}$ are the same as described in the present specification, $Z_{21}$ to $Z_{24}$ are the same as described in connection with $Z_{11}$, wherein $Z_{11}$ to $Z_{14}$ and $Z_{21}$ to $Z_{24}$ are not hydrogen, and *' each indicate a binding site to M in Formula 1, and

*" indicates a binding site to a neighboring atom.

The organometallic compound of Formula 1 does not include (i.e., excludes) a compound in which n2 in Formula 1 is 0, $X_1$ in Formula 3 is $C(R_{31})(R_{32})$, and $X_2$ in Formula 3 is $C(R_{33})(R_{34})$.

In Formula 1, two or more of a plurality of groups $R_1$ may optionally be linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$; and two or more of a plurality of groups $R_2$ may optionally be linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

$R_{10a}$ is the same as described in connection with $R_2$.

and *' in Formula 2 each indicate a binding site to M in Formula 1.

and *' in Formula 3 each indicate a binding site to two of $X_{11}$ to $X_{14}$ in Formula 2.

For example, the organometallic compound represented by Formula 1 may be one of Compounds 1 to 289:

1

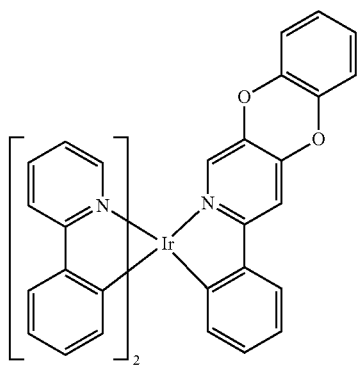

2
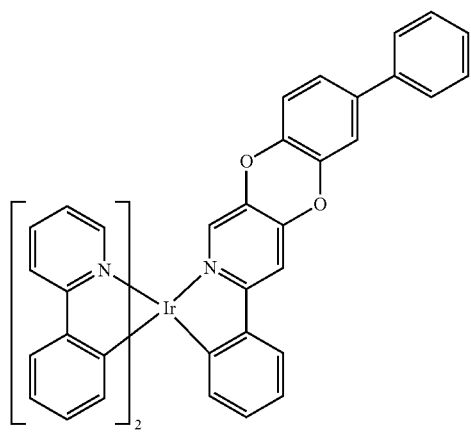
3
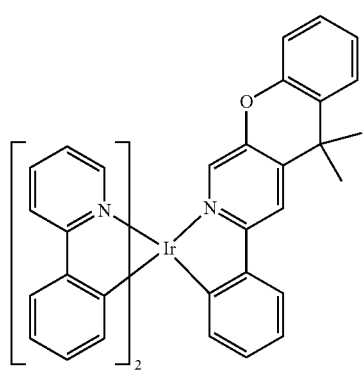
4
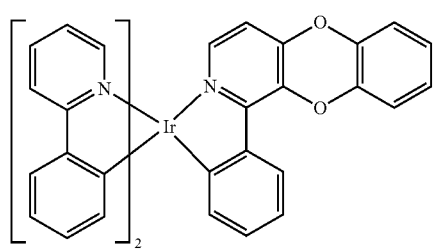
5
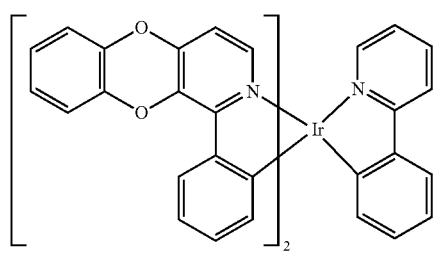
6
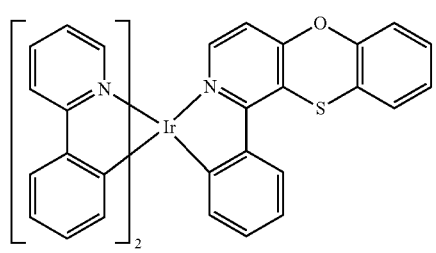
7
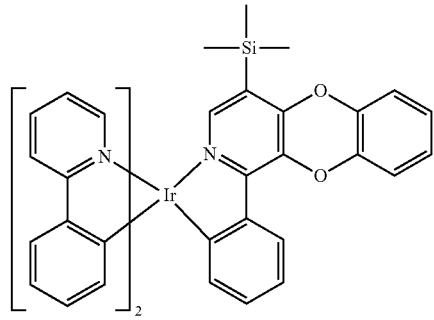
8
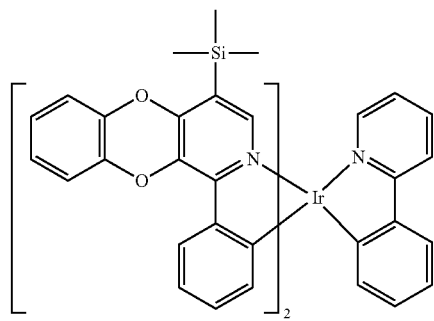
9
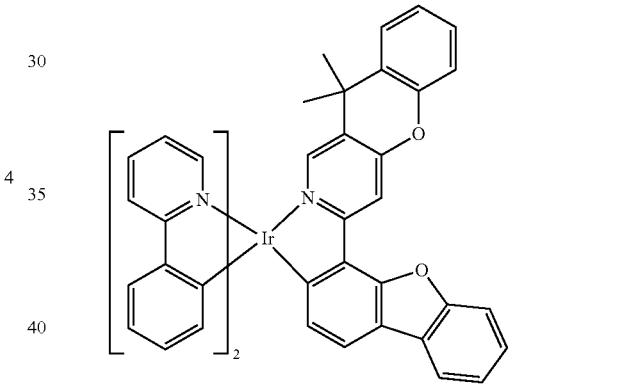
Compounds 10 to 289 are represented by Formula 1, wherein M is Ir, $L_2$ is a phenyl-pyridine ligand, and each of $L_1$, n1, and n2 are as defined in Tables 1 to 8 below. In Tables 1 to 8, Ph is a phenyl group, Me is a methyl group, TMS is a tri(methyl)silyl group, and CY2-1(1) and CY2-1(2) have the following formulae:
CY2-1(1)
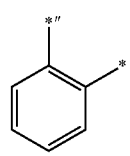
CY2-1(2)
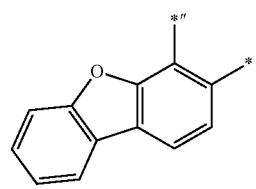

In Formulae CY2-1(1) and CY2-1(2), * indicates a binding site to M in Formula 1 and *″ indicates a binding site to a neighboring atom.

TABLE 1

$L_1$
Formula 2-1(1)

| No. | $Y_1$ | $X_1$ | $X_2$ | $R_1$ | $R_{13}, R_{14}$ | $(R_2)_{a2}$ | n1 | n2 |
|---|---|---|---|---|---|---|---|---|
| 10 | N | O | O | H | H | CY2-1(1) | 1 | 2 |
| 11 | N | O | S | H | H | CY2-1(1) | 1 | 2 |
| 12 | N | O | Se | H | H | CY2-1(1) | 1 | 2 |
| 13 | N | O | N(Ph) | H | H | CY2-1(1) | 1 | 2 |
| 14 | N | O | C(Me)$_2$ | H | H | CY2-1(1) | 1 | 2 |
| 15 | N | O | Si(Me)$_2$ | H | H | CY2-1(1) | 1 | 2 |
| 16 | N | S | O | H | H | CY2-1(1) | 1 | 2 |
| 17 | N | S | S | H | H | CY2-1(1) | 1 | 2 |
| 18 | N | S | Se | H | H | CY2-1(1) | 1 | 2 |
| 19 | N | S | N(Ph) | H | H | CY2-1(1) | 1 | 2 |
| 20 | N | S | C(Me)$_2$ | H | H | CY2-1(1) | 1 | 2 |
| 21 | N | S | Si(Me)$_2$ | H | H | CY2-1(1) | 1 | 2 |
| 22 | N | C(Me)$_2$ | O | H | H | CY2-1(1) | 1 | 2 |
| 23 | N | C(Me)$_2$ | S | H | H | CY2-1(1) | 1 | 2 |
| 24 | N | C(Me)$_2$ | Se | H | H | CY2-1(1) | 1 | 2 |
| 25 | N | C(Me)$_2$ | N(Ph) | H | H | CY2-1(1) | 1 | 2 |
| 26 | N | C(Me)$_2$ | C(Me)$_2$ | H | H | CY2-1(1) | 1 | 2 |
| 27 | N | C(Me)$_2$ | Si(Me)$_2$ | H | H | CY2-1(1) | 1 | 2 |
| 28 | N | O | O | H | H | CY2-1(2) | 1 | 2 |
| 29 | N | O | S | H | H | CY2-1(2) | 1 | 2 |
| 30 | N | O | Se | H | H | CY2-1(2) | 1 | 2 |
| 31 | N | O | N(Ph) | H | H | CY2-1(2) | 1 | 2 |
| 32 | N | O | C(Me)$_2$ | H | H | CY2-1(2) | 1 | 2 |
| 33 | N | O | Si(Me)$_2$ | H | H | CY2-1(2) | 1 | 2 |
| 34 | N | S | O | H | H | CY2-1(2) | 1 | 2 |
| 35 | N | S | S | H | H | CY2-1(2) | 1 | 2 |
| 36 | N | S | Se | H | H | CY2-1(2) | 1 | 2 |
| 37 | N | S | N(Ph) | H | H | CY2-1(2) | 1 | 2 |
| 38 | N | S | C(Me)$_2$ | H | H | CY2-1(2) | 1 | 2 |
| 39 | N | S | Si(Me)$_2$ | H | H | CY2-1(2) | 1 | 2 |
| 40 | N | C(Me)$_2$ | O | H | H | CY2-1(2) | 1 | 2 |
| 41 | N | C(Me)$_2$ | S | H | H | CY2-1(2) | 1 | 2 |
| 42 | N | C(Me)$_2$ | Se | H | H | CY2-1(2) | 1 | 2 |
| 43 | N | C(Me)$_2$ | N(Ph) | H | H | CY2-1(2) | 1 | 2 |
| 44 | N | C(Me)$_2$ | C(Me)$_2$ | H | H | CY2-1(2) | 1 | 2 |
| 45 | N | C(Me)$_2$ | Si(Me)$_2$ | H | H | CY2-1(2) | 1 | 2 |

TABLE 2

$L_1$
Formula 2-1(1)

| No. | $Y_1$ | $X_1$ | $X_2$ | $R_1$ | $R_{13}, R_{14}$ | $(R_2)_{a2}$ | n1 | n2 |
|---|---|---|---|---|---|---|---|---|
| 46 | N | O | O | H | H | CY2-1(1) | 2 | 1 |
| 47 | N | O | S | H | H | CY2-1(1) | 2 | 1 |
| 48 | N | O | Se | H | H | CY2-1(1) | 2 | 1 |
| 49 | N | O | N(Ph) | H | H | CY2-1(1) | 2 | 1 |
| 50 | N | O | C(Me)$_2$ | H | H | CY2-1(1) | 2 | 1 |
| 51 | N | O | Si(Me)$_2$ | H | H | CY2-1(1) | 2 | 1 |
| 52 | N | S | O | H | H | CY2-1(1) | 2 | 1 |
| 53 | N | S | S | H | H | CY2-1(1) | 2 | 1 |
| 54 | N | S | Se | H | H | CY2-1(1) | 2 | 1 |
| 55 | N | S | N(Ph) | H | H | CY2-1(1) | 2 | 1 |
| 56 | N | S | C(Me)$_2$ | H | H | CY2-1(1) | 2 | 1 |
| 57 | N | S | Si(Me)$_2$ | H | H | CY2-1(1) | 2 | 1 |
| 58 | N | C(Me)$_2$ | O | H | H | CY2-1(1) | 2 | 1 |
| 59 | N | C(Me)$_2$ | S | H | H | CY2-1(1) | 2 | 1 |
| 60 | N | C(Me)$_2$ | Se | H | H | CY2-1(1) | 2 | 1 |
| 61 | N | C(Me)$_2$ | N(Ph) | H | H | CY2-1(1) | 2 | 1 |
| 62 | N | C(Me)$_2$ | C(Me)$_2$ | H | H | CY2-1(1) | 2 | 1 |
| 63 | N | C(Me)$_2$ | Si(Me)$_2$ | H | H | CY2-1(1) | 2 | 1 |
| 64 | N | O | O | H | H | CY2-1(2) | 2 | 1 |
| 65 | N | O | S | H | H | CY2-1(2) | 2 | 1 |
| 66 | N | O | Se | H | H | CY2-1(2) | 2 | 1 |
| 67 | N | O | N(Ph) | H | H | CY2-1(2) | 2 | 1 |
| 68 | N | O | C(Me)$_2$ | H | H | CY2-1(2) | 2 | 1 |
| 69 | N | O | Si(Me)$_2$ | H | H | CY2-1(2) | 2 | 1 |
| 70 | N | S | O | H | H | CY2-1(2) | 2 | 1 |
| 71 | N | S | S | H | H | CY2-1(2) | 2 | 1 |
| 72 | N | S | Se | H | H | CY2-1(2) | 2 | 1 |
| 73 | N | S | N(Ph) | H | H | CY2-1(2) | 2 | 1 |
| 74 | N | S | C(Me)$_2$ | H | H | CY2-1(2) | 2 | 1 |
| 75 | N | S | Si(Me)$_2$ | H | H | CY2-1(2) | 2 | 1 |
| 76 | N | C(Me)$_2$ | O | H | H | CY2-1(2) | 2 | 1 |
| 77 | N | C(Me)$_2$ | S | H | H | CY2-1(2) | 2 | 1 |
| 78 | N | C(Me)$_2$ | Se | H | H | CY2-1(2) | 2 | 1 |
| 79 | N | C(Me)$_2$ | N(Ph) | H | H | CY2-1(2) | 2 | 1 |
| 80 | N | C(Me)$_2$ | C(Me)$_2$ | H | H | CY2-1(2) | 2 | 1 |
| 81 | N | C(Me)$_2$ | Si(Me)$_2$ | H | H | CY2-1(2) | 2 | 1 |

TABLE 3

$L_1$
Formula 2-2(1)

| No. | $Y_1$ | $X_1$ | $X_2$ | $R_1$ | $R_{11}, R_{14}$ | $(R_2)_{a2}$ | n1 | n2 |
|---|---|---|---|---|---|---|---|---|
| 1 | N | O | O | H | H | CY2-1(1) | 1 | 2 |
| 82 | N | O | S | H | H | CY2-1(1) | 1 | 2 |
| 83 | N | O | Se | H | H | CY2-1(1) | 1 | 2 |
| 84 | N | O | N(Ph) | H | H | CY2-1(1) | 1 | 2 |
| 3 | N | O | C(Me)$_2$ | H | H | CY2-1(1) | 1 | 2 |
| 85 | N | O | Si(Me)$_2$ | H | H | CY2-1(1) | 1 | 2 |
| 86 | N | S | O | H | H | CY2-1(1) | 1 | 2 |
| 87 | N | S | S | H | H | CY2-1(1) | 1 | 2 |
| 88 | N | S | Se | H | H | CY2-1(1) | 1 | 2 |
| 89 | N | S | N(Ph) | H | H | CY2-1(1) | 1 | 2 |
| 90 | N | S | C(Me)$_2$ | H | H | CY2-1(1) | 1 | 2 |
| 91 | N | S | Si(Me)$_2$ | H | H | CY2-1(1) | 1 | 2 |
| 92 | N | C(Me)$_2$ | O | H | H | CY2-1(1) | 1 | 2 |
| 93 | N | C(Me)$_2$ | S | H | H | CY2-1(1) | 1 | 2 |
| 94 | N | C(Me)$_2$ | Se | H | H | CY2-1(1) | 1 | 2 |
| 95 | N | C(Me)$_2$ | N(Ph) | H | H | CY2-1(1) | 1 | 2 |
| 96 | N | C(Me)$_2$ | C(Me)$_2$ | H | H | CY2-1(1) | 1 | 2 |
| 97 | N | C(Me)$_2$ | Si(Me)$_2$ | H | H | CY2-1(1) | 1 | 2 |
| 98 | N | O | O | H | H | CY2-1(2) | 1 | 2 |
| 99 | N | O | S | H | H | CY2-1(2) | 1 | 2 |
| 100 | N | O | Se | H | H | CY2-1(2) | 1 | 2 |
| 101 | N | O | N(Ph) | H | H | CY2-1(2) | 1 | 2 |
| 102 | N | O | C(Me)$_2$ | H | H | CY2-1(2) | 1 | 2 |
| 103 | N | O | Si(Me)$_2$ | H | H | CY2-1(2) | 1 | 2 |
| 104 | N | S | O | H | H | CY2-1(2) | 1 | 2 |
| 105 | N | S | S | H | H | CY2-1(2) | 1 | 2 |
| 106 | N | S | Se | H | H | CY2-1(2) | 1 | 2 |
| 107 | N | S | N(Ph) | H | H | CY2-1(2) | 1 | 2 |

TABLE 3-continued

| | | L₁ | | | | | |
|---|---|---|---|---|---|---|---|
| | | Formula 2-2(1) | | | | | |
| No. | Y₁ | X₁ | X₂ | R₁ | R₁₁, R₁₄ | (R₂)ₐ₂ | n1 | n2 |
| 108 | N | S | C(Me)₂ | H | H | CY2-1(2) | 1 | 2 |
| 109 | N | S | Si(Me)₂ | H | H | CY2-1(2) | 1 | 2 |
| 9 | N | C(Me)₂ | O | H | H | CY2-1(2) | 1 | 2 |
| 110 | N | C(Me)₂ | S | H | H | CY2-1(2) | 1 | 2 |
| 111 | N | C(Me)₂ | Se | H | H | CY2-1(2) | 1 | 2 |
| 112 | N | C(Me)₂ | N(Ph) | H | H | CY2-1(2) | 1 | 2 |
| 113 | N | C(Me)₂ | C(Me)₂ | H | H | CY2-1(2) | 1 | 2 |
| 114 | N | C(Me)₂ | Si(Me)₂ | H | H | CY2-1(2) | 1 | 2 |

TABLE 4

| | | L₁ | | | | | |
|---|---|---|---|---|---|---|---|
| | | Formula 2-2(1) | | | | | |
| No. | Y₁ | X₁ | X₂ | R₁ | R₁₁, R₁₄ | (R₂)ₐ₂ | n1 | n2 |
| 115 | N | O | O | H | H | CY2-1(1) | 2 | 1 |
| 116 | N | O | S | H | H | CY2-1(1) | 2 | 1 |
| 117 | N | O | Se | H | H | CY2-1(1) | 2 | 1 |
| 118 | N | O | N(Ph) | H | H | CY2-1(1) | 2 | 1 |
| 119 | N | O | C(Me)₂ | H | H | CY2-1(1) | 2 | 1 |
| 120 | N | O | Si(Me)₂ | H | H | CY2-1(1) | 2 | 1 |
| 121 | N | S | O | H | H | CY2-1(1) | 2 | 1 |
| 122 | N | S | S | H | H | CY2-1(1) | 2 | 1 |
| 123 | N | S | Se | H | H | CY2-1(1) | 2 | 1 |
| 124 | N | S | N(Ph) | H | H | CY2-1(1) | 2 | 1 |
| 125 | N | S | C(Me)₂ | H | H | CY2-1(1) | 2 | 1 |
| 126 | N | S | Si(Me)₂ | H | H | CY2-1(1) | 2 | 1 |
| 127 | N | C(Me)₂ | O | H | H | CY2-1(1) | 2 | 1 |
| 128 | N | C(Me)₂ | S | H | H | CY2-1(1) | 2 | 1 |
| 129 | N | C(Me)₂ | Se | H | H | CY2-1(1) | 2 | 1 |
| 130 | N | C(Me)₂ | N(Ph) | H | H | CY2-1(1) | 2 | 1 |
| 131 | N | C(Me)₂ | C(Me)₂ | H | H | CY2-1(1) | 2 | 1 |
| 132 | N | C(Me)₂ | Si(Me)₂ | H | H | CY2-1(1) | 2 | 1 |
| 133 | N | O | O | H | H | CY2-1(2) | 2 | 1 |
| 134 | N | O | S | H | H | CY2-1(2) | 2 | 1 |
| 135 | N | O | Se | H | H | CY2-1(2) | 2 | 1 |
| 136 | N | O | N(Ph) | H | H | CY2-1(2) | 2 | 1 |
| 137 | N | O | C(Me)₂ | H | H | CY2-1(2) | 2 | 1 |
| 138 | N | O | Si(Me)₂ | H | H | CY2-1(2) | 2 | 1 |
| 139 | N | S | O | H | H | CY2-1(2) | 2 | 1 |
| 140 | N | S | S | H | H | CY2-1(2) | 2 | 1 |
| 141 | N | S | Se | H | H | CY2-1(2) | 2 | 1 |
| 142 | N | S | N(Ph) | H | H | CY2-1(2) | 2 | 1 |
| 143 | N | S | C(Me)₂ | H | H | CY2-1(2) | 2 | 1 |
| 144 | N | S | Si(Me)₂ | H | H | CY2-1(2) | 2 | 1 |
| 145 | N | C(Me)₂ | O | H | H | CY2-1(2) | 2 | 1 |
| 146 | N | C(Me)₂ | S | H | H | CY2-1(2) | 2 | 1 |
| 147 | N | C(Me)₂ | Se | H | H | CY2-1(2) | 2 | 1 |
| 148 | N | C(Me)₂ | N(Ph) | H | H | CY2-1(2) | 2 | 1 |
| 149 | N | C(Me)₂ | C(Me)₂ | H | H | CY2-1(2) | 2 | 1 |
| 150 | N | C(Me)₂ | Si(Me)₂ | H | H | CY2-1(2) | 2 | 1 |

TABLE 5

| | | L₁ | | | | | |
|---|---|---|---|---|---|---|---|
| | | Formula 2-3(1) | | | | | |
| No. | Y₁ | X₁ | X₂ | R₁ | R₁₁, R₁₂ | (R₂)ₐ₂ | n1 | n2 |
| 4 | N | O | O | H | H | CY2-1(1) | 1 | 2 |
| 6 | N | O | S | H | H | CY2-1(1) | 1 | 2 |
| 151 | N | O | Se | H | H | CY2-1(1) | 1 | 2 |
| 152 | N | O | N(Ph) | H | H | CY2-1(1) | 1 | 2 |
| 153 | N | O | C(Me)₂ | H | H | CY2-1(1) | 1 | 2 |
| 154 | N | O | Si(Me)₂ | H | H | CY2-1(1) | 1 | 2 |
| 155 | N | S | O | H | H | CY2-1(1) | 1 | 2 |
| 156 | N | S | S | H | H | CY2-1(1) | 1 | 2 |
| 157 | N | S | Se | H | H | CY2-1(1) | 1 | 2 |
| 158 | N | S | N(Ph) | H | H | CY2-1(1) | 1 | 2 |
| 159 | N | S | C(Me)₂ | H | H | CY2-1(1) | 1 | 2 |
| 160 | N | S | Si(Me)₂ | H | H | CY2-1(1) | 1 | 2 |
| 161 | N | C(Me)₂ | O | H | H | CY2-1(1) | 1 | 2 |
| 162 | N | C(Me)₂ | S | H | H | CY2-1(1) | 1 | 2 |
| 163 | N | C(Me)₂ | Se | H | H | CY2-1(1) | 1 | 2 |
| 164 | N | C(Me)₂ | N(Ph) | H | H | CY2-1(1) | 1 | 2 |
| 165 | N | C(Me)₂ | C(Me)₂ | H | H | CY2-1(1) | 1 | 2 |
| 166 | N | C(Me)₂ | Si(Me)₂ | H | H | CY2-1(1) | 1 | 2 |
| 167 | N | O | O | H | H | CY2-1(2) | 1 | 2 |
| 168 | N | O | S | H | H | CY2-1(2) | 1 | 2 |
| 169 | N | O | Se | H | H | CY2-1(2) | 1 | 2 |
| 170 | N | O | N(Ph) | H | H | CY2-1(2) | 1 | 2 |
| 171 | N | O | C(Me)₂ | H | H | CY2-1(2) | 1 | 2 |
| 172 | N | O | Si(Me)₂ | H | H | CY2-1(2) | 1 | 2 |
| 173 | N | S | O | H | H | CY2-1(2) | 1 | 2 |
| 174 | N | S | S | H | H | CY2-1(2) | 1 | 2 |
| 175 | N | S | Se | H | H | CY2-1(2) | 1 | 2 |
| 176 | N | S | N(Ph) | H | H | CY2-1(2) | 1 | 2 |
| 177 | N | S | C(Me)₂ | H | H | CY2-1(2) | 1 | 2 |
| 178 | N | S | Si(Me)₂ | H | H | CY2-1(2) | 1 | 2 |
| 179 | N | C(Me)₂ | O | H | H | CY2-1(2) | 1 | 2 |
| 180 | N | C(Me)₂ | S | H | H | CY2-1(2) | 1 | 2 |
| 181 | N | C(Me)₂ | Se | H | H | CY2-1(2) | 1 | 2 |
| 182 | N | C(Me)₂ | N(Ph) | H | H | CY2-1(2) | 1 | 2 |
| 183 | N | C(Me)₂ | C(Me)₂ | H | H | CY2-1(2) | 1 | 2 |
| 184 | N | C(Me)₂ | Si(Me)₂ | H | H | CY2-1(2) | 1 | 2 |

TABLE 6

| | | L₁ | | | | | |
|---|---|---|---|---|---|---|---|
| | | Formula 2-3(1) | | | | | |
| No. | Y₁ | X₁ | X₂ | R₁ | R₁₁, R₁₂ | (R₂)ₐ₂ | n1 | n2 |
| 5 | N | O | O | H | H | CY2-1(1) | 2 | 1 |
| 185 | N | O | S | H | H | CY2-1(1) | 2 | 1 |
| 186 | N | O | Se | H | H | CY2-1(1) | 2 | 1 |
| 187 | N | O | N(Ph) | H | H | CY2-1(1) | 2 | 1 |
| 188 | N | O | C(Me)₂ | H | H | CY2-1(1) | 2 | 1 |
| 189 | N | O | Si(Me)₂ | H | H | CY2-1(1) | 2 | 1 |
| 190 | N | S | O | H | H | CY2-1(1) | 2 | 1 |
| 191 | N | S | S | H | H | CY2-1(1) | 2 | 1 |
| 192 | N | S | Se | H | H | CY2-1(1) | 2 | 1 |
| 193 | N | S | N(Ph) | H | H | CY2-1(1) | 2 | 1 |
| 194 | N | S | C(Me)₂ | H | H | CY2-1(1) | 2 | 1 |
| 195 | N | S | Si(Me)₂ | H | H | CY2-1(1) | 2 | 1 |
| 196 | N | C(Me)₂ | O | H | H | CY2-1(1) | 2 | 1 |
| 197 | N | C(Me)₂ | S | H | H | CY2-1(1) | 2 | 1 |
| 198 | N | C(Me)₂ | Se | H | H | CY2-1(1) | 2 | 1 |
| 199 | N | C(Me)₂ | N(Ph) | H | H | CY2-1(1) | 2 | 1 |
| 200 | N | C(Me)₂ | C(Me)₂ | H | H | CY2-1(1) | 2 | 1 |
| 201 | N | C(Me)₂ | Si(Me)₂ | H | H | CY2-1(1) | 2 | 1 |

TABLE 6-continued

L₁  
Formula 2-3(1)

| No. | $Y_1$ | $X_1$ | $X_2$ | $R_1$ | $R_{11}, R_{12}$ | $(R_2)_{a2}$ | n1 | n2 |
|---|---|---|---|---|---|---|---|---|
| 202 | N | O | O | H | H | CY2-1(2) | 2 | 1 |
| 203 | N | O | S | H | H | CY2-1(2) | 2 | 1 |
| 204 | N | O | Se | H | H | CY2-1(2) | 2 | 1 |
| 205 | N | C | N(Ph) | H | H | CY2-1(2) | 2 | 1 |
| 206 | N | O | C(Me)₂ | H | H | CY2-1(2) | 2 | 1 |
| 207 | N | O | Si(Me)₂ | H | H | CY2-1(2) | 2 | 1 |
| 208 | N | S | O | H | H | CY2-1(2) | 2 | 1 |
| 209 | N | S | S | H | H | CY2-1(2) | 2 | 1 |
| 210 | N | S | Se | H | H | CY2-1(2) | 2 | 1 |
| 211 | N | S | N(Ph) | H | H | CY2-1(2) | 2 | 1 |
| 212 | N | S | C(Me)₂ | H | H | CY2-1(2) | 2 | 1 |
| 213 | N | S | Si(Me)₂ | H | H | CY2-1(2) | 2 | 1 |
| 214 | N | C(Me)₂ | O | H | H | CY2-1(2) | 2 | 1 |
| 215 | N | C(Me)₂ | S | H | H | CY2-1(2) | 2 | 1 |
| 216 | N | C(Me)₂ | Se | H | H | CY2-1(2) | 2 | 1 |
| 217 | N | C(Me)₂ | N(Ph) | H | H | CY2-1(2) | 2 | 1 |
| 218 | N | C(Me)₂ | C(Me)₂ | H | H | CY2-1(2) | 2 | 1 |
| 219 | N | C(Me)₂ | Si(Me)₂ | H | H | CY2-1(2) | 2 | 1 |

TABLE 7

L1  
Formula 2-3(1)

| No. | $Y_1$ | $X_1$ | $X_2$ | $R_1$ | $R_1, R_{11}$ | $(R_2)_{a2}$ | n1 | n2 |
|---|---|---|---|---|---|---|---|---|
| 7 | N | O | O | TMS | H | CY2-1(1) | 1 | 2 |
| 220 | N | O | S | TMS | H | CY2-1(1) | 1 | 2 |
| 221 | N | O | Se | TMS | H | CY2-1(1) | 1 | 2 |
| 222 | N | O | N(Ph) | TMS | H | CY2-1(1) | 1 | 2 |
| 223 | N | O | C(Me)₂ | TMS | H | CY2-1(1) | 1 | 2 |
| 224 | N | O | Si(Me)₂ | TMS | H | CY2-1(1) | 1 | 2 |
| 225 | N | S | O | TMS | H | CY2-1(1) | 1 | 2 |
| 226 | N | S | S | TMS | H | CY2-1(1) | 1 | 2 |
| 227 | N | S | Se | TMS | H | CY2-1(1) | 1 | 2 |
| 228 | N | S | N(Ph) | TMS | H | CY2-1(1) | 1 | 2 |
| 229 | N | S | C(Me)₂ | TMS | H | CY2-1(1) | 1 | 2 |
| 230 | N | S | Si(Me)₂ | TMS | H | CY2-1(1) | 1 | 2 |
| 231 | N | C(Me)₂ | O | TMS | H | CY2-1(1) | 1 | 2 |
| 232 | N | C(Me)₂ | S | TMS | H | CY2-1(1) | 1 | 2 |
| 233 | N | C(Me)₂ | Se | TMS | H | CY2-1(1) | 1 | 2 |
| 234 | N | C(Me)₂ | N(Ph) | TMS | H | CY2-1(1) | 1 | 2 |
| 235 | N | C(Me)₂ | C(Me)₂ | TMS | H | CY2-1(1) | 1 | 2 |
| 236 | N | C(Me)₂ | Si(Me)₂ | TMS | H | CY2-1(1) | 1 | 2 |
| 237 | N | O | O | TMS | H | CY2-1(2) | 1 | 2 |
| 238 | N | O | S | TMS | H | CY2-1(2) | 1 | 2 |
| 239 | N | O | Se | TMS | H | CY2-1(2) | 1 | 2 |
| 240 | N | O | N(Ph) | TMS | H | CY2-1(2) | 1 | 2 |
| 241 | N | O | C(Me)₂ | TMS | H | CY2-1(2) | 1 | 2 |
| 242 | N | O | Si(Me)₂ | TMS | H | CY2-1(2) | 1 | 2 |
| 243 | N | S | O | TMS | H | CY2-1(2) | 1 | 2 |
| 244 | N | S | S | TMS | H | CY2-1(2) | 1 | 2 |
| 245 | N | S | Se | TMS | H | CY2-1(2) | 1 | 2 |
| 246 | N | S | N(Ph) | TMS | H | CY2-1(2) | 1 | 2 |
| 247 | N | S | C(Me)₂ | TMS | H | CY2-1(2) | 1 | 2 |
| 248 | N | S | Si(Me)₂ | TMS | H | CY2-1(2) | 1 | 2 |
| 249 | N | C(Me)₂ | O | TMS | H | CY2-1(2) | 1 | 2 |
| 250 | N | C(Me)₂ | S | TMS | H | CY2-1(2) | 1 | 2 |
| 251 | N | C(Me)₂ | Se | TMS | H | CY2-1(2) | 1 | 2 |

TABLE 7-continued

L1  
Formula 2-3(1)

| No. | $Y_1$ | $X_1$ | $X_2$ | $R_1$ | $R_1, R_{11}$ | $(R_2)_{a2}$ | n1 | n2 |
|---|---|---|---|---|---|---|---|---|
| 252 | N | C(Me)₂ | N(Ph) | TMS | H | CY2-1(2) | 1 | 2 |
| 253 | N | C(Me)₂ | C(Me)₂ | TMS | H | CY2-1(2) | 1 | 2 |
| 254 | N | C(Me)₂ | Si(Me)₂ | TMS | H | CY2-1(2) | 1 | 2 |

TABLE 8

L1  
Formula 2-3(1)

| No. | $Y_1$ | $X_1$ | $X_2$ | $R_1$ | $R_1, R_{11}$ | $(R_2)_{a2}$ | n1 | n2 |
|---|---|---|---|---|---|---|---|---|
| 8 | N | O | O | TMS | H | CY2-1(1) | 2 | 1 |
| 255 | N | O | S | TMS | H | CY2-1(1) | 2 | 1 |
| 256 | N | O | Se | TMS | H | CY2-1(1) | 2 | 1 |
| 257 | N | O | N(Ph) | TMS | H | CY2-1(1) | 2 | 1 |
| 258 | N | O | C(Me)₂ | TMS | H | CY2-1(1) | 2 | 1 |
| 259 | N | O | Si(Me)₂ | TMS | H | CY2-1(1) | 2 | 1 |
| 260 | N | S | O | TMS | H | CY2-1(1) | 2 | 1 |
| 261 | N | S | S | TMS | H | CY2-1(1) | 2 | 1 |
| 262 | N | S | Se | TMS | H | CY2-1(1) | 2 | 1 |
| 263 | N | S | N(Ph) | TMS | H | CY2-1(1) | 2 | 1 |
| 264 | N | S | C(Me)₂ | TMS | H | CY2-1(1) | 2 | 1 |
| 265 | N | S | Si(Me)₂ | TMS | H | CY2-1(1) | 2 | 1 |
| 266 | N | C(Me)₂ | O | TMS | H | CY2-1(1) | 2 | 1 |
| 267 | N | C(Me)₂ | S | TMS | H | CY2-1(1) | 2 | 1 |
| 268 | N | C(Me)₂ | Se | TMS | H | CY2-1(1) | 2 | 1 |
| 269 | N | C(Me)₂ | N(Ph) | TMS | H | CY2-1(1) | 2 | 1 |
| 270 | N | C(Me)₂ | C(Me)₂ | TMS | H | CY2-1(1) | 2 | 1 |
| 271 | N | C(Me)₂ | Si(Me)₂ | TMS | H | CY2-1(1) | 2 | 1 |
| 272 | N | O | O | TMS | H | CY2-1(2) | 2 | 1 |
| 273 | N | O | S | TMS | H | CY2-1(2) | 2 | 1 |
| 274 | N | O | Se | TMS | H | CY2-1(2) | 2 | 1 |
| 275 | N | O | N(Ph) | TMS | H | CY2-1(2) | 2 | 1 |
| 276 | N | O | C(Me)₂ | TMS | H | CY2-1(2) | 2 | 1 |
| 277 | N | O | Si(Me)₂ | TMS | H | CY2-1(2) | 2 | 1 |
| 278 | N | S | O | TMS | H | CY2-1(2) | 2 | 1 |
| 279 | N | S | S | TMS | H | CY2-1(2) | 2 | 1 |
| 280 | N | S | Se | TMS | H | CY2-1(2) | 2 | 1 |
| 281 | N | S | N(Ph) | TMS | H | CY2-1(2) | 2 | 1 |
| 282 | N | S | C(Me)₂ | TMS | H | CY2-1(2) | 2 | 1 |
| 283 | N | S | Si(Me)₂ | TMS | H | CY2-1(2) | 2 | 1 |
| 284 | N | C(Me)₂ | O | TMS | H | CY2-1(2) | 2 | 1 |
| 285 | N | C(Me)₂ | S | TMS | H | CY2-1(2) | 2 | 1 |
| 286 | N | C(Me)₂ | Se | TMS | H | CY2-1(2) | 2 | 1 |
| 287 | N | C(Me)₂ | N(Ph) | TMS | H | CY2-1(2) | 2 | 1 |
| 288 | N | C(Me)₂ | C(Me)₂ | TMS | H | CY2-1(2) | 2 | 1 |
| 289 | N | C(Me)₂ | Si(Me)₂ | TMS | H | CY2-1(2) | 2 | 1 |

In the organometallic compound represented by Formula 1, $L_1$ is the ligand represented by Formula 2, and n1 indicating the number of ligands $L_1$ is 1, 2, or 3. That is, the organometallic compound necessarily includes at least one ligand represented by Formula 2, as a ligand linked to metal M. An electronic device, for example, an organic light-emitting device, including the organometallic compound represented by Formula 1, may have improved driving voltage and improved external quantum efficiency.

With respect to some organometallic compounds of organometallic compounds represented by Formula 1, highest occupied molecular orbital (HOMO) energy levels and lowest unoccupied molecular orbital (LUMO) energy levels, and $T_1$ energy levels were evaluated using a Gaussian 09 program with molecular structure optimization by density function theory (DFT) based on B3LYP, and results thereof are shown in Table 9.

TABLE 9

| Compound No. | HOMO (eV) | LUMO (eV) | T1 (eV) |
|---|---|---|---|
| 1 | −4.840 | −1.238 | 2.573 |
| 2 | −4.841 | −1.304 | 2.556 |
| 3 | −4.809 | −1.166 | 2.632 |
| 4 | −4.832 | −1.208 | 2.616 |
| 5 | −4.806 | −1.200 | 2.609 |
| 6 | −4.865 | −1.228 | 2.592 |
| 7 | −4.812 | −1.246 | 2.561 |
| 8 | −4.765 | −1.236 | 2.553 |
| 9 | −4.823 | −1.247 | 2.583 |

From Table 9, it is confirmed that the organometallic compounds represented by Formula 1 have electrical characteristics that are suitable for use as a material of an electronic device, for example, a dopant for an emission layer of an organic light-emitting device.

Synthesis methods of the organometallic compound represented by Formula 1 may be understood by one of ordinary skill in the art by referring to Synthesis Examples provided below.

Accordingly, the organometallic compound represented by Formula 1 is suitable for use as a material of an organic light-emitting device, for example, a dopant for an emission layer in an organic layer of an organic light-emitting device. Thus, another aspect provides an organic light-emitting device including: a first electrode; a second electrode; and an organic layer located between the first electrode and the second electrode and including an emission layer, and the organic layer includes at least one organometallic compound represented by Formula 1.

The organic light-emitting device may have, due to the inclusion of an organic layer including the organometallic compound represented by Formula 1, a low driving voltage, high luminescence efficiency, high power efficiency, high external quantum efficiency, a long lifespan, a low roll-off ratio, and excellent color purity.

The organometallic compound represented by Formula 1 may be disposed between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit red light or green light.

For example, the organometallic compound represented by Formula 1 may emit green light having a maximum emission wavelength in a range of about 500 nanometers (nm) to about 550 nm, for example, about 500 nm to about 540 nm.

The expression "(an organic layer) includes at least one organometallic compound" used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 both may exist in an emission layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

For example, in the organic light-emitting device, the first electrode is an anode, the second electrode is a cathode, the organic layer may further include a hole transport region disposed between the first electrode and the emission layer and an electron transport region disposed between the emission layer and the second electrode, the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" used herein refers to a single layer and/or a plurality of layers between the first electrode and the second electrode of the organic light-emitting device. The "organic layer" may include, in addition to an organic compound, an organometallic complex including metal.

The FIGURE is a schematic cross-sectional view of an organic light-emitting device 10 according to an embodiment. Hereinafter, a structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under (i.e., beneath) the first electrode 11 or above the second electrode 19. For use as the substrate, any substrate that is used in organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include materials with a high work function to facilitate hole injection. The first electrode 11 may be a reflective electrode, a semi-transmissive electrode, or a transmissive electrode. The material for forming the first electrode 11 may include indium tin oxide (ITO), indium zinc oxide (IZO), tin oxide ($SnO_2$), zinc oxide (ZnO), or a combination thereof. In one or more embodiments, the material for forming the first electrode 11 may include a metal or a metal alloy, such as magnesium (Mg), aluminum (Al), aluminum-lithium (Al—Li), calcium (Ca), magnesium-indium (Mg—In), magnesium-silver (Mg—Ag), or a combination thereof.

The first electrode 11 may have a single-layered structure or a multi-layered structure including two or more layers. For example, the first electrode 11 may have a three-layered structure of ITO/Ag/ITO.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include a hole injection layer, a hole transport layer, or a combination thereof. In one or more embodiments, the hole transport region may have a hole injection layer/hole transport layer structure or a hole injection layer/hole transport layer/electron blocking layer structure, wherein, for each structure, each layer is sequentially stacked in this stated order from the first electrode 11 towards the second electrode 19.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstrom per second (Å/sec) to about 100 Å/sec.

When the hole injection layer is formed using spin coating, coating conditions may vary according to the material used to form the hole injection layer, and the structure and thermal characteristics of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C.

Conditions for forming the hole transport layer and the electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or a combination thereof:

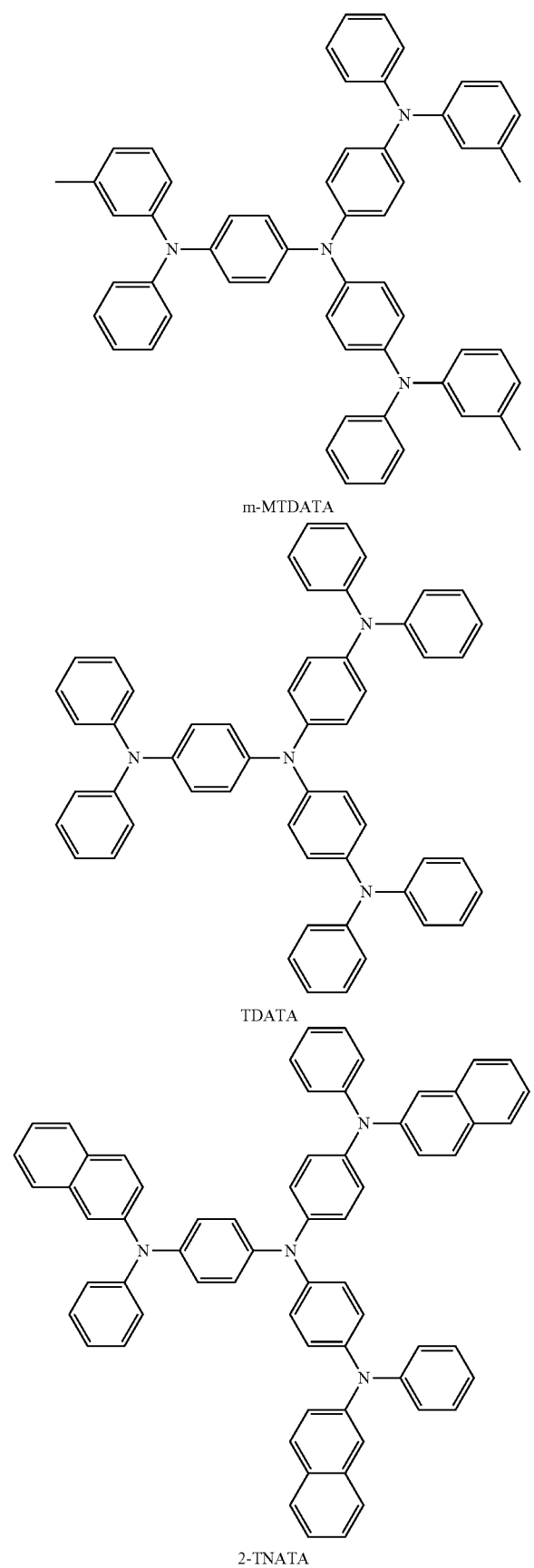

m-MTDATA

TDATA

2-TNATA

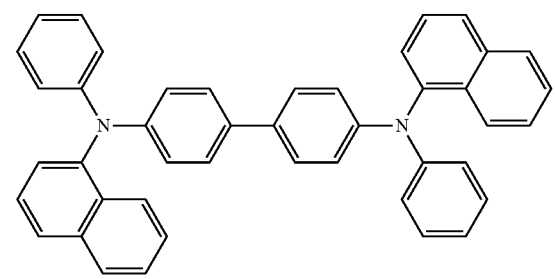
NPB
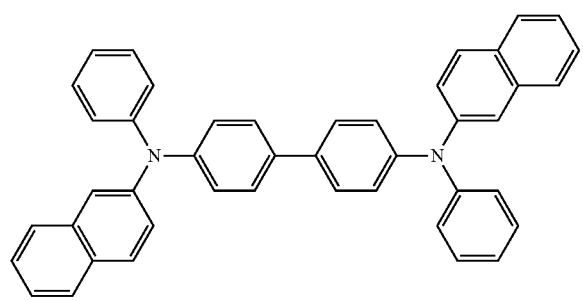
β-NPB
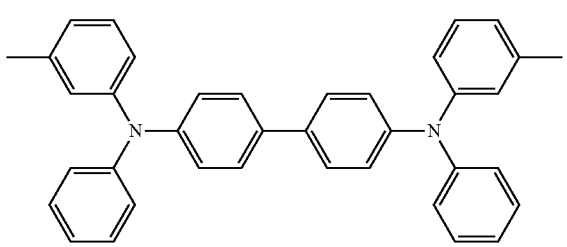
TPD
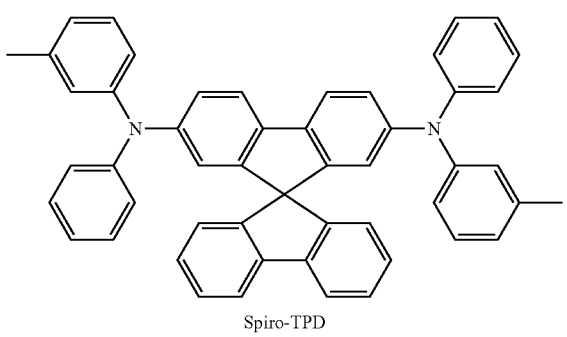
Spiro-TPD
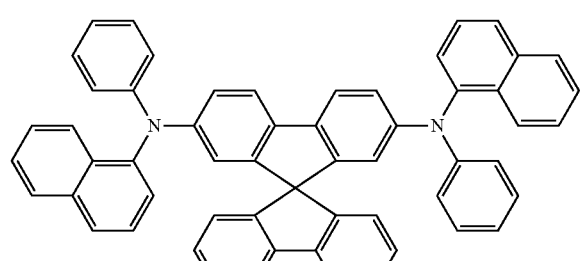
Spiro-NPB
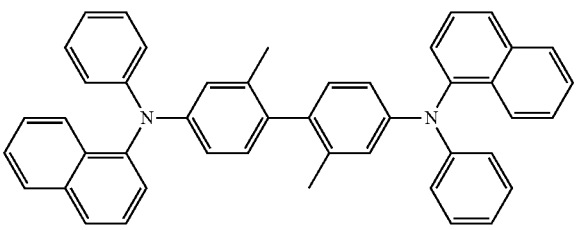
methylated NPB
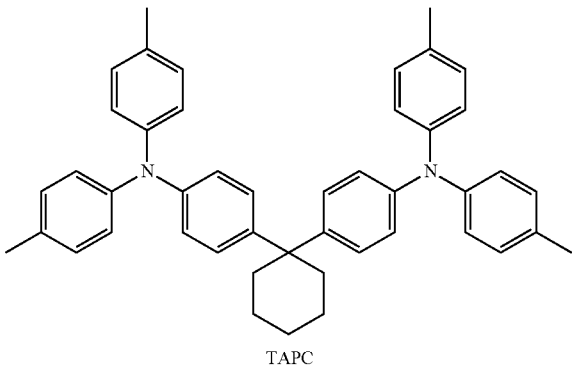
TAPC
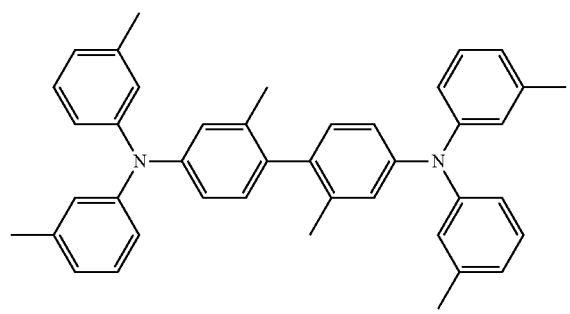
HMTPD
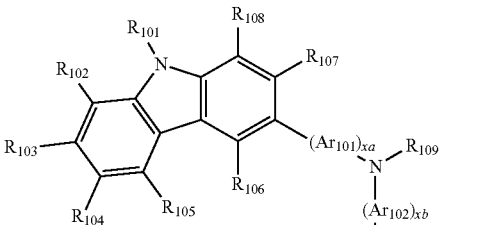
Formula 201

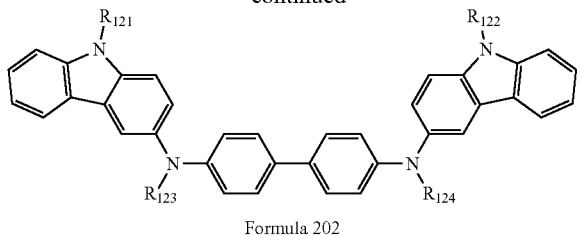

Formula 202

Ar$_{101}$ and Ar$_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_1$-$C_{60}$ aryl group, a $C_7$-$C_{60}$ alkylaryl group, a $C_1$-$C_{10}$ aryloxy group, a $C_1$-$C_{10}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group.

xa and xb in Formula 201 may each independently bean integer from 0 to 5 or 0, 1, or 2. For example, xa may be 1, and xb may be 0.

In Formulae 201 and 202, R$_{101}$ to R$_{108}$, R$_{111}$ to R$_{119}$, and R$_{121}$ to R$_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, etc.), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof; or a phenyl group, a naphthyl group, an anthracenyl group, a fluorenyl group, or a pyrenyl group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group.

In Formula 201, R$_{109}$ may be a phenyl group, a naphthyl group, an anthracenyl group, or a pyridinyl group, each unsubstituted or substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

In an embodiment, the compound represented by Formula 201 may be represented by Formula 201A:

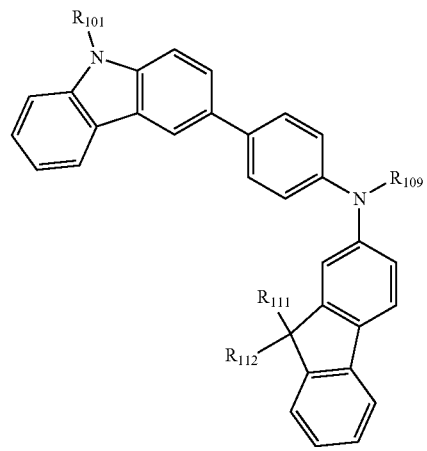

Formula 201A

In Formula 201A, R$_{101}$, R$_{111}$, R$_{112}$, and R$_{109}$ may be understood by referring to the description provided herein.

For example, the hole transport region may include at least one of Compounds HT1 to HT20:

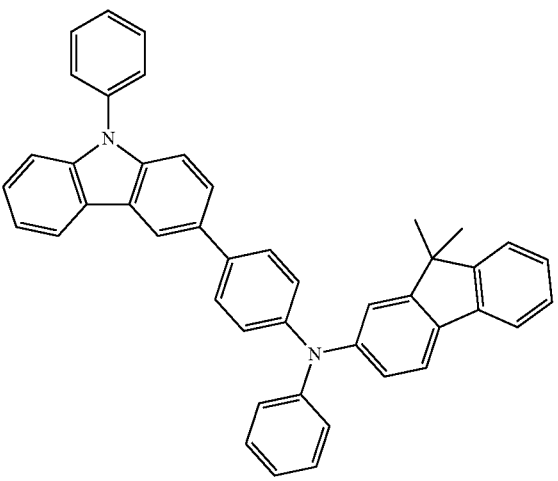

HT1

HT2
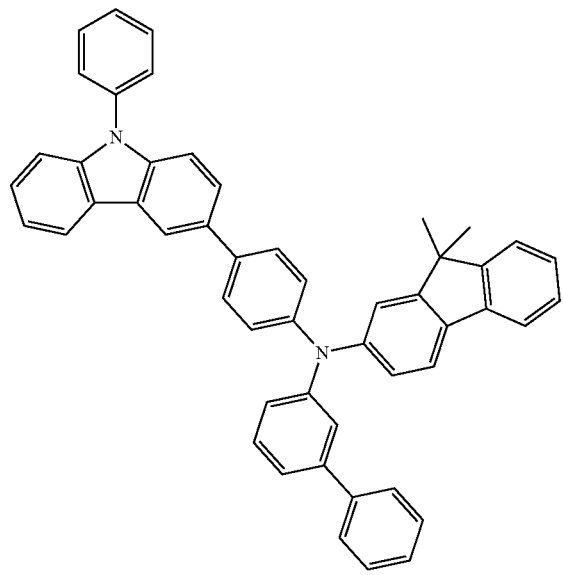
HT3
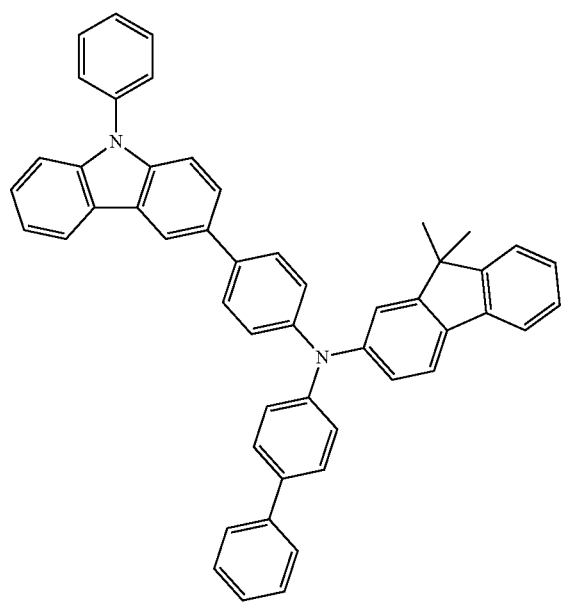
HT4
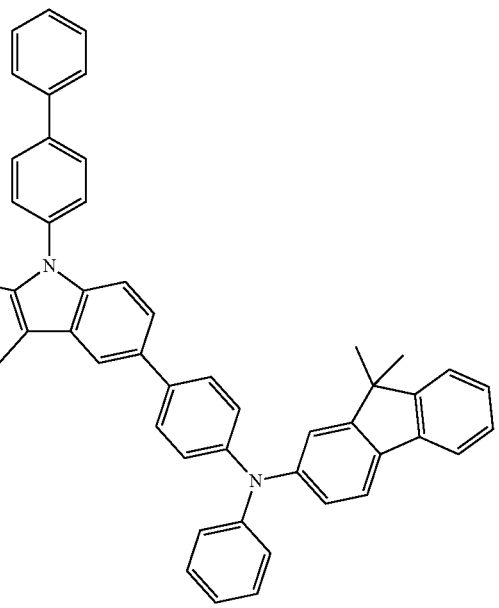
HT5
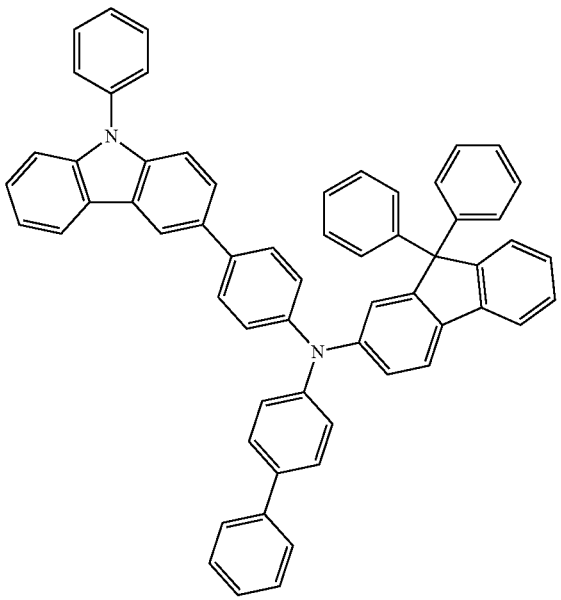

HT6
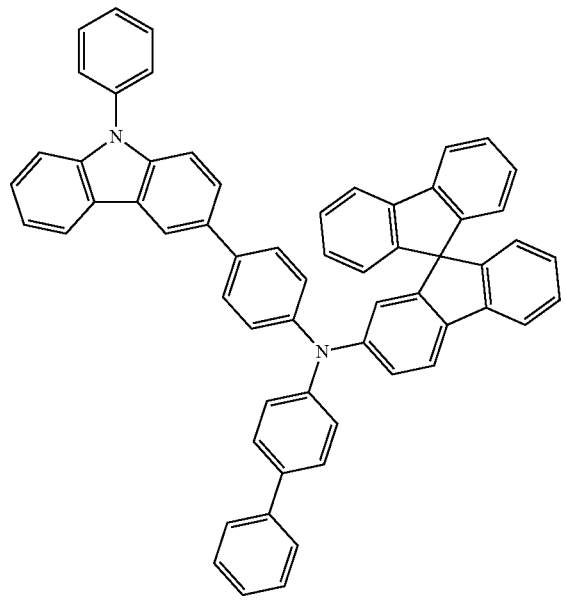
HT7
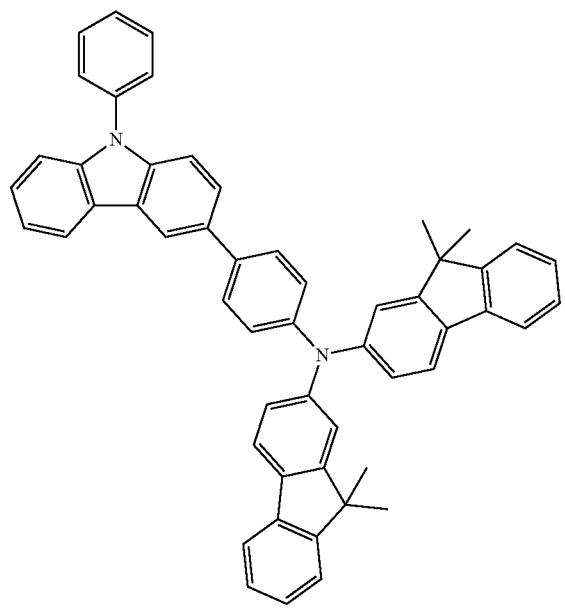
HT8
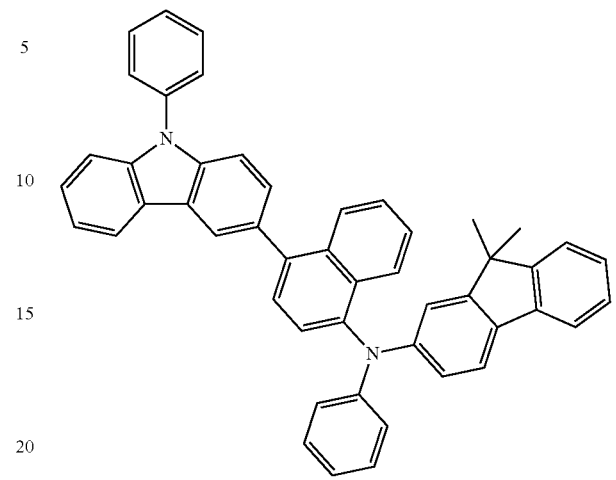
HT9
HT10
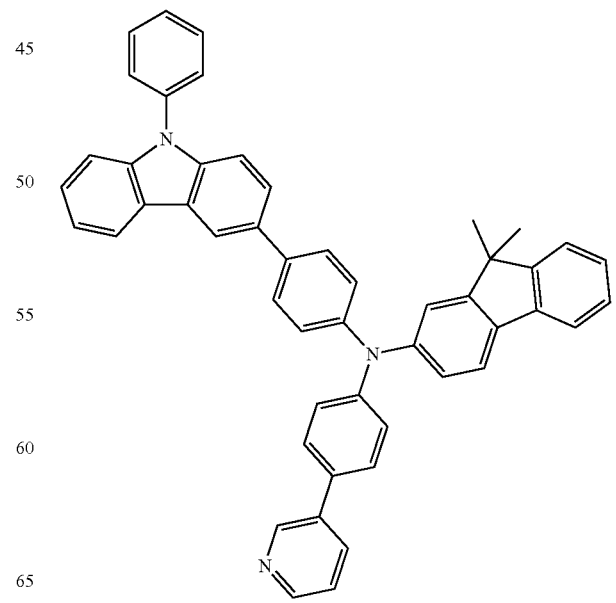

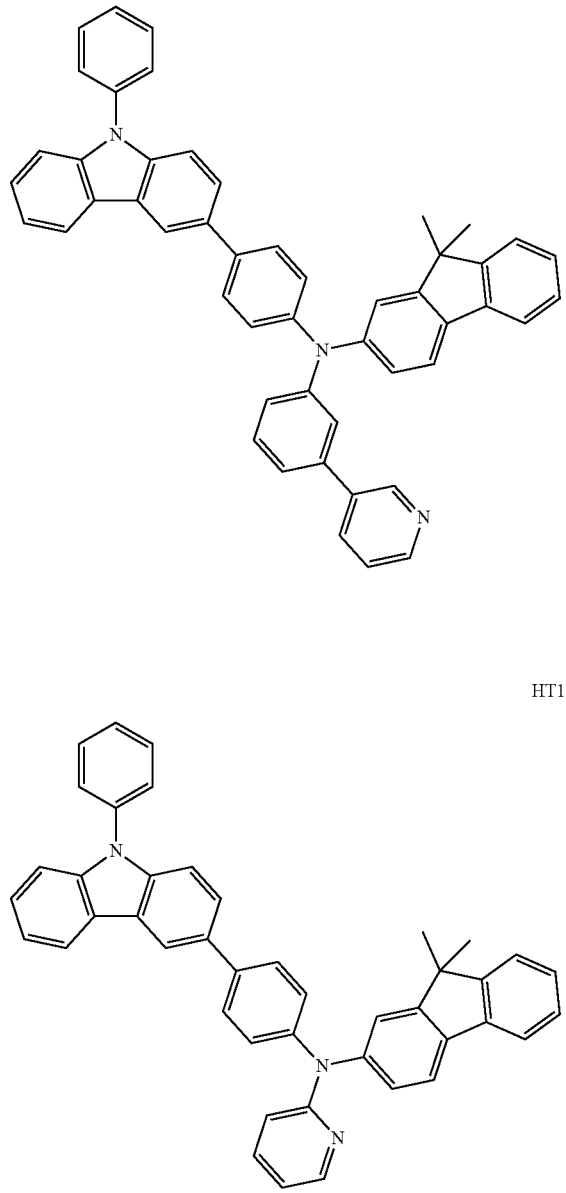
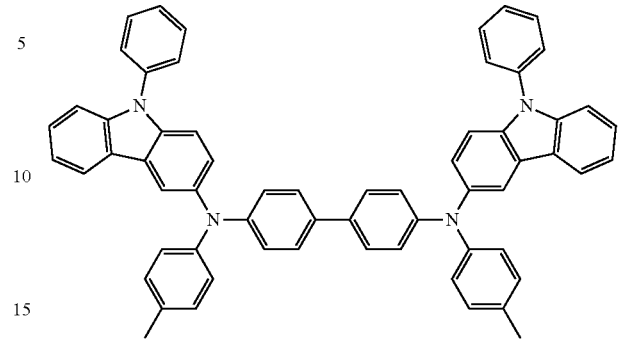
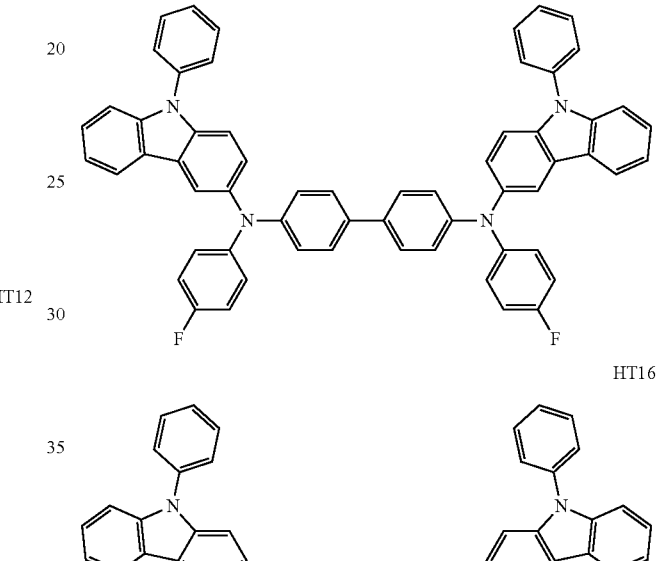
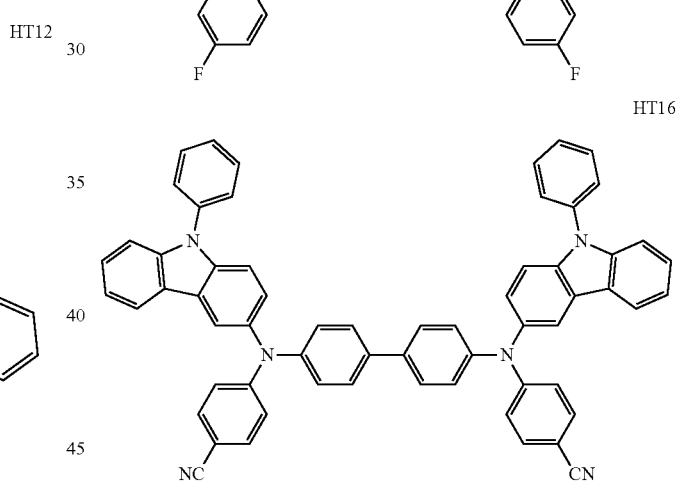
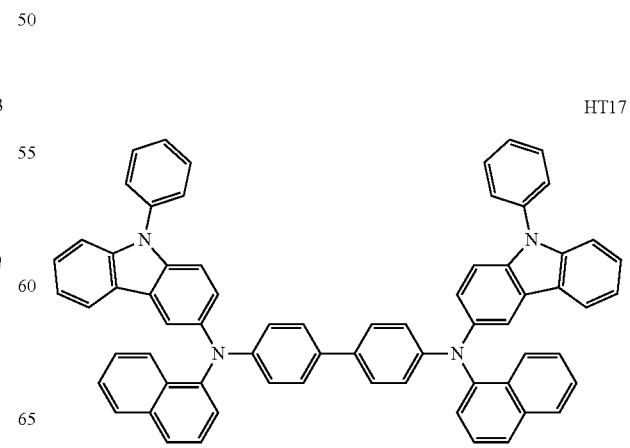

-continued

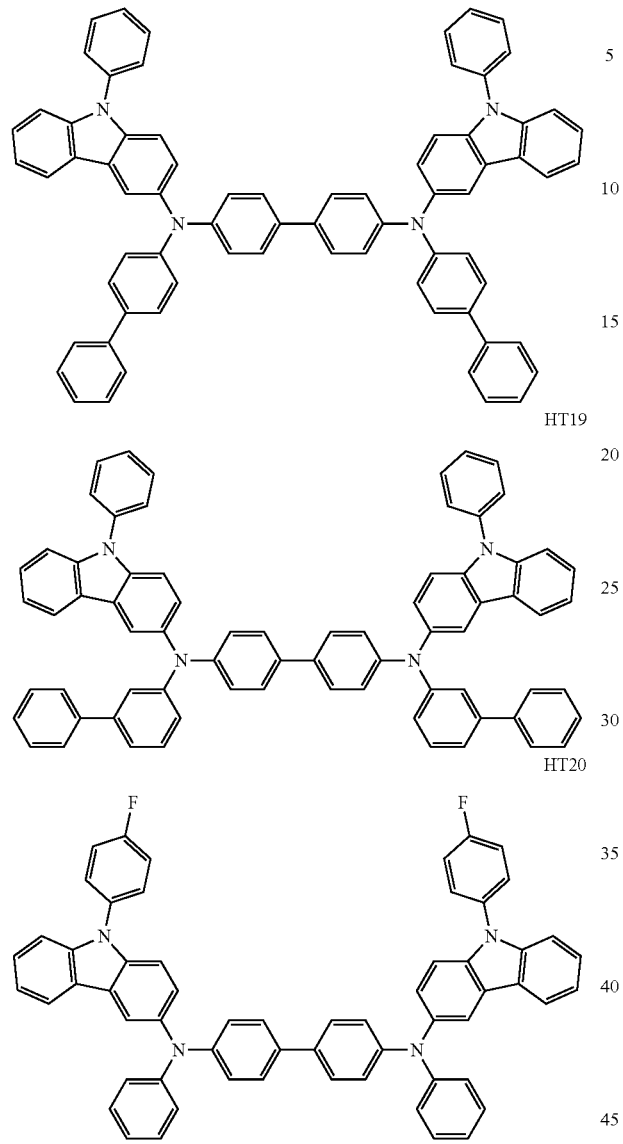

HT18

HT19

HT20

A thickness of the hole transport region may be in a range of about 100 Å to about 10,000 Å, for example, about 100 Å to about 1,000 Å. When the hole transport region includes a hole injection layer, a hole transport layer, or a combination thereof, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. Without wishing to be bound by theory, when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may include a quinone derivative, a metal oxide, a cyano group-containing compound, or a combination thereof. For example, non-limiting examples of the p-dopant may be: a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below.

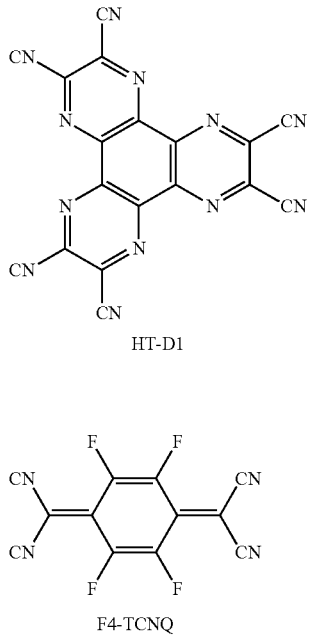

HT-D1

F4-TCNQ

The hole transport region may further include a buffer layer.

Also, the buffer layer may compensate for an optical resonance distance according to a wavelength of light emitted from the emission layer, and thus, luminescence efficiency of the organic light-emitting device 10 may be improved.

Meanwhile, when the hole transport region includes an electron blocking layer, a material for forming the electron blocking layer may include a material that is used in the hole transport region as described above, a host material described below, or a combination thereof. For example, when the hole transport region includes an electron blocking layer, a material for the electron blocking layer may be mCP described below.

Then, an emission layer may be formed on the hole transport region by vacuum deposition, spin coating, casting, LB deposition, or the like. When an emission layer is formed by vacuum deposition or spin coating, the deposition or coating conditions may be similar to those applied in forming the hole injection layer although the deposition or coating conditions may vary according to a material that is used to form the emission layer.

The emission layer may include a host and a dopant, and the dopant may include the organometallic compound represented by Formula 1.

The host may include TPBi, TBADN, ADN (also referred to as "DNA"), CBP, CDBP, TCP, mCP, Compound H50, Compound H51, or a combination thereof:

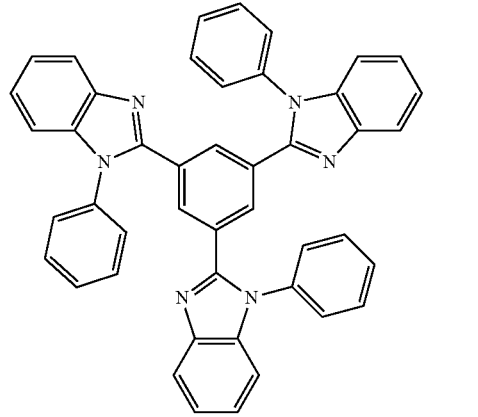
TPBi

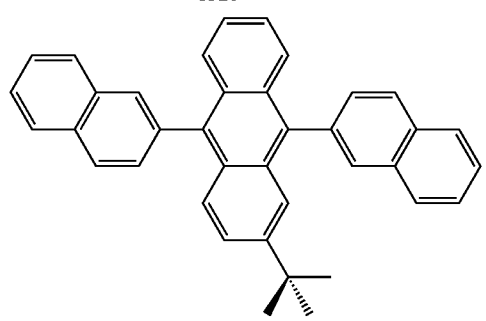
TBADN

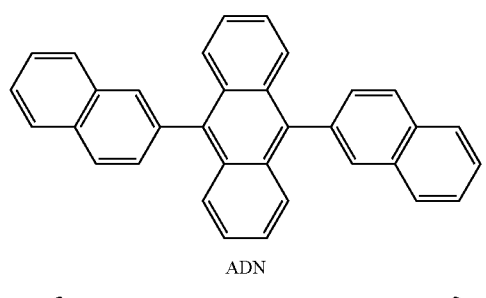
ADN

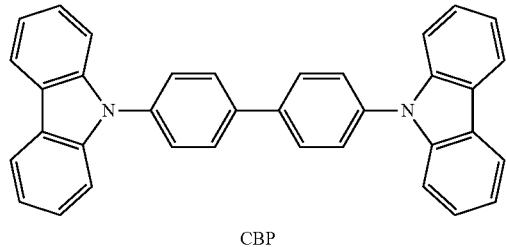
CBP

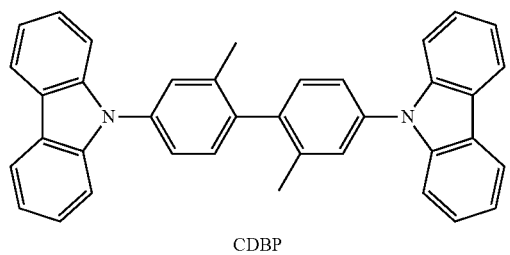
CDBP

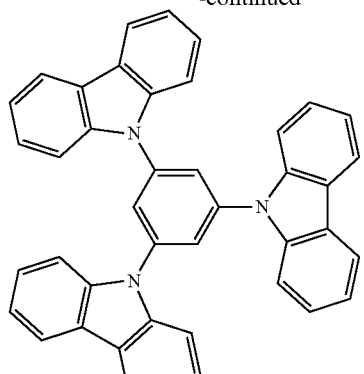
TCP

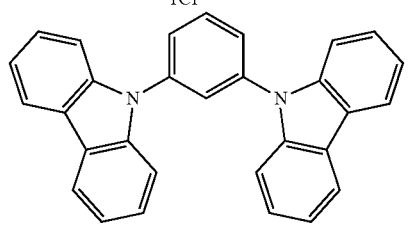
mCP

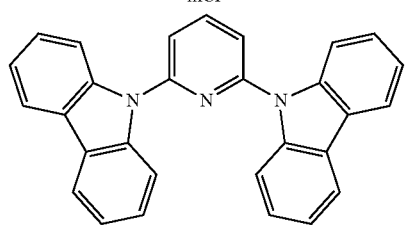
H50

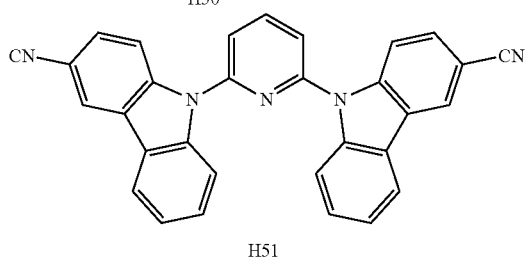
H51

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

The dopant may be the organometallic compound represented by Formula 1. For example, the dopant may be a green phosphorescent dopant.

A thickness of the emission layer may be in a range of about 100 Å to about 1,000 Å, for example, about 200 Å to about 600 Å. Without wishing to be bound by theory, when the thickness of the emission layer is within the range, excellent light-emission characteristics may be obtained without a substantial increase in driving voltage.

Then, an electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which comprise the electron transport region may be understood by referring to the conditions for forming the hole injection layer.

When the electron transport region includes a hole blocking layer, the hole blocking layer may include, for example, BCP, Bphen, BAlq, or a combination thereof.

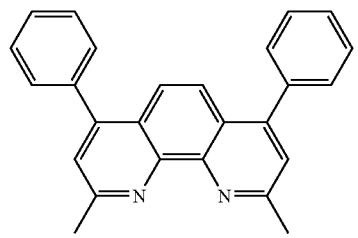

BCP

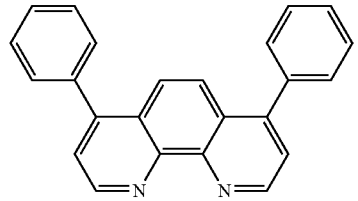

Bphen

A thickness of the hole blocking layer may be in a range of about 20 Å to about 1,000 Å, for example, about 30 Å to about 300 Å. Without wishing to be bound by theory, when the thickness of the hole blocking layer is within the range, the hole blocking layer may obtain excellent hole blocking characteristics without a substantial increase in driving voltage.

The electron transport layer may include BCP, BPhen, Alq$_3$, BAlq, TAZ, NTAZ, or a combination thereof.

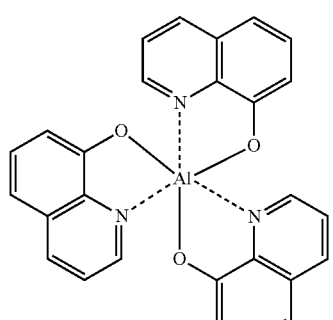

Alq$_3$

-continued

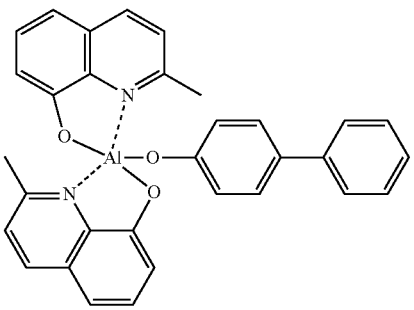

BAlq

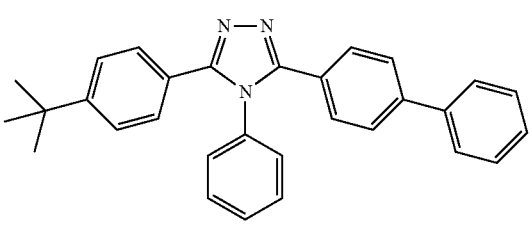

TAZ

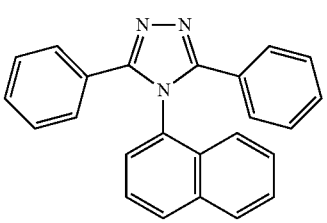

NTAZ

In one or more embodiments, the electron transport layer may include at least one of Compounds ET1 to ET25 or a combination thereof.

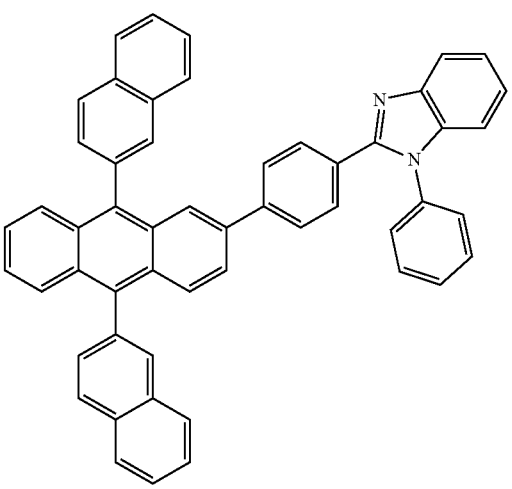

ET1

ET2
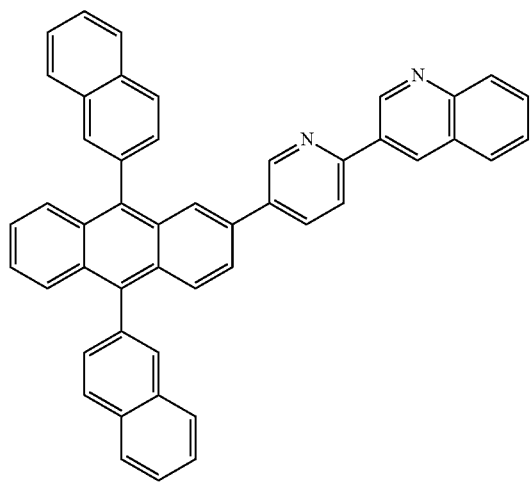
ET3
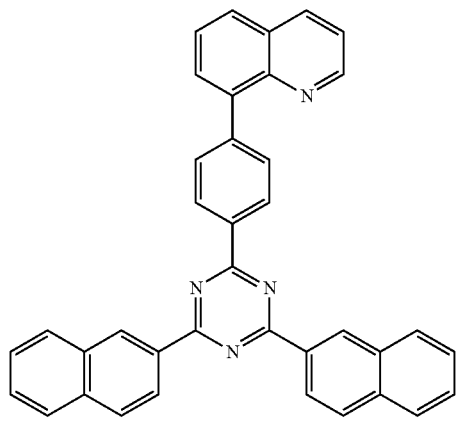
ET4
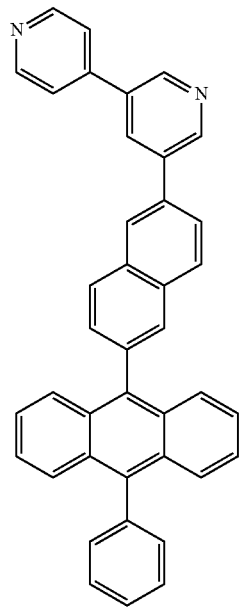
ET5
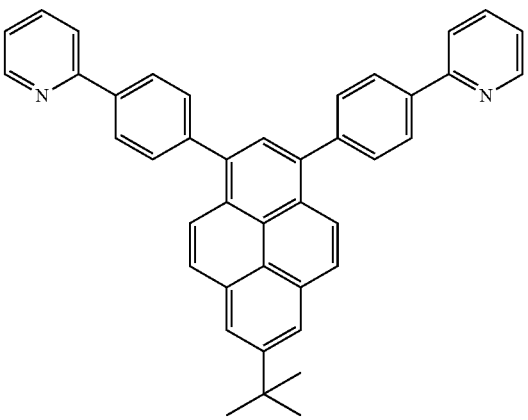
ET6
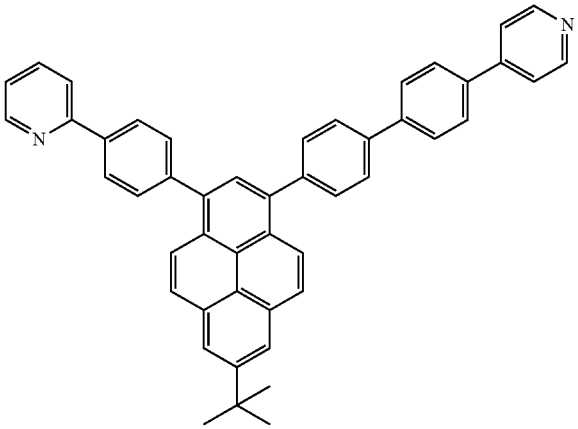
ET7

ET8
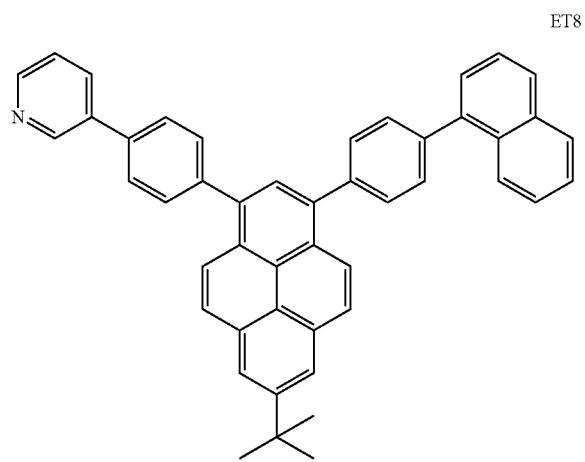
ET11
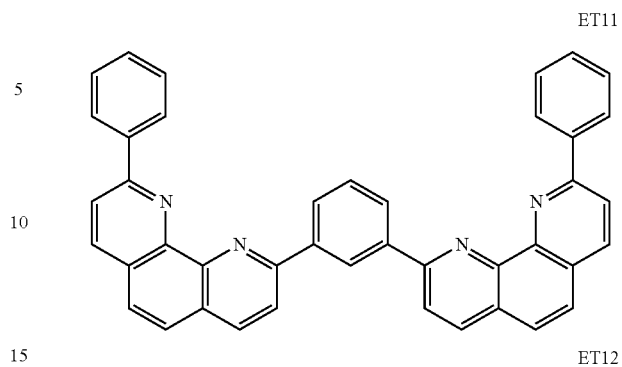
ET12
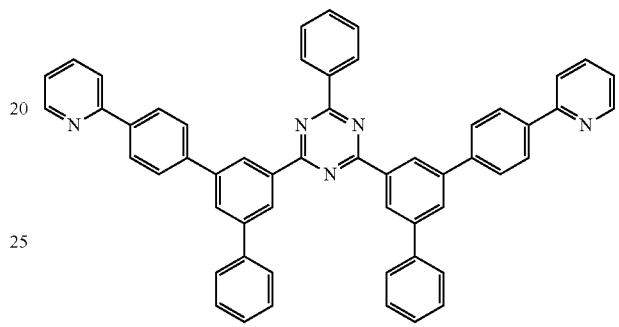
ET9
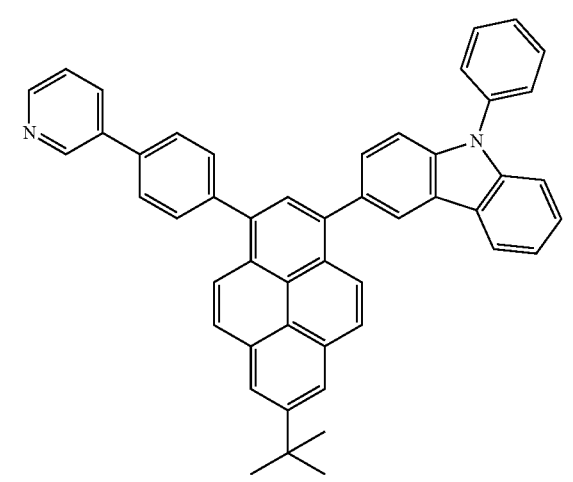
ET13
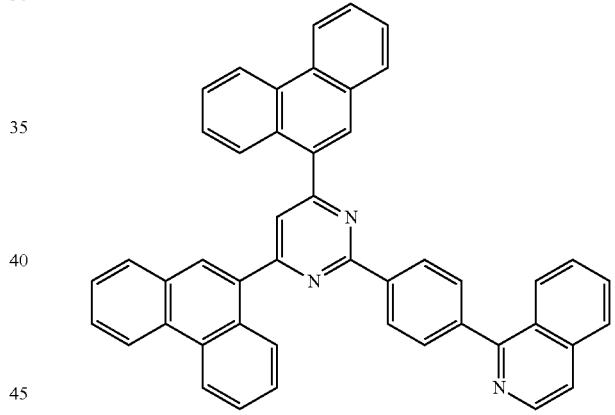
ET10
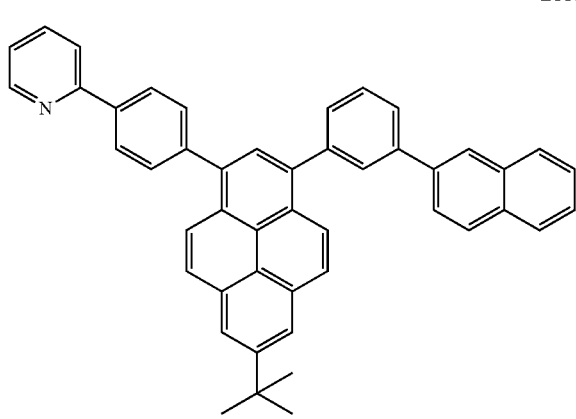
ET14
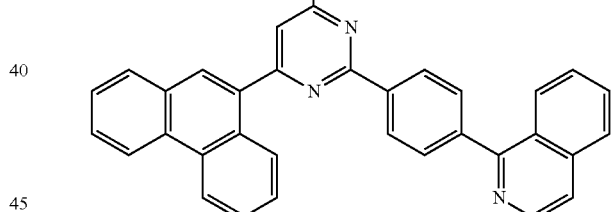

ET15
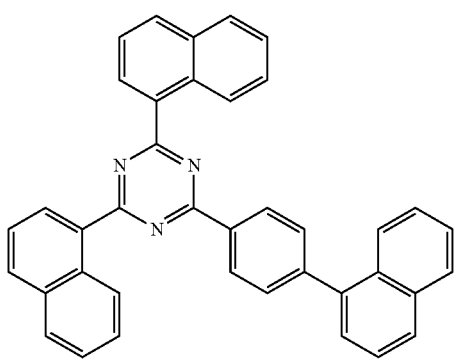
ET18
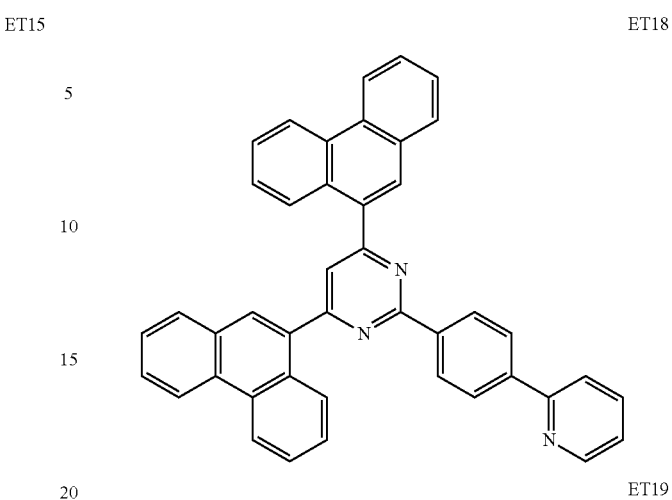
ET16
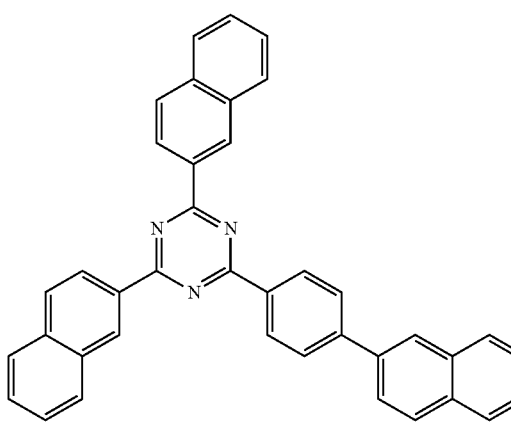
ET19
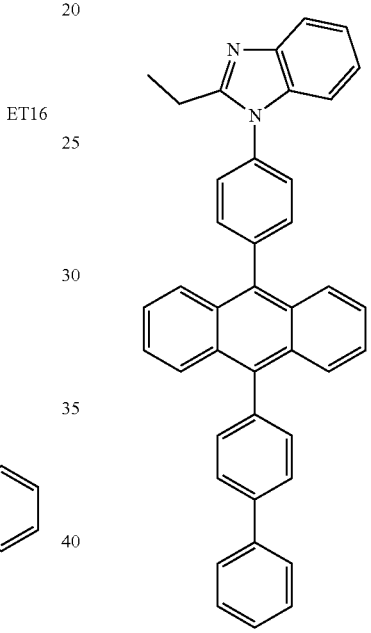
ET17
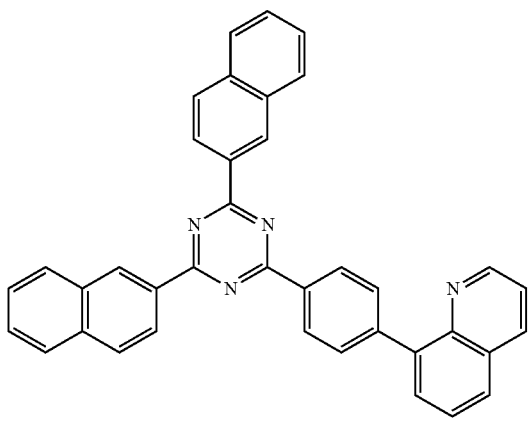
ET20
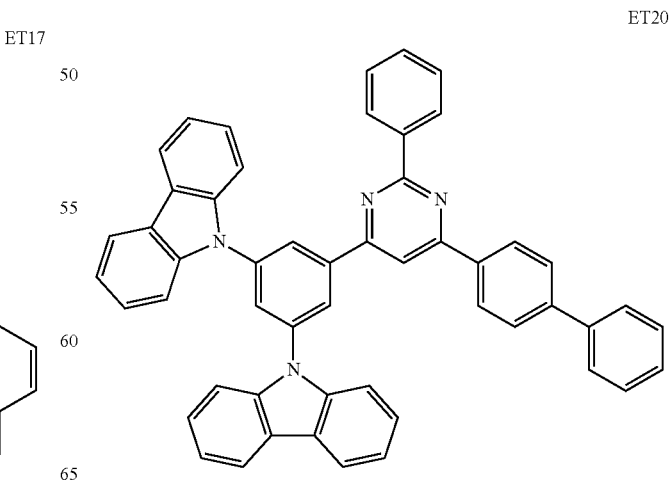

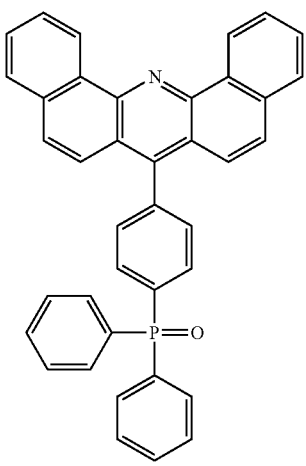

ET21

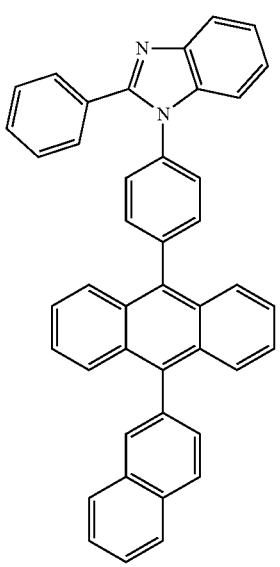

ET23

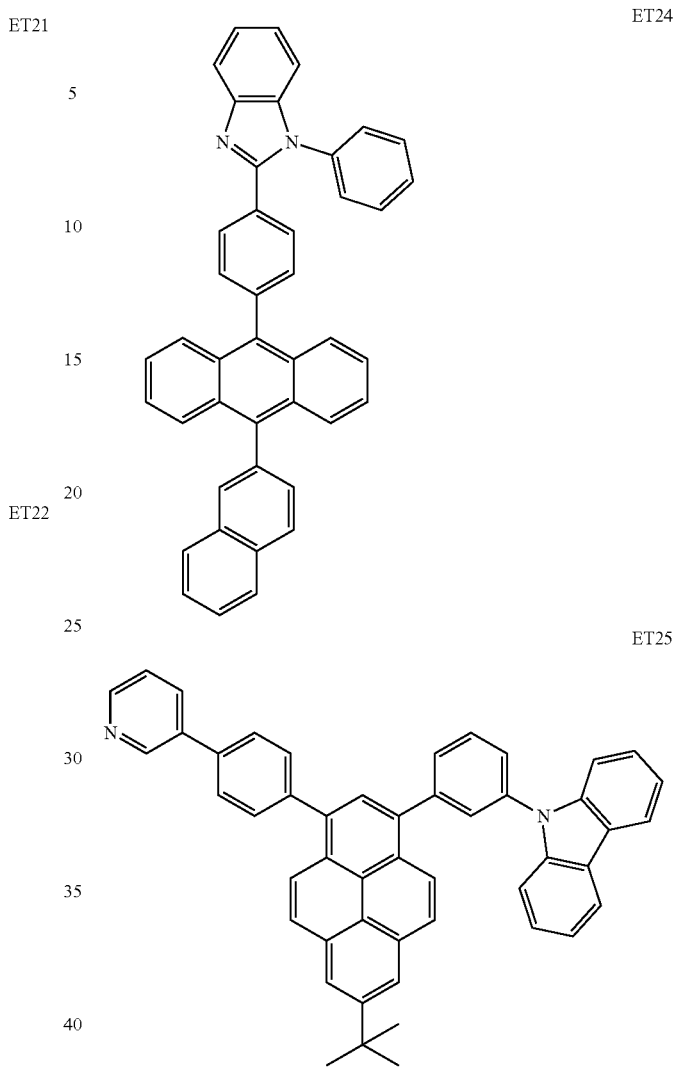

ET22

ET24

ET25

A thickness of the electron transport layer may be in a range of about 100 Å to about 1,000 Å, for example, about 150 Å to about 500 Å. Without wishing to be bound by theory, when the thickness of the electron transport layer is within the range, the electron transport layer may obtain satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (LiQ) or ET-D2.

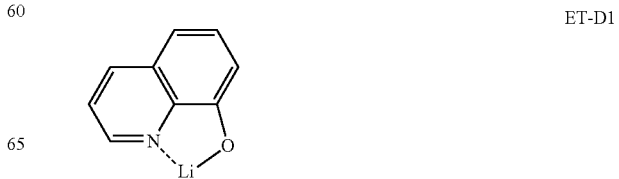

ET-D1

ET-D2

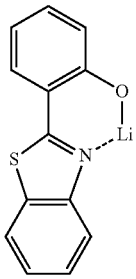

The electron transport region may include an electron injection layer that promotes the flow of electrons from the second electrode 19 thereinto.

The electron injection layer may include LiF, NaCl, CsF, Li$_2$, BaO, or a combination thereof.

A thickness of the electron injection layer may be in a range of about 1 Å to about 100 Å, and, for example, about 3 Å to about 90 Å. Without wishing to be bound by theory, when the thickness of the electron injection layer is within the range, the electron injection layer may obtain satisfactory electron injection characteristics without a substantial increase in driving voltage.

The second electrode 19 may be located on the organic layer 15. The second electrode 19 may be a cathode. A material for forming the second electrode 19 may include a metal, an alloy, an electrically conductive compound, or a combination thereof, which has a relatively low work function. For example, lithium (Li), magnesium (Mg), aluminum (Al), aluminum-lithium (Al—Li), calcium (Ca), magnesium-indium (Mg—In), magnesium-silver (Mg—Ag), or a combination thereof may be used as the material for forming the second electrode 19. In one or more embodiments, to manufacture a top-emission-type light-emitting device, a transmissive electrode formed using ITO, IZO, or a combination thereof may be used as the second electrode 19.

Hereinbefore, the organic light-emitting device has been described with reference to the FIGURE, but exemplary embodiments of the present disclosure are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, and the like.

According to another aspect, provided is a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with at least one of a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group. For example, Formula 9-33 is a branched C alkyl group, for example, a tert-butyl group that is substituted with two methyl groups.

The term "$C_1$-$C_{60}$ alkoxy group" as used herein refers to a monovalent group represented by —OA$_{101}$ (wherein A$_{101}$ is the $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group may include a methoxy group, an ethoxy group, a propoxy group, a butoxy group, or a pentoxy group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" is a divalent group having the same structure as the $C_3$-$C_{10}$ cycloalkyl group.

The term "$C_3$-$C_{10}$ cycloalkyl group" as used herein may include a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl(norbornanyl) group, a bicyclo[2.2.2]octyl group, and the like.

The term "$C_1$-$C_{10}$ heterocycloalkyl group" as used herein refers to a monocyclic group that includes at least one hetero atom selected from N, O, P, Si, S, Se, Ge, As, and B as a ring-forming atom and 1 to 10 carbon atoms, and the term "$C_1$-$C_{10}$ heterocycloalkylene group" refers to a divalent group having the same structure as the $C_1$-$C_{10}$ heterocycloalkyl group.

Examples of the $C_1$-$C_{10}$ heterocycloalkyl group may include a silolanyl group, a silinanyl group, a tetrahydrofuranyl group, a tetrahydro-2H-pyranyl group, a tetrahydrothiophenyl group, and the like.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, S, Se, Ge, As, and B as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted with at least one $C_1$-$C_{60}$ alkyl group. The term "$C_7$-$C_{60}$ arylalkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having a cyclic aromatic system having at least one hetero atom selected from N, O, P, Si, S, Se, Ge, As, and B as a ring-forming atom and 1 to 60 carbon atoms, and the term "$C_1$-$C_{60}$ heteroarylene group" as used herein refers to a divalent group having a carbocyclic aromatic system having at least one hetero atom selected from N, O, P, Si, S, Se, Ge, As, and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ indicates the $C_1$-$C_{10}$ aryl group), the $C_1$-$C_{10}$ arylthio group indicates —$SA_{103}$ (wherein $A_{103}$ indicates the $C_1$-$C_{10}$ aryl group), and the $C_1$-$C_{60}$ alkylthio group indicates —$SA_{104}$ (wherein $A_{104}$ indicates the $C_1$-$C_{60}$ alkyl group).

The term "$C_1$-$C_{60}$ heteroaryloxy group" as used herein refers to —$OA_{10}$ s (wherein $A_{10}$ s is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and non-aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, S, Se, Ge, As, and B, other than carbon atoms, as a ring-forming atom, and non-aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane(norbornane) group, a bicyclo[2.2.2]octane group, a cyclopentane group, a cyclohexane group, a cyclohexene group, a phenyl group, a naphthalene group, an anthracene group, a phenanthrene group, a triphenylene group, a pyrene group, a chrysene group, a 1,2,3,4-tetrahydronaphthalene group, a cyclopentadiene group, a silole group, and a fluorene group (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, As, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may include, for example, a thiophene group, a furan group, a pyrrole group, a silole group, borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each unsubstituted or substituted with at least one $R_{10a}$ as defined herein.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" may refer to, for example, Formula 10-501 and the like. The "deuterated $C_1$-$C_{60}$ alkyl group (or, a deuterated $C_1$-$C_{20}$ alkyl group or the like)", the "deuterated $C_3$-$C_{10}$ cycloalkyl group", or the "deuterated $C_1$-$C_{10}$ heterocycloalkyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, or a fully deuterated $C_1$-$C_{10}$ heterocycloalkyl group, in which, in each group, all hydrogen atoms included therein is substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, or a partially deuterated $C_1$-$C_{10}$ heterocycloalkyl group, in which, in each group, some of the hydrogen atoms are substituted with deuterium but all hydrogen atoms included therein are not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene group, and a 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group," in which, in each group, at least one carbon selected from ring-forming carbons is substituted with nitrogen.

Substituents of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or —P($Q_{18}$)($Q_{19}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or —P($Q_{28}$)($Q_{29}$);
—N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or
a combination thereof.

$Q_1$ to $Q_9$, $Q_{11}$ to $Q_{19}$, $Q_{21}$ to $Q_{29}$, and $Q_{31}$ to $Q_{39}$ as used herein are each independently: hydrogen; deuterium; —F; —$C_1$; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with at least one of deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

Hereinafter, a compound and an organic light-emitting device according to one or more exemplary embodiments are described in further detail with reference to Synthesis Examples and Examples, but the present disclosure is not limited thereto. The wording "B was used instead of A" used in describing Synthesis Examples means that an amount of A that was used was identical to an amount of B that was used, in terms of a molar equivalent.

EXAMPLES

Synthesis Example 1 (Compound 1)

Scheme 1 shows the synthesis of Compound 1.

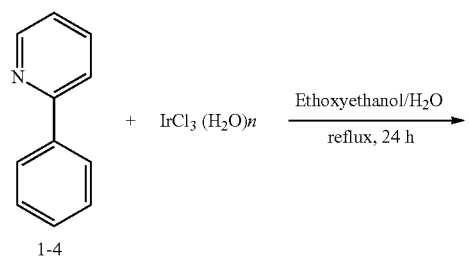

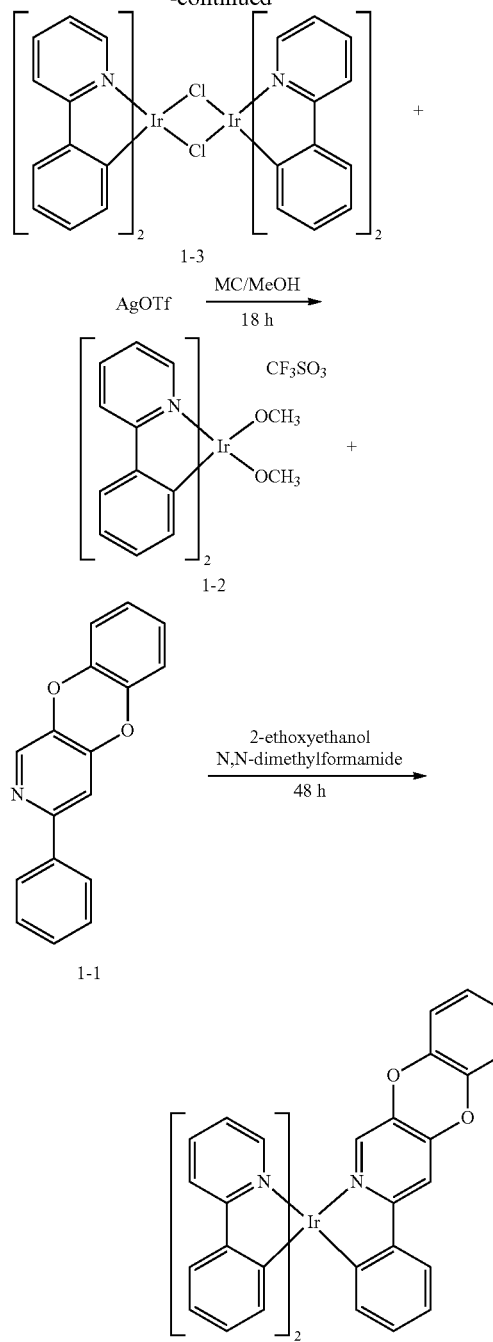

Synthesis of Compound 1-3

Compound 1-4 (33.1 millimoles (mmol)) and iridium chloride IrCl$_3$·xH$_2$O (5.2 grams (g), 14.7 mmol) were mixed with 120 milliliters (mL) of 2-ethoxyethanol and 40 mL of deionized water, and then the mixture was stirred at reflux for 24 hours and then cooled to room temperature. A solid material formed therefrom was separated by filtration and washed thoroughly with water, methanol, and hexane in the stated order to obtain a solid which was then dried in a vacuum oven to obtain Compound 1-3 (yield of 85%).

Synthesis of Compound 1-2

Compound 1-3 (1.2 mmol) and 45 mL of methylene chloride (MC) were mixed, and silver triflate (AgOTf) (0.6 g, 2.3 mmol) was mixed with 15 mL of methanol (MeOH) and then added thereto. Afterward, the mixture was stirred for 18 hours at room temperature while being blocked from light by using aluminum foil, filtered by using diatomaceous earth, a solid formed thereby was removed, and the filtrate was evaporated under reduced pressure to obtain a solid (Compound 1-2) which was then used for next reaction without further purification.

Synthesis of Compound 1

Compound 1-2 (2.3 mmol) and Compound 1-1 (2.8 mmol) were mixed with 50 mL of 2-ethoxyethanol and 50 mL of N,N-dimethylformamide, the mixture was stirred at reflux for 48 hours, and then temperature was cooled down. A mixture obtained therefrom was evaporated under reduced pressure to obtain a solid which was then subjected to column chromatography (eluent: methylene chloride (MC) and hexane) to obtain Compound 1 (yield of 45%). Compound 1 was confirmed by high resolution mass spectrometry (HRMS) and high performance liquid chromatography (HPLC) analysis.

HRMS (matrix assisted laser desorption ionization, MALDI) calcd for $C_{39}H_{26}IrN_3O_2$: m/z 760.86, Found: 761.30.

Synthesis Example 2 (Compound 2)

Scheme 2 shows the synthesis of Compound 2.

Scheme 2

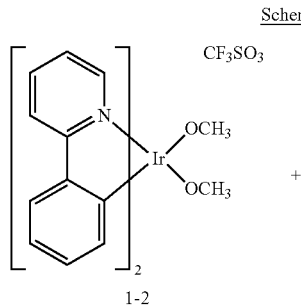

1-2

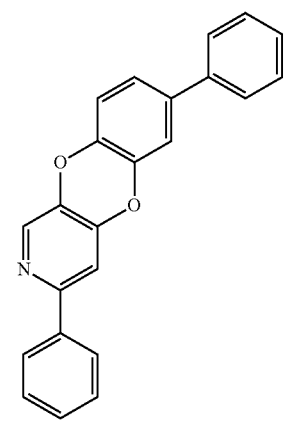

2-1

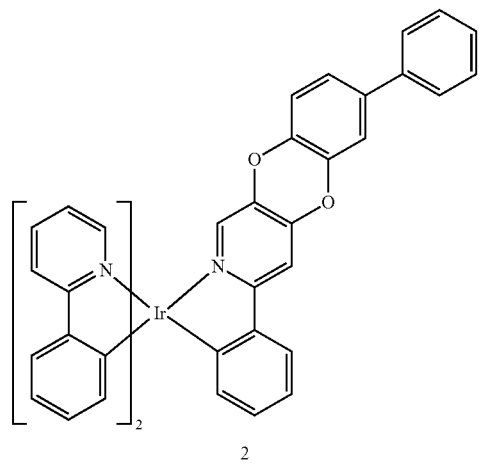

2

Compound 2 (yield of 55%) was obtained in the same manner as used to synthesize Compound 1 of Synthesis Example 1, except that Compound 2-1 was used instead of Compound 1-1. Compound 2 was confirmed by HRMS and HPLC analysis.

HRMS (MALDI) calcd for $C_{45}H_{30}IrN_3O_2$: m/z 836.96, Found: 837.60.

Synthesis Example 3 (Compound 3)

Scheme 3 shows the synthesis of Compound 3.

Scheme 3

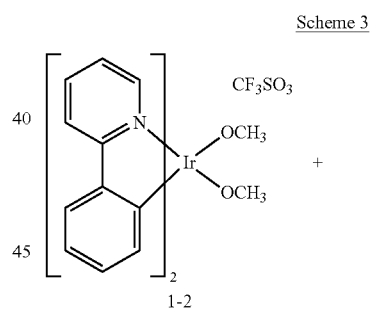

1-2

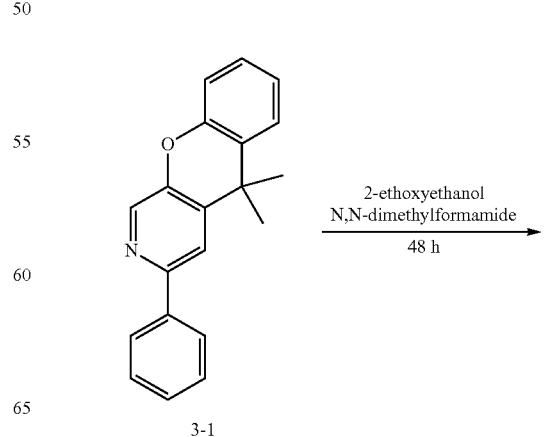

3-1

-continued

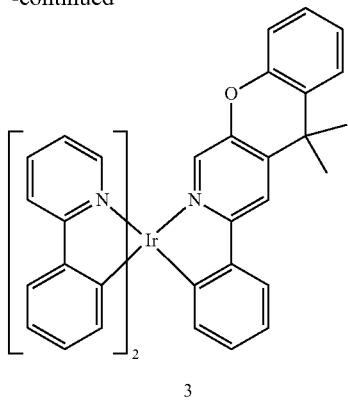

3

Compound 3 (yield of 50%) was obtained in the same manner as used to synthesize Compound 1 of Synthesis Example 1, except that Compound 3-1 was used instead of Compound 1-1. Compound 3 was confirmed by HRMS and HPLC analysis.

HRMS (MALDI) calcd for $C_{42}H_{32}IrN_3O_2$: m/z 787.22, Found: 788.15.

Synthesis Example 4 (Compound 4)

Scheme 4 shows the synthesis of Compound 4.

Scheme 4

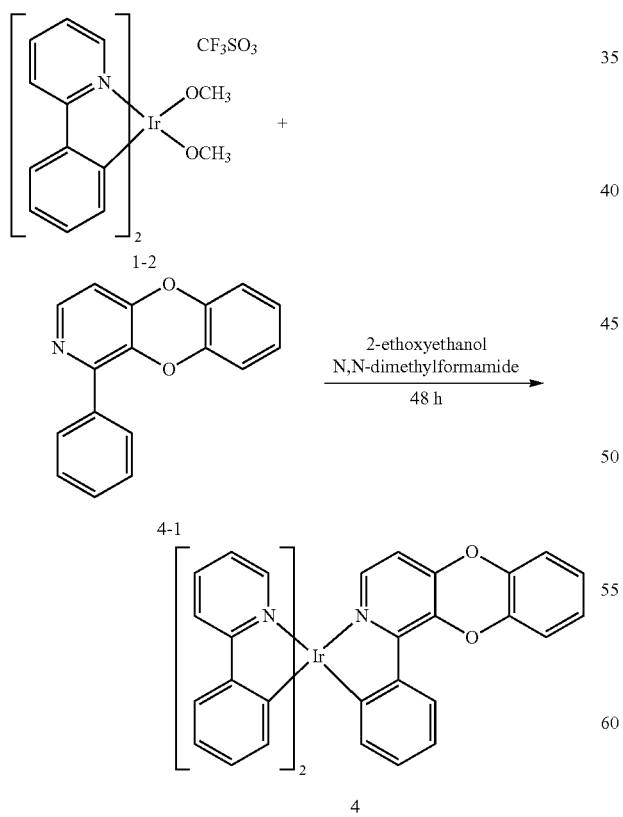

Compound 4 (yield of 45%) was obtained in the same manner as used to synthesize Compound 1 of Synthesis Example 1, except that Compound 4-1 was used instead of Compound 1-1. Compound 4 was confirmed by HRMS and HPLC analysis.

HRMS (MALDI) calcd for $C_{39}H_{26}IrN_3O_2$: m/z 760.86, Found: 761.35.

Synthesis Example 5 (Compound 5)

Scheme 5 shows the synthesis of Compound 5.

Scheme 5

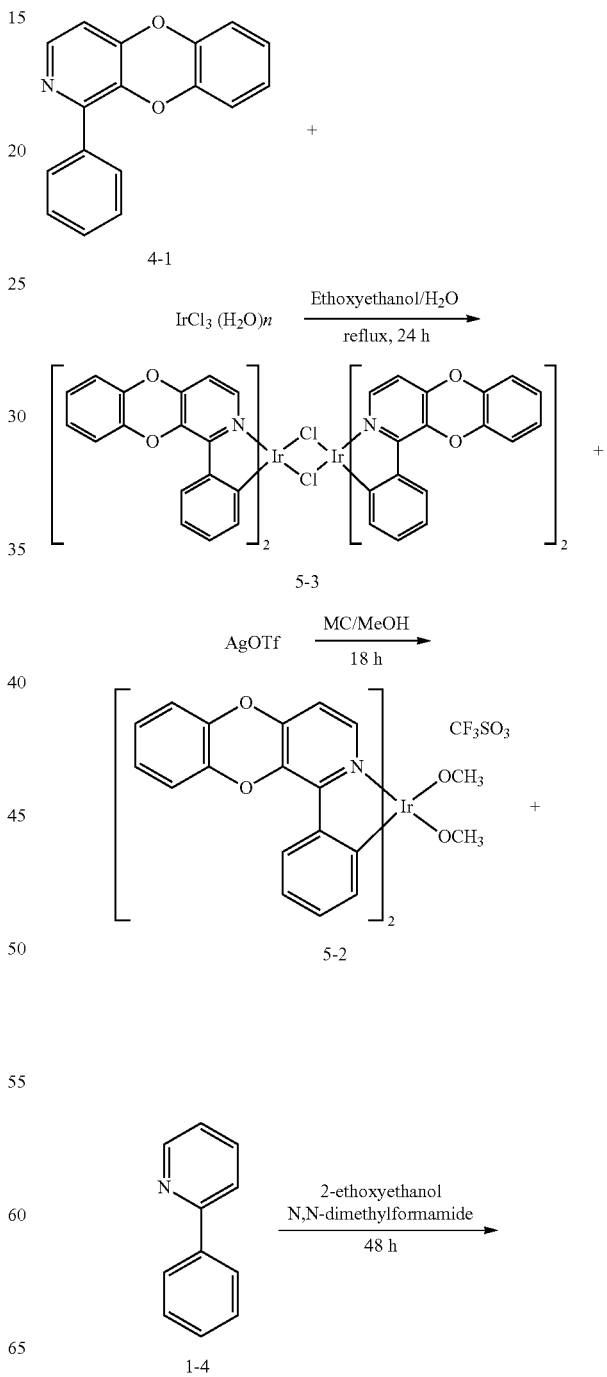

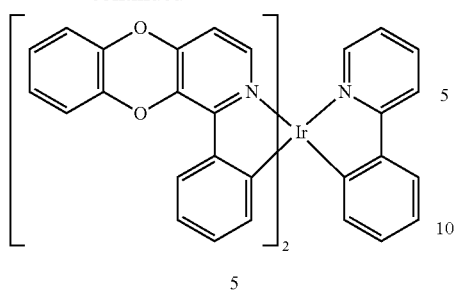

5

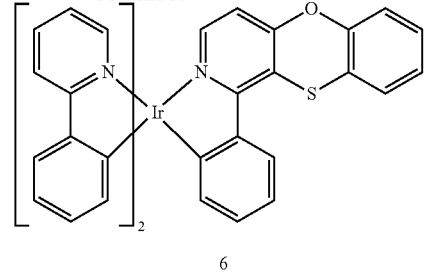

6

Synthesis of Compound 5-3

Compound 5-3 (yield of 50%) was obtained in the same manner as used to synthesize Compound 1-3 of Synthesis Example 1, except that Compound 4-1 was used instead of Compound 1-4.

Synthesis of Compound 5-2

Compound 5-2 was obtained in the same manner as used to synthesize Compound 1-2 of Synthesis Example 1 and then used for next reaction without further purification, except that Compound 5-3 was used instead of Compound 1-3.

Synthesis of Compound 5

Compound 5 (yield of 50%) was obtained in the same manner as used to synthesize Compound 1 of Synthesis Example 1, except that Compound 5-2 and Compound 1-4 were used instead of Compound 1-2 and Compound 1-1, respectively. Compound 5 was confirmed by HRMS and HPLC analysis.

HRMS (MALDI) calcd for $C_{45}H_{28}IrN_3O_4$: m/z 866.94, Found: 867.23.

Synthesis Example 6 (Compound 6)

Scheme 6 shows the synthesis of Compound 6.

Scheme 6

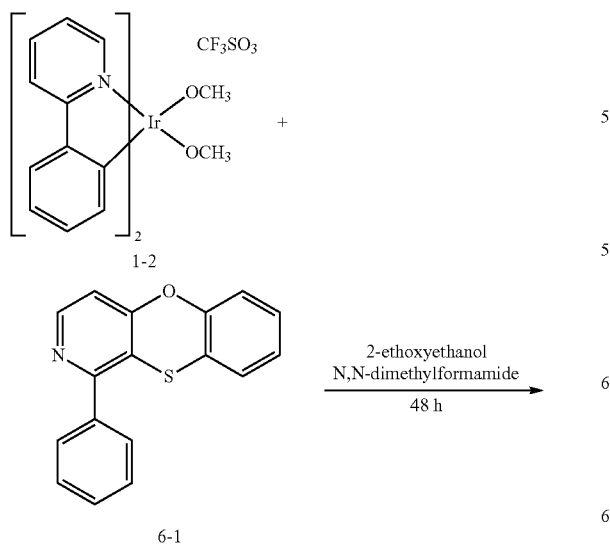

Compound 6 (yield of 45%) was obtained in the same manner as used to synthesize Compound 1 of Synthesis Example 1, except that Compound 6-1 was used instead of Compound 1-1. Compound 6 was confirmed by HRMS and HPLC analysis.

HRMS (MALDI) calcd for $C_{39}H_{26}IrN_3OS$: m/z 776.93, Found: 777.56.

Synthesis Example 7 (Compound 7)

Scheme 7 shows the synthesis of Compound 7.

Scheme 7

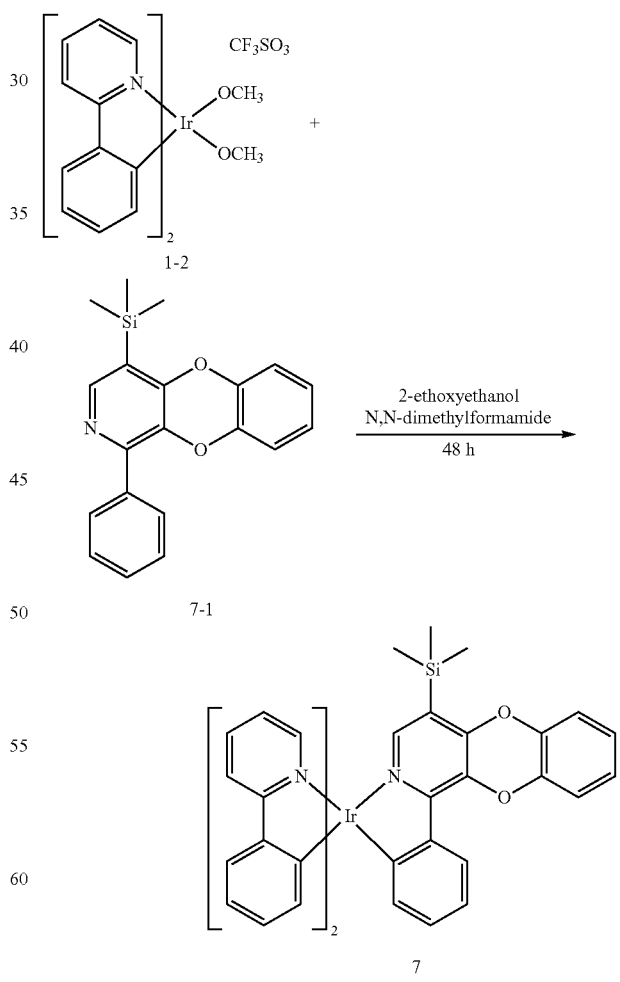

Compound 7 (yield of 50%) was obtained in the same manner as used to synthesize Compound 1 of Synthesis Example 1, except that Compound 7-1 was used instead of Compound 1-1. Compound 7 was confirmed by HRMS and HPLC analysis.

HRMS (MALDI) calcd for $C_{42}H_{38}IrN_3O_2Si$: m/z 833.04, Found: 833.97.

Synthesis Example 8 (Compound 8)

Scheme 8 shows the synthesis of Compound 8.

Scheme 8

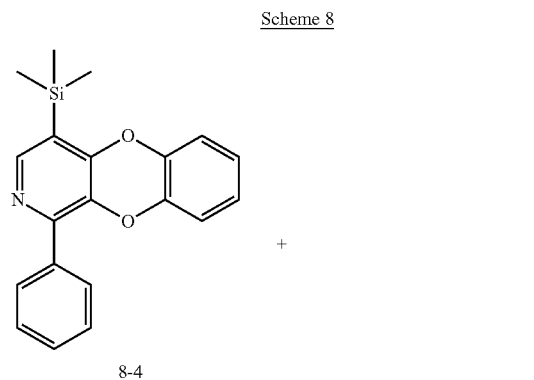

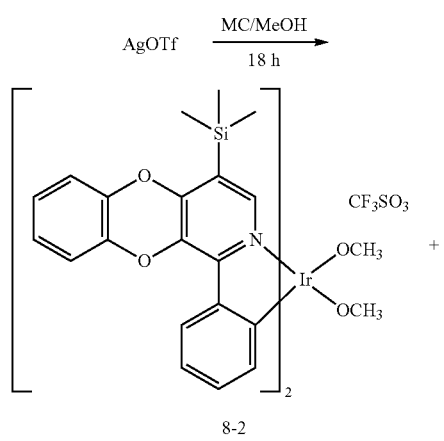

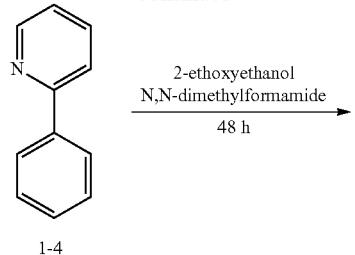

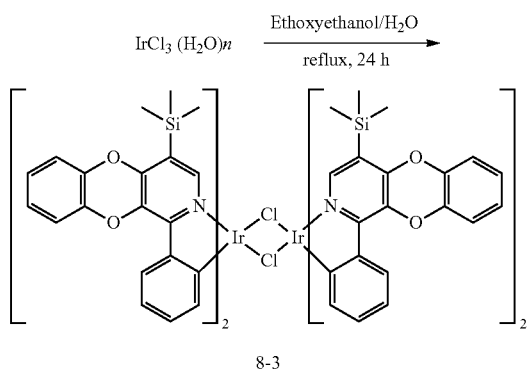

Synthesis of Compound 8-3

Compound 8-3 (yield of 55%) was obtained in the same manner as used to synthesize Compound 1-3 of Synthesis Example 1, except that Compound 8-4 was used instead of Compound 1-4.

Synthesis of Compound 8-2

Compound 8-2 was obtained in the same manner as used to synthesize Compound 1-2 of Synthesis Example 1 and then used for next reaction without further purification, except that Compound 8-3 was used instead of Compound 1-3.

Synthesis of Compound 8

Compound 8 (yield of 55%) was obtained in the same manner as used to synthesize Compound 1 of Synthesis Example 1, except that Compound 8-2 and Compound 1-4 were used instead of Compound 1-2 and Compound 1-1, respectively. Compound 8 was confirmed by HRMS and HPLC analysis.

HRMS (MALDI) calcd for $C_1H_{44}IrN_3O_4Si_2$: m/z 1011.33, Found: 1012.25.

Synthesis Example 9 (Compound 9)

Scheme 9 shows the synthesis of Compound 9.

Scheme 9

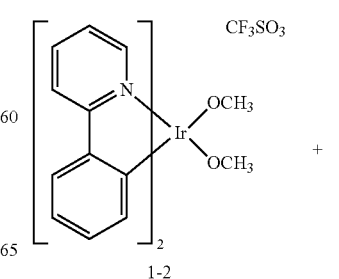

-continued

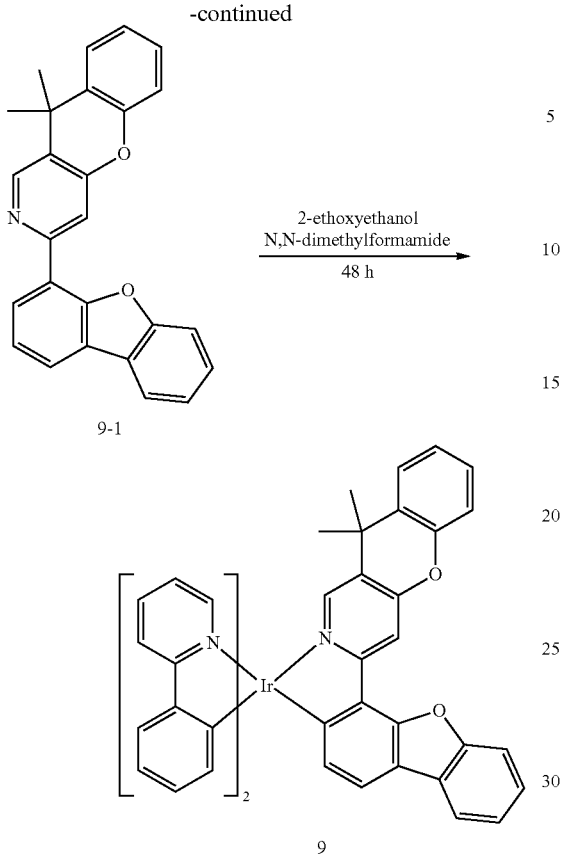

9-1

9

Compound 9 (yield of 50%) was obtained in the same manner as used to synthesize Compound 1 of Synthesis Example 1, except that Compound 9-1 was used instead of Compound 1-1. Compound 9 was confirmed by HRMS and HPLC analysis.

HRMS (MALDI) calcd for $C_{48}H_{34}IrN_3O_2$: m/z 911.11, Found: 912.30.

Example 1

As an anode, a glass substrate with ITO deposited thereon to a thickness of 1,000 Å was cut to a size of 50 mm×50 mm×0.5 mm, sonicated with isopropyl alcohol and pure water each for 5 minutes, and then cleaned by irradiation of ultraviolet rays and exposure to ozone for 30 minutes. Then the resultant glass substrate was loaded onto a vacuum deposition apparatus.

2-TNATA was vacuum-deposited on the anode to form a hole injection layer having a thickness of 600 Å, and 4,4′-bis[N-(1-naphthyl)-N-phenylamino]biphenyl (hereinafter referred to as NPB) was vacuum-deposited on the hole injection layer to form a hole transport layer having a thickness of 1,350 Å.

Subsequentially, CBP (host) and Compound 1 (dopant) were co-deposited at a weight ratio of 90:10 on the hole transport layer to form an emission layer having a thickness of 400 Å.

Afterward, BCP was vacuum-deposited on the emission layer to form a hole blocking layer having a thickness of 50 Å, Alq₃ was vacuum-deposited on the hole blocking layer to form an electron transport layer having a thickness of 350 Å, LiF was vacuum-deposited on the electron transport layer to form an electron injection layer having a thickness of 10 Å, and Al was deposited on the electron injection layer to form a cathode having a thickness of 1,200 Å, thereby completing the manufacture of an organic light-emitting device.

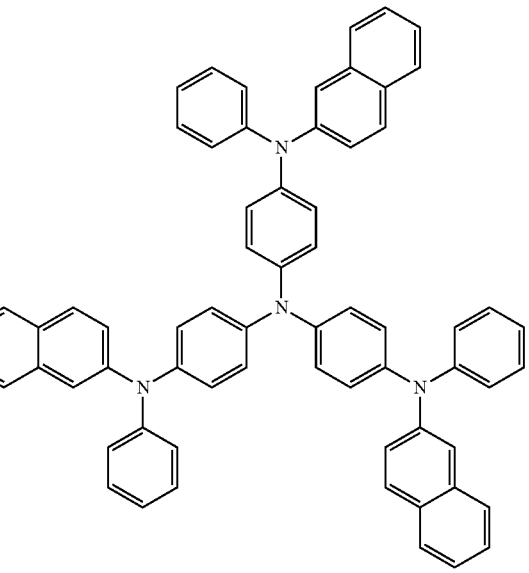

2-TNATA

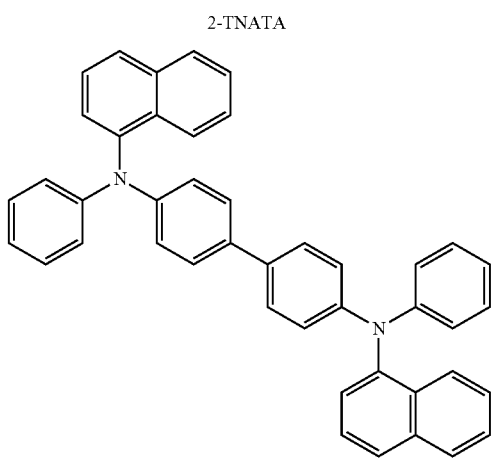

NPB

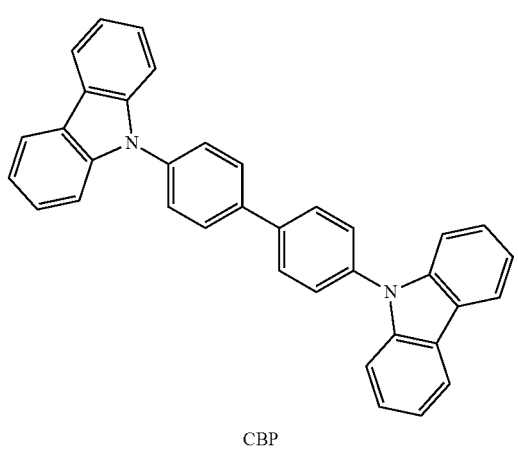

CBP

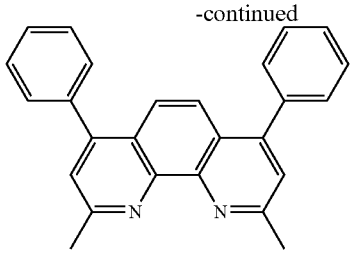

BCP

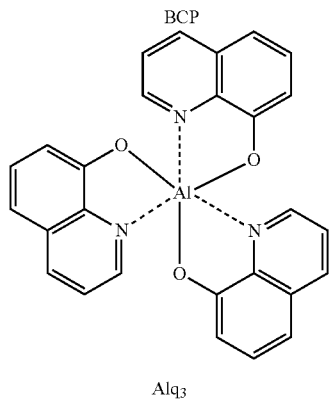

Alq₃

Examples 2 to 9 and Comparative Examples A to C

Organic light-emitting devices were manufactured in the same manner as in Example 1, except that in forming an emission layer, for use as a dopant, corresponding compounds shown in Table 10 were used instead of Compound 1.

Evaluation Example 1: Characteristic Evaluation of Organic Light-Emitting Device For each organic light-emitting device manufactured in Examples 1 to 9 and Comparative Examples A to C, the driving voltage (voltage, V), the maximum value of external quantum efficiency (Max EQE, %), and the full width at half maximum (FWHM) of a main peak in an electroluminescence (EL) spectrum, and the maximum emission wavelength (nanometers, nm) were evaluated, and results thereof are shown in Table 10. As evaluation apparatuses, a current-voltage meter (Keithley 2400) and a luminance meter (Minolta Cs-1000A) were used.

TABLE 10

| | Dopant in emission layer | Driving voltage (V) | Max EQE (%) | FWHM (nm) | Maximum emission wavelength (nm) |
|---|---|---|---|---|---|
| Example 1 | 1 | 6.5 | 20 | 80 | 505 |
| Example 2 | 2 | 6.2 | 20 | 82 | 508 |
| Example 3 | 3 | 6.4 | 20 | 78 | 510 |
| Example 4 | 4 | 6.1 | 20 | 76 | 516 |
| Example 5 | 5 | 6.2 | 19 | 77 | 514 |
| Example 6 | 6 | 6.5 | 20 | 80 | 540 |
| Example 7 | 7 | 6.4 | 19 | 79 | 521 |
| Example 8 | 8 | 6.5 | 20 | 80 | 528 |
| Example 9 | 9 | 6.1 | 20 | 70 | 516 |
| Comparative Example A | A | 6.7 | 18 | 76 | 518 |
| Comparative Example B | B | 6.6 | 18 | 76 | 565 |
| Comparative Example C | C | 6.6 | 19 | 82 | 538 |

TABLE 10-continued

| Dopant in emission layer | Driving voltage (V) | Max EQE (%) | FWHM (nm) | Maximum emission wavelength (nm) |
|---|---|---|---|---|
| 5 | | | | |
| 6 | | | | |
| 7 | | | | |
| 8 | | | | |
| 9 | | | | |
| A | | | | |
| B | | | | |
| C | | | | |

Referring to Table 10, the organic light-emitting devices manufactured according to Examples 1 to 9 emit green light and have improved driving voltage and improved external quantum efficiency, compared to the organic light-emitting devices manufactured according to Comparative Examples A to C.

The organometallic compound has excellent electrical characteristics, and thus an electronic device, for example, an organic light-emitting device, including the organometallic compound, may have improved characteristics in terms of driving voltage, current density, luminescence efficiency, power efficiency, color purity, and/or lifespan.

It should be understood that exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the FIGURE, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n1}(L_2)_{n2} \quad \text{Formula 1}$$

wherein, in Formula 1,
M is Ir,
$L_1$ is a ligand represented by Formulae 2-1, 2-2, or 2-3, n1 is 1, 2, or 3, wherein, when n1 is 2 or greater, two or more ligands $L_1$ are identical to or different from each other, $L_2$ is a ligand represented by Formula 3D, n2 is 0, 1, or 2, wherein, when n2 is 2, two or more ligands $L_2$ are identical to or different from each other, and a sum of n1 and n2 is 3,

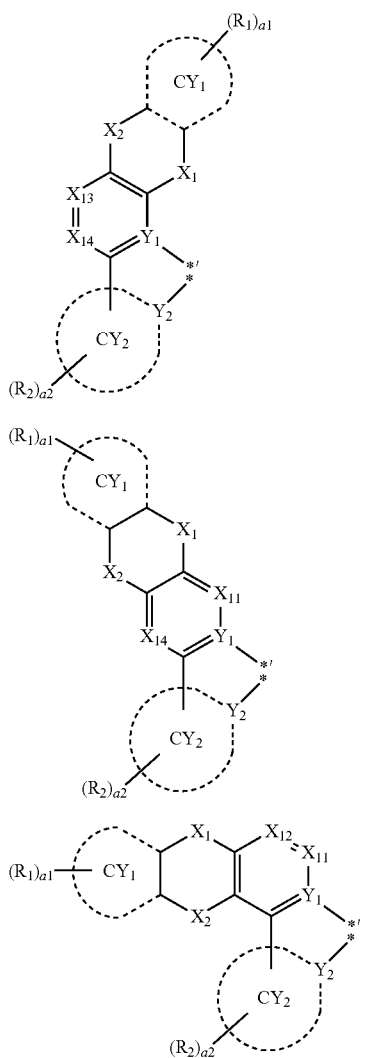

wherein, in Formulae 2-1 to 2-3, $X_{11}$ is N, or $C(R_{11})$, $X_{12}$ is N, or $C(R_{12})$, $X_{13}$ is N, or $C(R_{13})$, $X_{14}$ is N, or $C(R_{14})$, $X_1$ is O, S, or $C(R_{31})(R_{32})$, $X_2$ is O, S, or $C(R_{33})(R_{34})$, $Y_1$ is N, $Y_2$ is C, ring $CY_1$ is a phenyl group, a pyridine group, or a pyrimidine group, ring $CY_2$ is a phenyl group, a naphthalene group, a fluorene group, a dibenzofuran group, a dibenzothiophene group, a carbazole group, or a dibenzosilole group, with the proviso that when $L_1$ is the ligand represented by Formula 2-3, then $X_{12}$ is $C(R_{12})$, and $R_{12}$ is —$Si(Q_3)(Q_4)(Q_5)$ or —$Ge(Q_3)(Q_4)(Q_5)$, $R_1$, $R_2$, $R_{11}$, $R_{13}$, and $R_{14}$ are each independently hydrogen, deuterium, a substituted or unsubstituted $C_1$-$C_{60}$ alkyl group, a substituted or unsubstituted $C_3$-$C_{10}$ cycloalkyl group, a substituted or unsubstituted $C_3$-$C_{10}$ cycloalkenyl group, or a substituted or unsubstituted $C_6$-$C_{60}$ aryl group, $R_{12}$, and $R_{31}$ to $R_{34}$ are each independently hydrogen, deuterium, —F, —$C_1$, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $R_{31}$ and $R_{33}$ are not hydrogen, a1 is an integer of 0 to 4, wherein, when a1 is 2 or greater, two or more groups $R_1$ are identical to or different from each other, a2 is an integer of 0 to 8, wherein, when a2 is 2 or greater, two or more groups $R_2$ are identical to or different from each other, provided that the organometallic compound does not comprise a compound wherein n2 in Formula 1 is 0, $X_1$ is $C(R_{31})(R_{32})$, and $X_2$ is $C(R_{33})(R_{34})$, two or more of a plurality of groups $R_1$ are optionally linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of a plurality of groups $R_2$ are optionally linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as described in connection with $R_2$,

* and *' in each indicate a binding site to M in Formula 1,

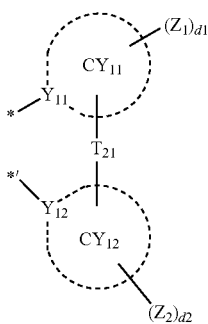

3D wherein, in Formula 3D,
  $T_{21}$ is a single bond,
  $Y_{11}$ is N,
  $Y_{12}$ is C,
  ring $CY_{11}$ is a pyridine group or a pyrimidine group,
  ring $CY_{12}$ is a benzene group, a naphthalene group, a fluorene group, a dibenzofuran group, a dibenzothiophene group, a carbazole group, or a dibenzosilole group,
  d1 to d2 are each independently an integer from 0 to 10,
  $Z_1$ and $Z_2$ are the same as described in connection with $R_2$,
  * and *' in Formula 3D each indicate a binding site to Min Formula 1,
  substituents of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group are each independently:
  deuterium, —F, —$C_1$, —Br, —I, -$CD_3$, -$CD_2H$, -$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, an unsubstituted $C_1$-$C_{60}$ alkyl group, an unsubstituted $C_2$-$C_{60}$ alkenyl group, an unsubstituted $C_2$-$C_{60}$ alkynyl group, or an unsubstituted $C_1$-$C_{60}$ alkoxy group;
  a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —$C_1$, —Br, —I, -$CD_3$, -$CD_2H$, -$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), or —P($Q_{18}$)($Q_{19}$);
  a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —$C_1$, —Br, —I, -$CD_3$, -$CD_2H$, -$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), or —P($Q_{28}$)($Q_{29}$);
  —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or
  a combination thereof, and
  $Q_1$ to $Q_9$, $Q_{11}$ to $Q_{19}$, $Q_{21}$ to $Q_{29}$, and $Q_{31}$ to $Q_{39}$ are each independently hydrogen;
  deuterium; —F; —$C_1$; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with at least one of deuterium, a $C_1$-$C_{60}$ alkyl group, or a $C_6$-$C_{60}$ aryl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with at least one of deuterium, a $C_1$-$C_{60}$ alkyl group, or a $C_6$-$C_{60}$ aryl group; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

2. The organometallic compound of claim 1, wherein n2 is 1 or 2.

3. The organometallic compound of claim 1, wherein at least one of $X_1$ and $X_2$ is O or S.

4. The organometallic compound of claim 1, wherein
$X_1$ is $C(R_{31})(R_{32})$, and $X_2$ is O or S; or
$X_1$ is O or S, and $X_2$ is $C(R_{33})(R_{34})$.

5. The organometallic compound of claim 1, wherein $R_{12}$, and $R_{31}$ to $R_{34}$ are each independently:
- hydrogen, deuterium, —F, —$C_1$, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;
- a $C_1$-$C_{20}$ alkyl group or a $C_1$-$C_{20}$ alkoxy group, each substituted with at least one of deuterium, —F, —$C_1$, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, or a pyrimidinyl group;
- a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, -$CD_3$, -$CD_2H$, -$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl) cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group; or
- —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, wherein $Q_1$ to $Q_9$ are each independently:
- —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or
- an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{20}$ alkyl group, or a phenyl group.

6. The organometallic compound of claim 1, wherein $L_1$ is the ligand represented by Formula 2-3, $X_{12}$ in Formula 2-3 is $C(R_{12})$, and $R_{12}$ is $-Si(Q_3)(Q_4)(Q_5)$ or $-Ge(Q_3)(Q_4)(Q_5)$, and wherein $Q_3$ to $Q_5$ are the same as described in claim 1.

7. The organometallic compound of claim 1, wherein $L_1$ in Formula 1 is a ligand represented by Formula 2-1(1), 2-2(1), or 2-3(1):

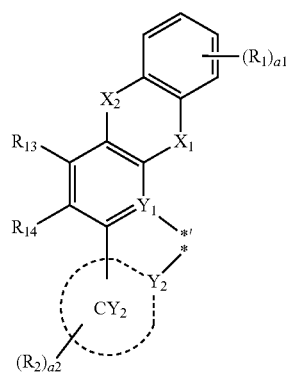

2-1(1)

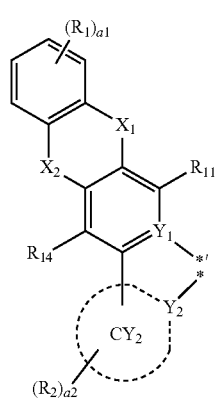

2-2(1)

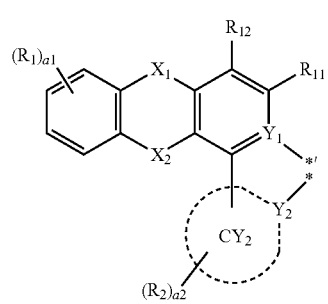

2-3(1)

in Formulae 2-1(1), 2-2(1), and 2-3(1), $X_1$, $X_2$, $Y_1$, $Y_2$, ring $CY_2$, $R_1$, $R_2$, $R_{11}$ to $R_{14}$, a1, a2, *, and *' are the same as described in claim 1.

8. The organometallic compound of claim 1, wherein $L_2$ is a ligand represented by Formula 3-1:

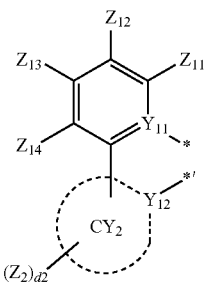

3-1 wherein, in Formula 3-1, $Y_{11}$, $Y_{12}$, ring $CY_{12}$, $Z_2$, and d2 are the same as described in claim 1, $Z_{11}$ to $Z_{14}$ are each the same as described in connection with $Z_1$ in claim 1, and

* and ** each indicate a binding site to M in Formula 1.

9. The organometallic compound of claim 8, wherein a group represented by

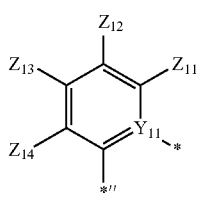

in Formula 3-1 is a group represented by one of Formulae 3-1-1 to 3-1(16), and a group represented by

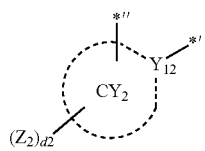

in Formula 3-1 is a group represented by one of Formulae 3-1(1) to 3-1(16):

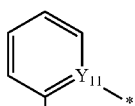

3-1-1

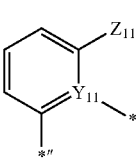

3-1-2

3-1-3
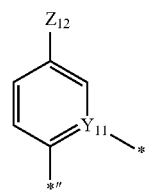
3-1-4
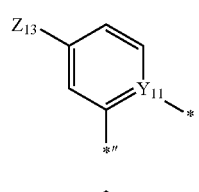
3-1-5
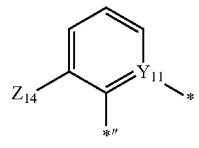
3-1-6
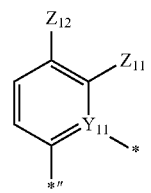
3-1-7
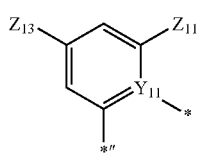
3-1-8
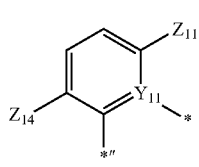
3-1-9
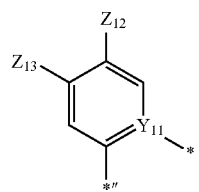
3-1-10
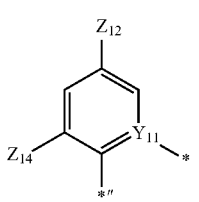
3-1-11
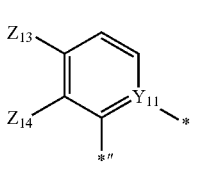
3-1-12
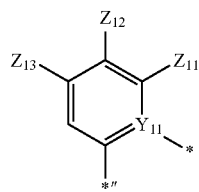
3-1-13
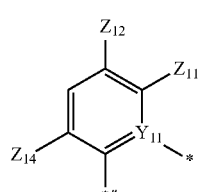
3-1-14
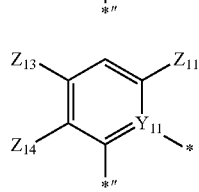
3-1-15
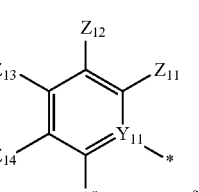
and
3-1-16
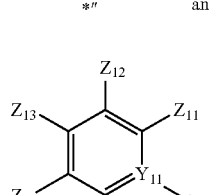
3-1(1)
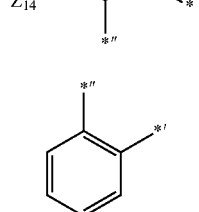
3-1(2)
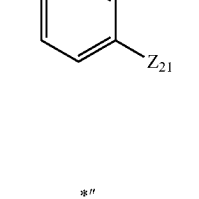
3-1(3)
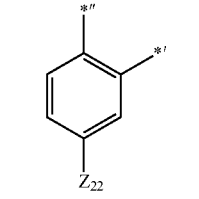

149
-continued

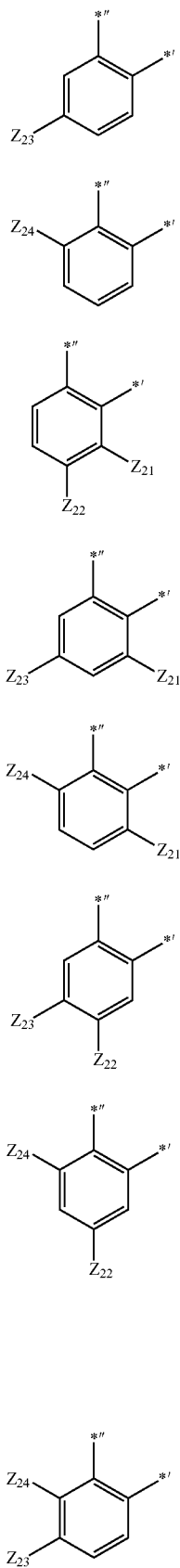

150
-continued

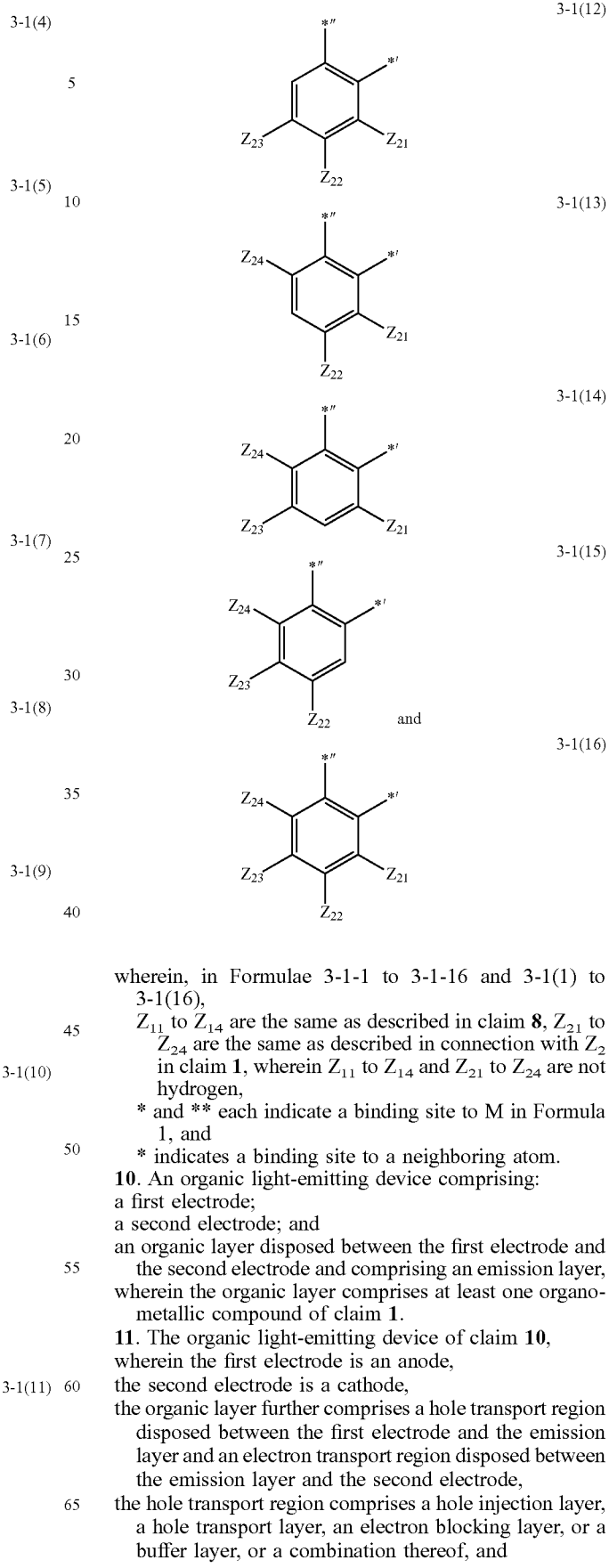

wherein, in Formulae 3-1-1 to 3-1-16 and 3-1(1) to 3-1(16),
$Z_{11}$ to $Z_{14}$ are the same as described in claim 8, $Z_{21}$ to $Z_{24}$ are the same as described in connection with $Z_2$ in claim 1, wherein $Z_{11}$ to $Z_{14}$ and $Z_{21}$ to $Z_{24}$ are not hydrogen,
\* and \*\* each indicate a binding site to M in Formula 1, and
\* indicates a binding site to a neighboring atom.

10. An organic light-emitting device comprising:
a first electrode;
a second electrode; and
an organic layer disposed between the first electrode and the second electrode and comprising an emission layer,
wherein the organic layer comprises at least one organometallic compound of claim 1.

11. The organic light-emitting device of claim 10,
wherein the first electrode is an anode,
the second electrode is a cathode,
the organic layer further comprises a hole transport region disposed between the first electrode and the emission layer and an electron transport region disposed between the emission layer and the second electrode,
the hole transport region comprises a hole injection layer, a hole transport layer, an electron blocking layer, or a buffer layer, or a combination thereof, and the electron transport region comprises a hole blocking layer, an electron transport layer, or an electron injection layer, or a combination thereof.

12. The organic light-emitting device of claim 10, wherein the emission layer comprises the at least one organometallic compound.

13. An electronic apparatus comprising the organic light-emitting device of claim 10.

14. The organometallic compound of claim 1, wherein the organometallic compound represented by Formula 1 is one of Compounds 1 to 3 and 7 to 9:

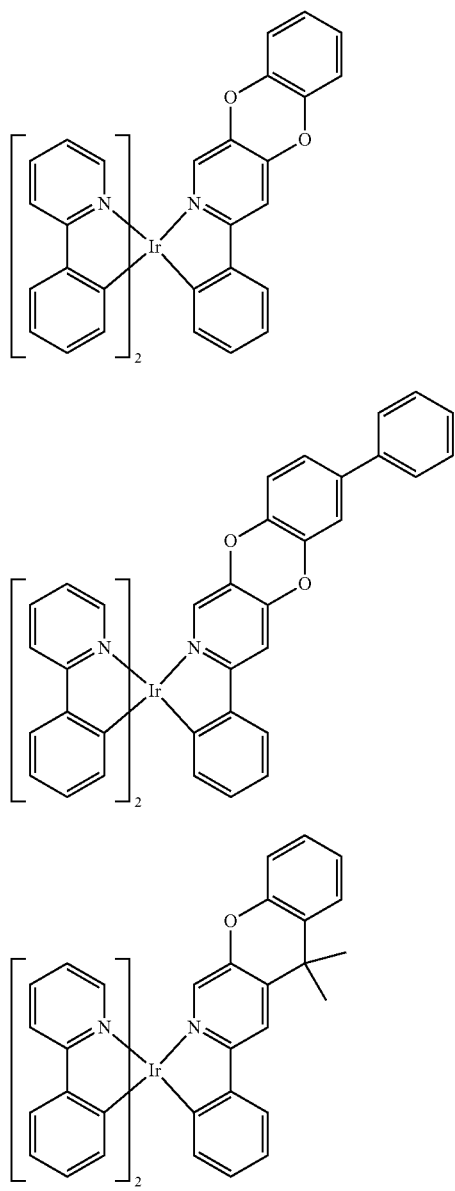

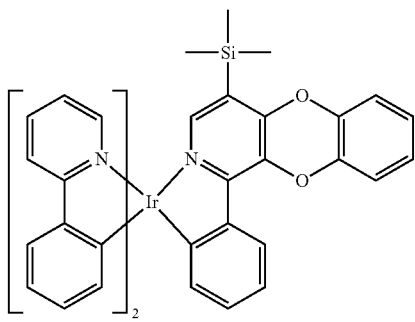

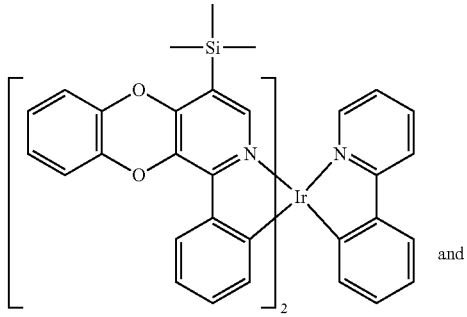

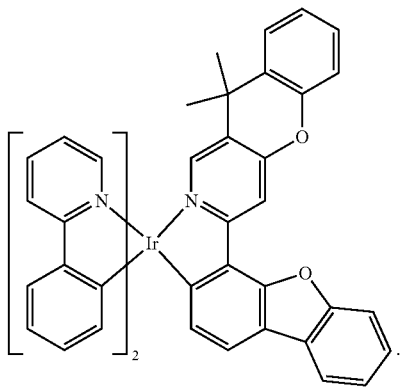

* * * * *